(12) United States Patent
Kurokawa et al.

(10) Patent No.: US 8,803,164 B2
(45) Date of Patent: Aug. 12, 2014

(54) SOLID-STATE IMAGE SENSING DEVICE AND SEMICONDUCTOR DISPLAY DEVICE

(75) Inventors: Yoshiyuki Kurokawa, Sagamihara (JP); Takayuki Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 212 days.

(21) Appl. No.: 13/193,741

(22) Filed: Jul. 29, 2011

(65) Prior Publication Data

US 2012/0032193 A1 Feb. 9, 2012

(30) Foreign Application Priority Data

Aug. 6, 2010 (JP) ................. 2010-177721
May 13, 2011 (JP) ................. 2011-108646

(51) Int. Cl.
*H01L 27/15* (2006.01)
(52) U.S. Cl.
USPC .............. 257/80; 257/21; 257/82; 257/84; 257/222; 257/E25.004
(58) Field of Classification Search
USPC ............................. 257/84, 21, 80, 82, 222
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Dale E Page
(74) *Attorney, Agent, or Firm* — Eric J. Robinson; Robinson Intellectual Property Law Office, P.C.

(57) ABSTRACT

To provide a solid-state image sensing device or a semiconductor display device, which can easily obtain the positional data of an object without contact. Included are a plurality of first photosensors on which light with a first incident angle is incident from a first incident direction and a plurality of second photosensors on which light with a second incident angle is incident from a second incident direction. The first incident angle of light incident on one of the plurality of first photosensors is larger than that of light incident on one of the other first photosensors. The second incident angle of light incident on one of the plurality of second photosensors is larger than that of light incident on one of the other second photosensors.

16 Claims, 43 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0035653 A1* | 2/2007 | Hong et al. .................. 348/340 |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0245968 A1* | 10/2008 | Tredwell et al. ......... 250/370.09 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0109591 A1 | 5/2011 | Kurokawa et al. |
| 2011/0109592 A1 | 5/2011 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J at al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

(56) References Cited

OTHER PUBLICATIONS

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20 , 2008, vol. 39, pp. 633-636.

Lee.J et al., "World's Largest (15-Inch) XGA AMLCD Panel Using IGZO Oxide TFT,", SID Digest '08 : SID Internatiional Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshop, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

(56) References Cited

OTHER PUBLICATIONS

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Brown et al., "31.3: A System LCD with Integrated 3-Dimensional Input Device," SID Digest '10: SID International Symposium Digest of Technical Papers, 2010, pp. 453-456.

\* cited by examiner

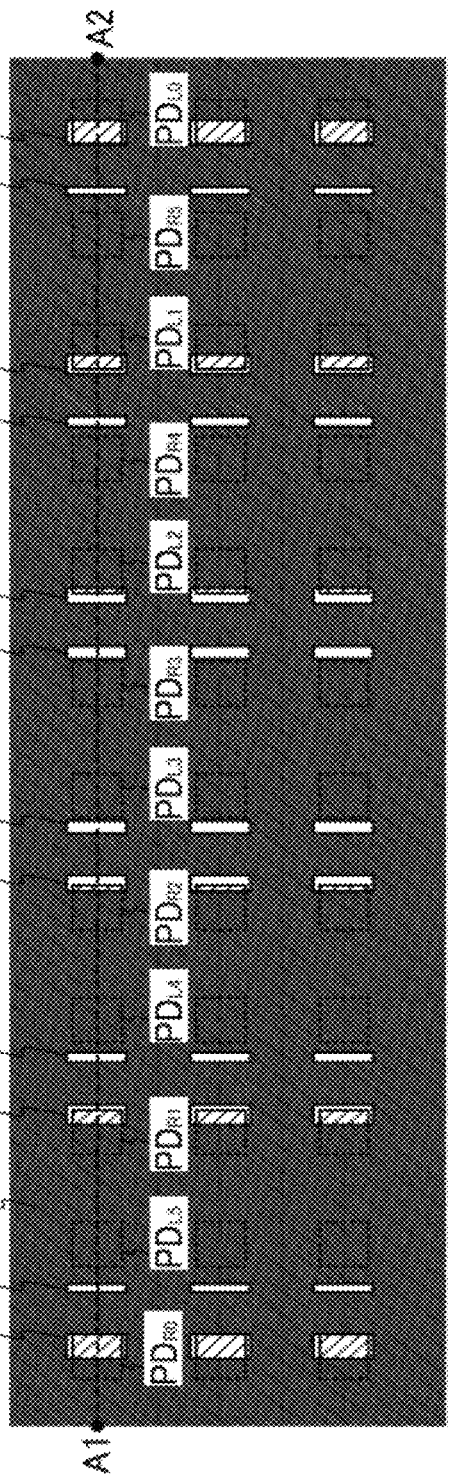

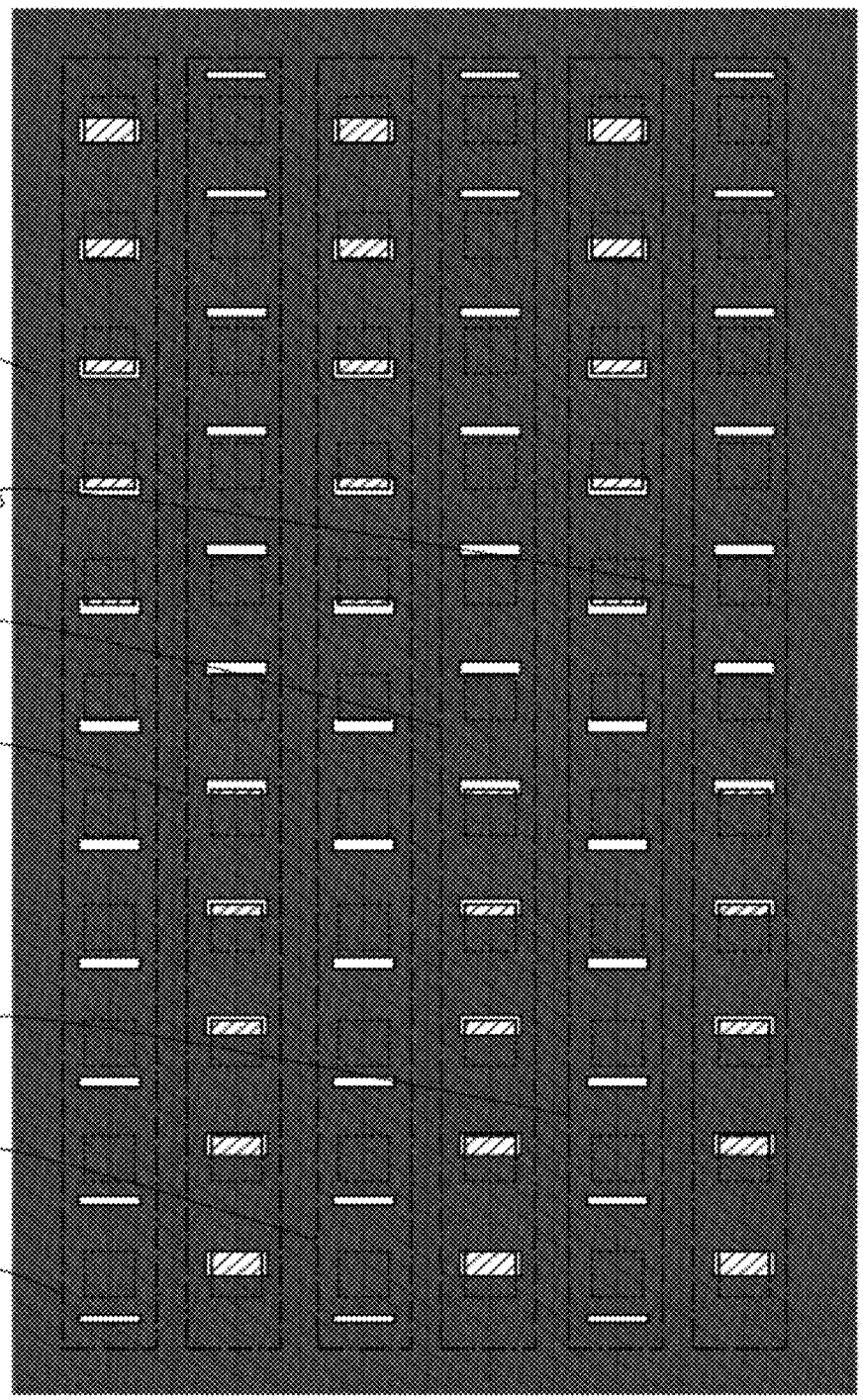

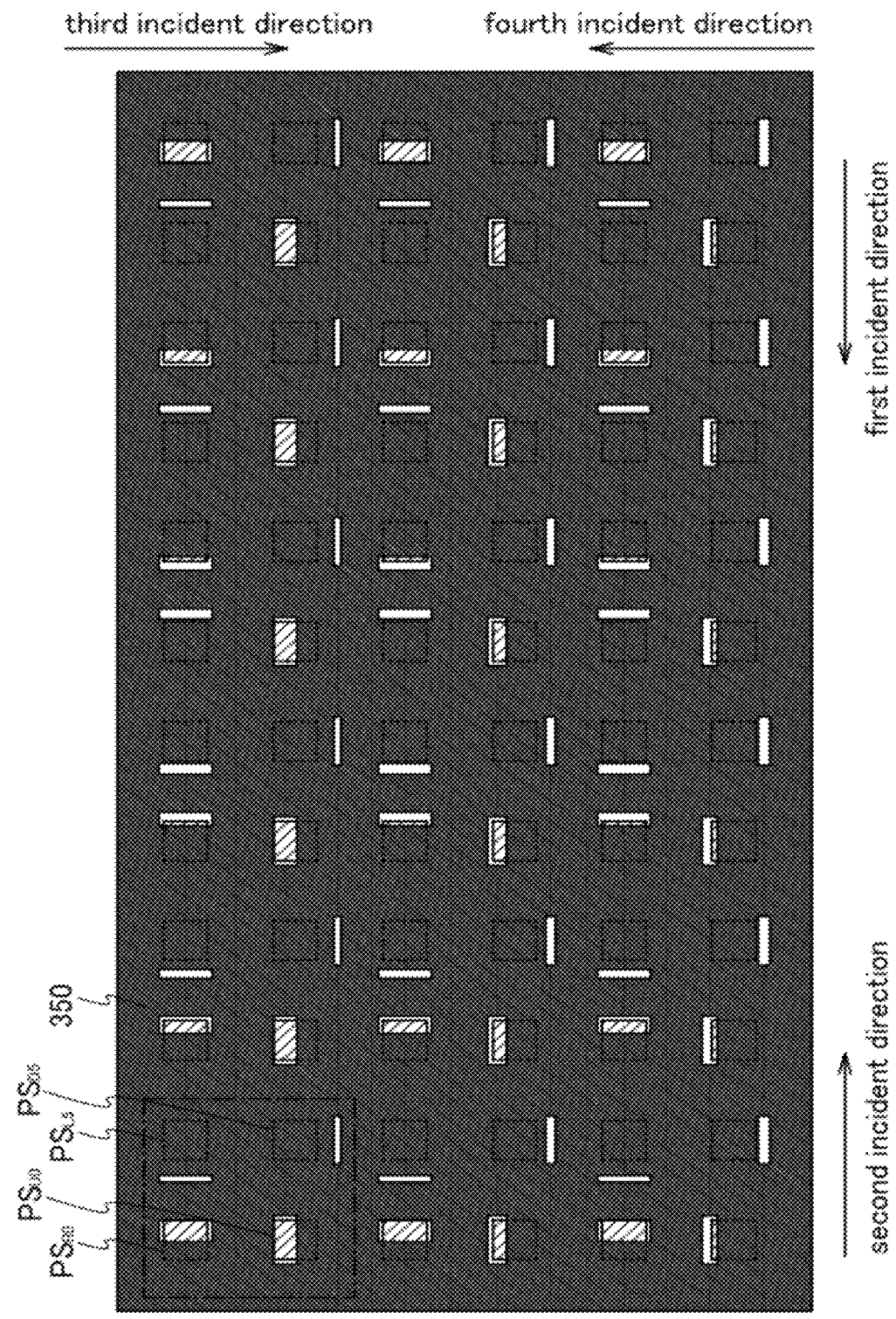

- In
- Sn
- Zn
- O

FIG. 29A
FIG. 29B
FIG. 29C
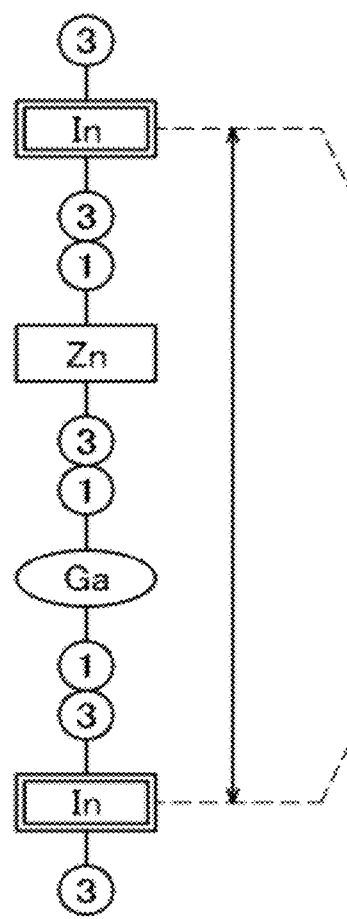
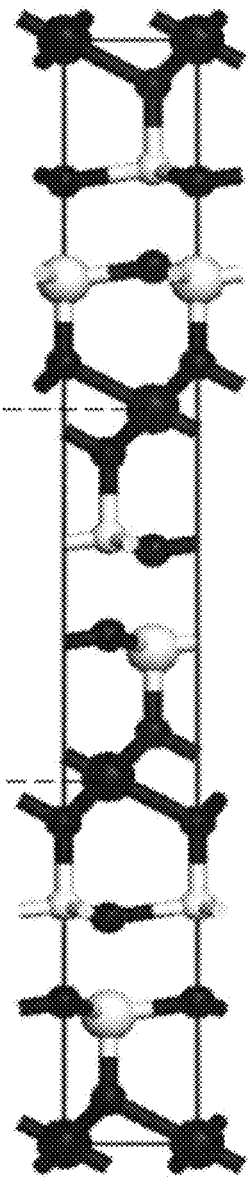
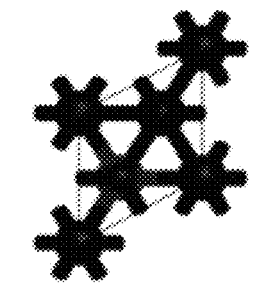
● In
◐ Ga
○ Zn
● O

SOLID-STATE IMAGE SENSING DEVICE AND SEMICONDUCTOR DISPLAY DEVICE

BACKGROUND OF THE INVENTION

1. Field of the Invention

The present invention relates to a solid-state image sensing device including a photosensor in a pixel, and to a semiconductor display device including a photosensor and a display element in a pixel.

2. Description of the Related Art

A photosensor utilizing an amplifying function of a MOS transistor, called a CMOS sensor, can be manufactured through a general CMOS process. Thus, a solid-state image sensing device including a CMOS sensor can be manufactured at lower cost than a solid-state image sensing device including a CCD sensor. A CMOS sensor and a display element are formed over one substrate, whereby a semiconductor display device having both a function of an input device and a function of a display device, called a touchscreen, can be fabricated.

In recent years, a technique of taking three-dimensional images of an object has been increasingly demanded with an expansion of the markets of three-dimensional movies and televisions which display three-dimensional images. Non-Patent Document 1 below discloses a touchscreen which can obtain three-dimensional image data with the use of photosensors arranged in two dimensions. By utilizing a technique disclosed in Non-Patent Document 1, three-dimensional image data can be obtained.

REFERENCE

[Non-Patent Document 1] Chris Brown et al., "A System LCD with Integrated 3-Dimensional Input Device", Society for Information Display 2010 International Symposium Digest of Technical Papers, pp. 453-456

SUMMARY OF THE INVENTION

However, in the case of the touchscreen disclosed in Non-Patent Document 1, a detectable area where light from an object can be detected is narrow and distribution of the detectable area is uneven. Specifically, the width of the detectable area in the direction normal to a pixel portion is narrower at an end part of the pixel portion than at a central part thereof.

In the case where the detectable area is narrow and distribution of the detectable area is uneven, it becomes difficult to obtain the positional data of an object at some parts of the pixel portion even when the object is only slightly distant from a surface of the touchscreen. Thus, when a finger, a stylus, or the like is brought closer to the touchscreen, positional data can be obtained in some cases and cannot be obtained in other cases depending on a part of the pixel portion, which is inconvenient for a user. Further, it is necessary to directly touch the surface of the touchscreen in order to obtain positional data in some cases depending on a part of the pixel portion, resulting in deterioration in quality of the touchscreen according to the use frequency; for example, the surface of the touchscreen might get dirty or have a scratch mark. Moreover, a finger directly touches the surface of the touchscreen repeatedly, so that fatigue of a user might be increased.

In view of the above problems, an object of one embodiment of the present invention is to provide a solid-state image sensing device or a semiconductor display device which can easily obtain the positional data of an object without contact.

Another object of one embodiment of the present invention is to provide a driving method of a solid-state image sensing device or a semiconductor display device which can easily obtain the positional data of an object without contact.

The range of a detectable area where light from an object can be detected depends on an incident angle of light incident on a photosensor. However, when the range of an incident angle of light incident on each photosensor is simply widen to expand a detectable area, light with low directivity is received by the photosensor. Consequently, the detected position of an object and the actual position of the object are misaligned; thus, accuracy of the positional data is lowered. In one embodiment of the present invention, to solve the above problems, the incident angles of light incident on a plurality of first photosensors are set so that they are not all the same but vary. Alternatively, the incident angles of light incident on a plurality of second photosensors are set so that they are not all the same but vary.

Specifically, a solid-state image sensing device or a semiconductor display device, according to one embodiment of the present invention, includes a plurality of first photosensors and a plurality of second photosensors. Light with a first incident angle enters the plurality of first photosensors from a first incident direction. Light with a second incident angle enters the plurality of second photosensors from a second incident direction different from the first incident direction. The first incident angles of light incident on at least two of the plurality of first photosensors are different from each other. Alternatively, the second incident angles of light incident on at least two of the plurality of second photosensors are different from each other. Note that the first incident angle and the second incident angle are each larger than or equal to 0° and smaller than or equal to 90°.

Light emitted from an object or light reflected by the object selectively enters any of the plurality of first photosensors and any of the plurality of second photosensors. The first photosensor and the second photosensor on which the light is selectively incident are determined on the basis of the current value or the voltage value obtained by photoelectric conversion of incident light, and the positional data of the object can be obtained on the basis of the positions of the first photosensor and the second photosensor and the first incident angle and the second incident angle.

With the above structure, the incident angles of light incident on the photosensors are selectively set and the range of the incident angle of light which can be received by all the plurality of photosensors can be widened. Thus, a solid-state image sensing device or a semiconductor display device, which has a wide detectable area, can be realized.

Note that besides the above structure, there may be a feature that the first incident angle of light incident on the first photosensor on the upstream of the first incident direction is larger than that of light incident on the first photosensor on the downstream of the first incident direction, when comparing the first incident angles of at least two of the first photosensors, which are different from each other. With such a structure, unevenness of distribution of the detectable area can be reduced and the detectable area can be increased.

Alternatively, besides the above structure, there may be a feature that the second incident angle of light incident on the second photosensor on the upstream of the second incident direction is larger than that of light incident on the second photosensor on the downstream of the second incident direction, when comparing the second incident angles of at least two of the second photosensors, which are different from each other. With such a structure, unevenness of distribution in the detectable area can be reduced and the detectable area can be increased.

According to one embodiment of the present invention, a solid-state image sensing device or a semiconductor display device, which can easily obtain the positional data of an object without contact, can be provided. According to another embodiment of the present invention, a driving method of a solid-state image sensing device or a semiconductor display device, which can easily obtain the positional data of an object without contact, can be provided.

BRIEF DESCRIPTION OF THE DRAWINGS

In the accompanying drawings:

FIGS. 17A and 17B are a top view and a cross-sectional view illustrating arrangement of photodiodes and a light-blocking film;

FIG. 18 is a top view illustrating arrangement of photodiodes and a light-blocking film;

FIG. 19 is a top view illustrating arrangement of photodiodes and a light-blocking film;

FIG. 29A to 29C are diagrams illustrating a structure of an oxide material according to one embodiment of the present invention;

DETAILED DESCRIPTION OF THE INVENTION

Hereinafter, embodiments of the present invention will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Embodiment 1

A solid-state image sensing device or a semiconductor display device, according to one embodiment of the present invention, includes a plurality of photosensors in a pixel portion. The plurality of photosensors can be classified by the incident direction of incident light. A solid-state image sensing device or a semiconductor display device, according to one embodiment of the present invention, includes at least a plurality of first photosensors and a plurality of second photosensors. Light from a first incident direction enters the plurality of first photosensors. Light from a second incident direction different from the first incident direction enters the plurality of second photosensors.

A solid-state image sensing device or a semiconductor display device, according to one embodiment of the present invention, will be described taking a structure of a pixel portion where a plurality of first photosensors $PS_R$'s and a plurality of second photosensors $PS_L$'s are alternately arranged, as an example.

Figure 1:
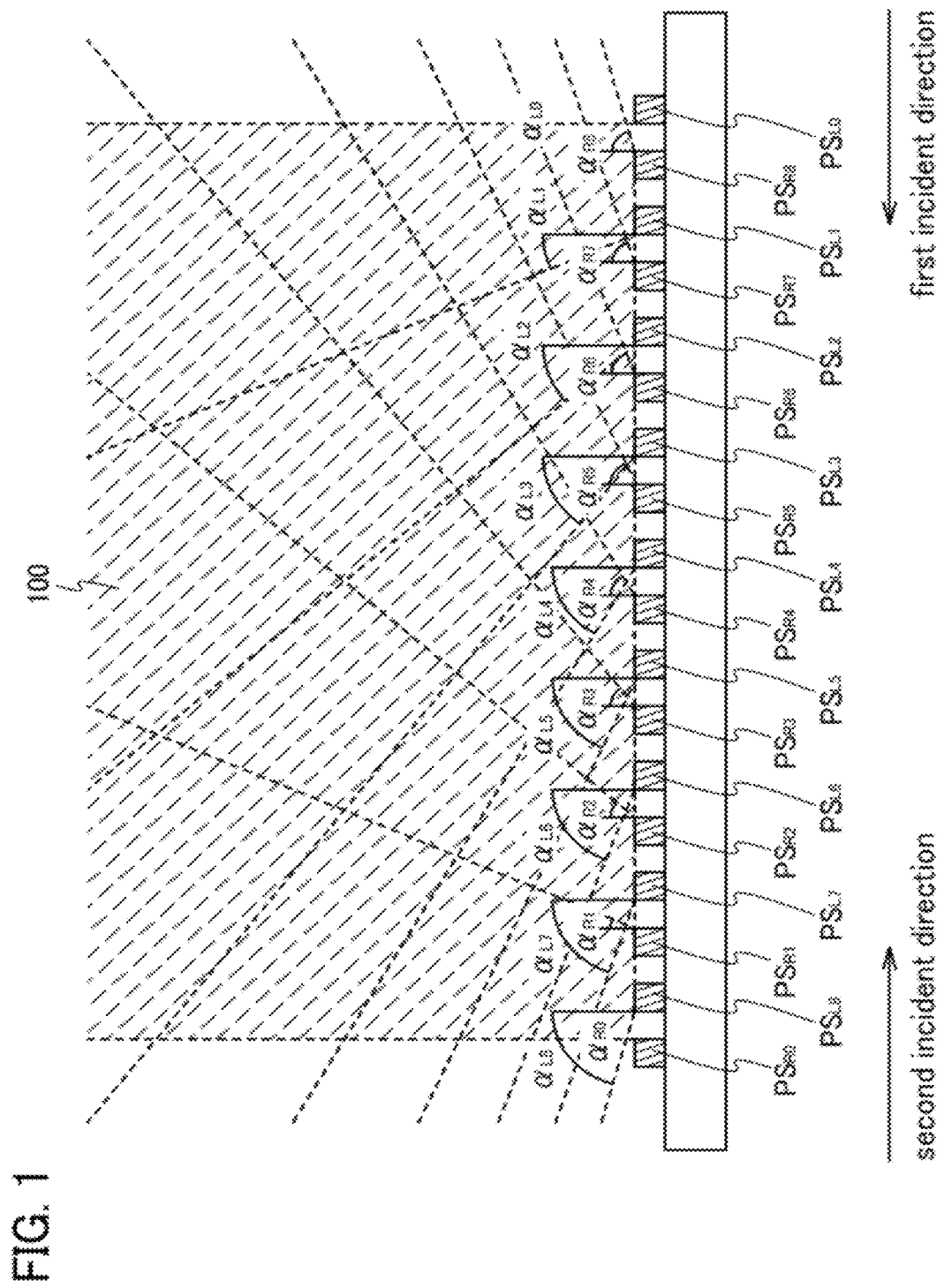
FIG. 1 is a cross-sectional view of a pixel portion.

FIG. 1 is an example of a cross-sectional view of the pixel portion. Specifically, FIG. 1 illustrates as an example the case where nine first photosensors $PS_{R0}$ to $PS_{R8}$ and nine second photosensors $PS_{L0}$ to $PS_{L8}$ are alternately arranged, that is, the photosensors are arranged from the left side of the drawing in the following order: $PS_{R0}$, $PS_{L8}$, $PS_{R1}$, $PS_{L7}$, ..., $PS_{R7}$, $PS_{L1}$, $PS_{R8}$, and $PS_{L0}$.

In FIG. 1, a first incident direction corresponds to the direction from the right side to the left side of the drawing, and a second incident direction corresponds to the direction from the left side to the right side of the drawing. That is to say, the case where the angle between the first incident direction and the second incident direction is 180° is illustrated as an example. Note that the angle between the first incident direction and the second incident direction is not limited to 180° and can be appropriately set by a practitioner so as to be within the range of 0° to 180°. It is preferable that the angle between the first incident direction and the second incident direction be set to larger than or equal to 90° and smaller than or equal to 180° because a detectable area 100 can be further widened.

Light with a first incident angle enters the first photosensors $PS_{R0}$ to $PS_{R8}$ from the first incident direction. Light with a second incident angle enters the second photosensors $PS_{L0}$ to $PS_{L8}$ from the second incident direction.

Next, definitions of the incident angles and the incident directions in this specification will be described with reference to FIG. 2. As in FIG. 2, it is assumed that on a boundary surface made by an x axis and a y axis, the first photosensors $PS_R$'s and the second photosensors $PS_L$'s are arranged on the x axis, and a z axis extends in the direction normal to the boundary surface (corresponding to a light-receiving surface of the photosensor). Given that light incident on the first photosensors $PS_R$'s is first incident light and light incident on the second photosensors $PS_L$'s is second incident light, the plane of incidence is parallel to a surface made by the x axis and the z axis. The first incident angle corresponds to an angle formed by the first incident light and the z axis in the plane of incidence. The second incident angle corresponds to an angle formed by the second incident light and the z axis in the plane of incidence. The first incident direction corresponds to the direction of a component of the first incident light, which is parallel to the boundary surface. The second incident direction corresponds to the direction of a component of the second incident light, which is parallel to the boundary surface.

Figure 2:
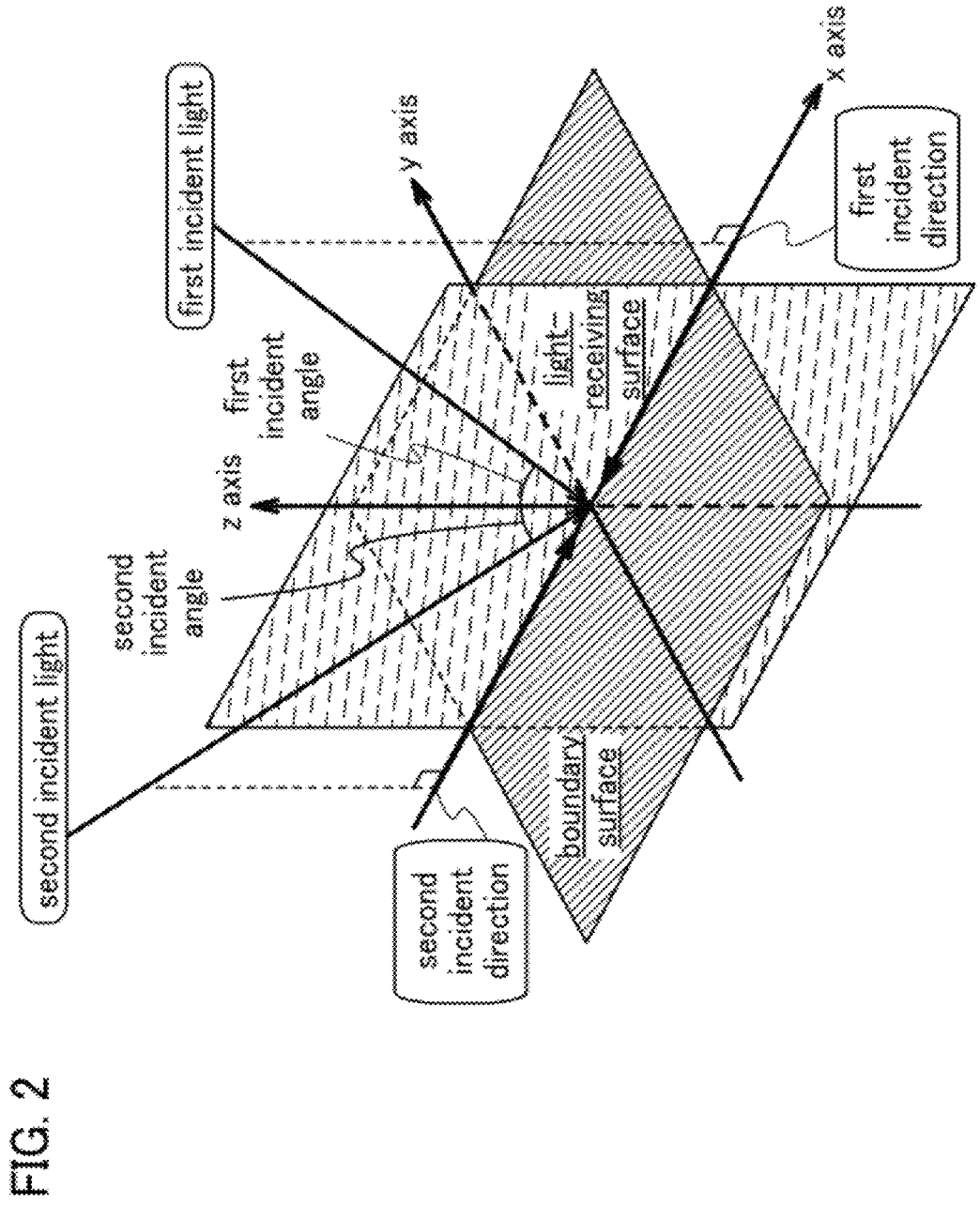
FIG. 2 is a diagram illustrating definitions of incident angles and incident directions.

Note that in FIG. 2, since an example is illustrated in which the angle between the first incident direction and the second incident direction is 180°, a first plane of incidence coincides with a second plane of incidence; thus, the first plane of incidence and the second plane of incidence are shown simply as a plane of incidence. Note that when the angle between the first incident direction and the second incident direction is larger than or equal to 0° and smaller than 180°, the first plane of incidence does not coincide with the second plane of incidence.

Back to FIG. 1, the structure according to one embodiment of the present invention will be described. In FIG. 1, paths of light incident on the photosensors are indicated by dashed lines as rays of light. Note that light having wavelengths which can be converted into electricity in the photosensor includes light with low directivity, such as visible light and infrared light. Thus, in the actual case, there is a range in value of each incident angle, and the range is not clear but theoretically indefinite. In one embodiment of the present invention, for example, an angle in the case where the voltage value or the current value obtained by photoelectric conversion is the highest can be the incident angle.

In one embodiment of the present invention, the first incident angles of light incident on the plurality of first photosensors $PS_R$'s are different from one another. With the above structure, the first incident angles of light incident on the plurality of first photosensors $PS_R$'s are selectively set and the range of the incident angle of light which can be received by all the plurality of first photosensors $PS_R$'s can be widened. Thus, a solid-state image sensing device or a semiconductor display device, which has the wide detectable area 100, can be realized.

In another embodiment of the present invention, the second incident angles of light incident on the plurality of photosensors $PS_L$'s are different from one another. With the above structure, the second incident angles of light incident on the plurality of second photosensors $PS_L$'s are selectively set and the range of the incident angle of light which can be received by all the plurality of second photosensors $PS_L$'s can be widened. Thus, a solid-state image sensing device or a semiconductor display device, which has the wide detectable area 100, can be realized.

Specifically, FIG. 1 illustrates as an example the case where the first incident angle $\alpha_{R0}$ farthest from the first incident direction side is the smallest and the ascending order of the first incident angles is $\alpha_{R1}$, $\alpha_{R2}$, $\alpha_{R3}$, $\alpha_{R4}$, $\alpha_{R5}$, $\alpha_{R6}$, $\alpha_{R7}$, and $\alpha_{R8}$, which are farther from the first incident direction side in this order, where the first incident angles of light incident on the first photosensors $PS_{R0}$ to $PS_{R8}$ are $\alpha_{R0}$ to $\alpha_{R8}$, respectively. In other words, when comparing the first incident angles of light incident on at least two of the first photosensors $PS_R$'s, which are different from each other, the first incident angle of light incident on the first photosensor $PS_R$ on the upstream of the first incident direction is larger than that of light incident on the first photosensor $PS_R$ on the downstream of the first incident direction. By employing the above structure for the first incident angles of light incident on the plurality of first photosensors $PS_R$'s, the detectable area 100 of a solid-state image sensing device or a semiconductor display device can be further widened.

Further, FIG. 1 illustrates as an example the case where the second incident angle $\alpha_{L0}$ farthest from the second incident direction side is the smallest and the ascending order of the second incident angles is $\alpha_{L1}$, $\alpha_{L2}$, $\alpha_{L3}$, $\alpha_{L4}$, $\alpha_{L5}$, $\alpha_{L6}$, $\alpha_{L7}$, and $\alpha_{L8}$, which are farther from the second incident direction side in this order, where the second incident angles of light incident on the second photosensors $PS_{L0}$ to $PS_{L8}$ are $\alpha_{L0}$ to $\alpha_{L8}$, respectively. In other words, when comparing the second incident angles of light incident on at least two of the second photosensors $PS_L$'s, which are different from each other, the second incident angle of light incident on the second photosensor $PS_L$ on the upstream of the second incident direction is larger than that of light incident on the second photosensor $PS_L$ on the downstream of the second incident direction. By employing the above structure for the second incident angles of light incident on the plurality of second photosensors $PS_L$'s, the detectable area 100 of a solid-state image sensing device or a semiconductor display device can be further widened.

Note that the detectable area 100 is an area where light enters at least two of the photosensors, which have different incident directions. Thus, in the case of FIG. 1, an area where light enters at least one of the first photosensors $PS_L$'s and at least one of the second photosensors $PS_L$'s is the detectable area 100.

Note that not all the first incident angles of light incident on the plurality of first photosensors are necessarily different from one another. When the first incident angle of light incident on at least one of the plurality of first photosensors is different from that of light incident on one of the other first photosensors, the detectable area 100 can be widened.

Further, not all the second incident angles of light incident on the plurality of second photosensors are necessarily different from one another. When the second incident angle of light incident on at least one of the plurality of second photosensors is different from that of light incident on one of the other second photosensors, the detectable area 100 can be widened.

Note that even when only one of the structure where the first incident angles of light incident on the plurality of the first photosensors are different from each other and the structure where the second incident angles of light incident on the plurality of the second photosensors are different from each other is employed, the detectable area 100 can be widened.

Light cast from an object or light reflected by the object selectively enters any of the plurality of first photosensors $PS_L$'s and any of the plurality of second photosensors $PS_L$'s. The first photosensor $PS_R$ and the second photosensor $PS_L$ on which the light is selectively incident are determined on the basis of the current value or the voltage value obtained by photoelectric conversion of the incident light, and the positional data of the object can be obtained on the basis of the positions of the first photosensor $PS_R$ and the second photosensor $PS_L$ and the first incident angle and the second incident angle.

Figure 3:
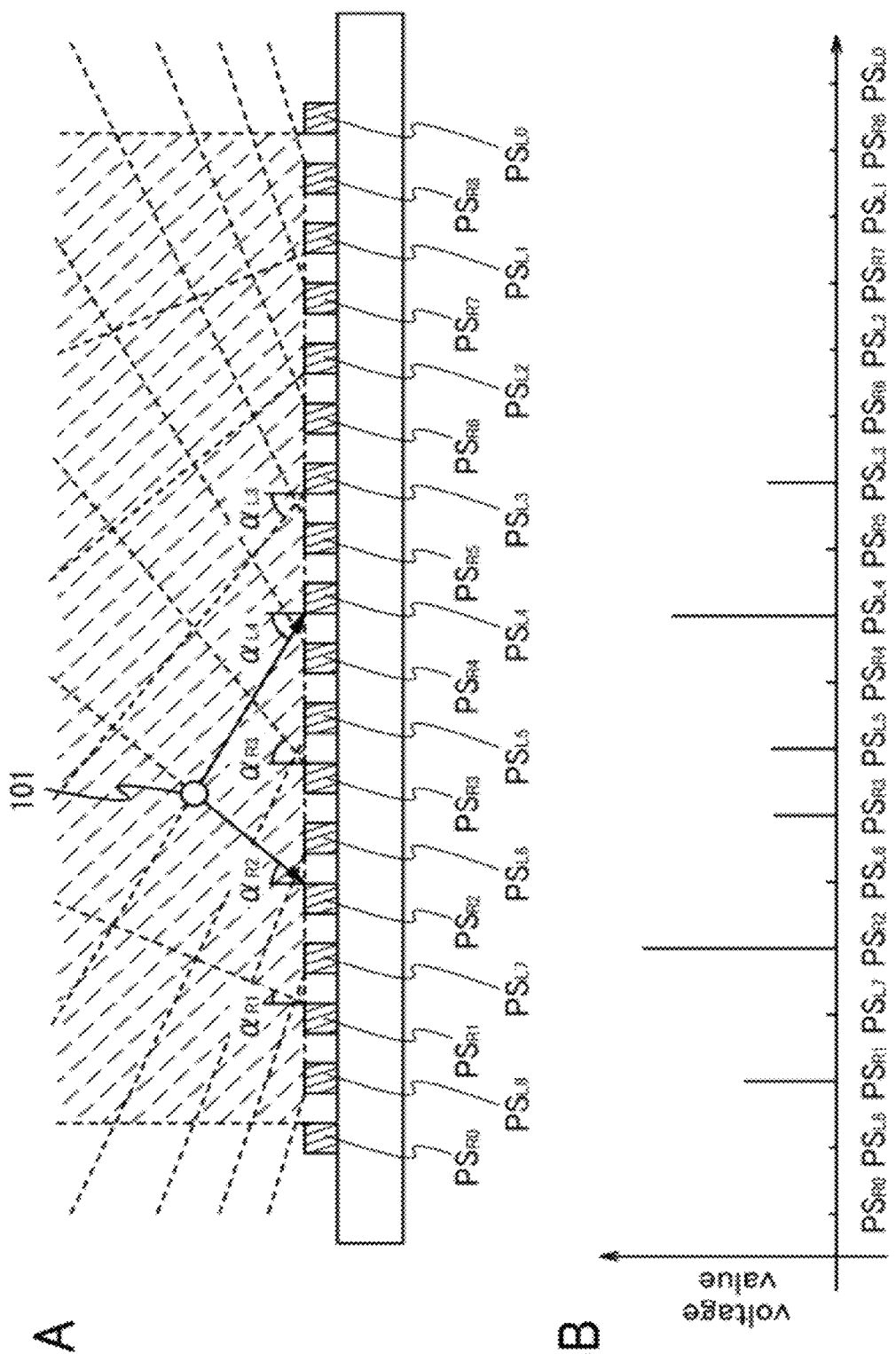
FIG. 3A is a cross-sectional view of a pixel portion.
FIG. 3B shows voltage values obtained in photosensors.

For example, FIG. 3A is a cross-sectional view of the case where light from an object 101 selectively enters the first photosensor $PS_{R2}$ and the second photosensor $PS_{L4}$ among the first photosensors $PS_{R0}$ to $PS_{R8}$ and the second photosensors $PS_{L0}$ to $PS_{L8}$ in FIG. 1. In the case of FIG. 3A, the object 101 exists at the intersection of the path of a ray of light incident on the first photosensor $PS_{R2}$ and the path of a ray of light incident on the second photosensor $PS_{L4}$. Thus, the positional data of the object 101 can be worked out on the basis of the distance between the first photosensor $PS_{R2}$ and the second photosensor $PS_{L4}$, the first incident angle $\alpha_{R2}$ of light incident on the first photosensor $PS_{R2}$, and the second incident angle $\alpha_{L4}$ of light incident on the second photosensor $PS_{L4}$.

Note that when light from the object 101 has high directivity, the difference between the current value or the voltage value obtained in any one of the first photosensors $PS_{R0}$ to $PS_{R8}$ and that of each of the other first photosensors and the difference between the current value or the voltage value of any one of the second photosensors $PS_{L0}$ to $PS_{L8}$ and that of each of the other second photosensors are widened. However, when light having not so high directivity, such as visible light or infrared light, is cast from the object 101, light from the object 101 does not always enter only one of the first photosensors $PS_R$'s and one of the second photosensors $PS_L$'s. Practically, light from the object 101 is incident on the plurality of photosensors adjacent from each other.

FIG. 3B shows as an example the voltage values obtained in the first photosensors $PS_{R0}$ to $PS_{R8}$ and the second photosensors $PS_{L0}$ to $PS_{L8}$ in the case where the object 101 exists at the position shown in FIG. 3A. The horizontal axis shows the positions of the first photosensors $PS_{R0}$ to $PS_{R8}$ and the second photosensors $PS_{L0}$ to $PS_{L8}$, and the vertical axis shows the voltage values of the photosensors, which are obtained from light from the object 101.

In FIG. 3B, the voltage value obtained in the first photosensor $PS_{R2}$ is the highest of those obtained in the first photosensors $PS_{R0}$ to $PS_{R8}$. The voltage values obtained in the first photosensors $PS_{R1}$ and $PS_{R3}$ which are adjacent to the first photosensor $PS_{R2}$ are higher than those obtained in the first photosensors $PS_R$'s other than the first photosensors $PS_{R1}$ to $PS_{R3}$. Further, in FIG. 3B, the voltage value obtained in the second photosensor $PS_{L4}$ is the highest of those obtained in the second photosensors $PS_{L0}$ to $PS_{L8}$. The voltage values obtained in the second photosensors $PS_{L3}$ and $PS_{L5}$ which are adjacent to the second photosensor $PS_{L4}$ are higher than those obtained in the second photosensors $PS_L$'s other than the second photosensors $PS_{L3}$ to $PS_{L5}$.

Therefore, even when the object 101 exists so as to correspond to the intersection of the path of a ray of light incident on the first photosensor $PS_{R2}$ and the path of a ray of light incident on the second photosensor $PS_{L4}$ as in FIG. 3B, the voltage values or the current values of adjacent photosensors are high due to incidence of light from the object 101. By determining the first photosensor $PS_R$ in which the highest voltage value or current value of those obtained in the first photosensors is obtained and the second photosensor $PS_L$ in which the highest voltage value or current value of those obtained in the second photosensors is obtained, the positional data of the object 101 can be obtained even in the case where the directivity of light from the object 101 is low.

Figure 4:
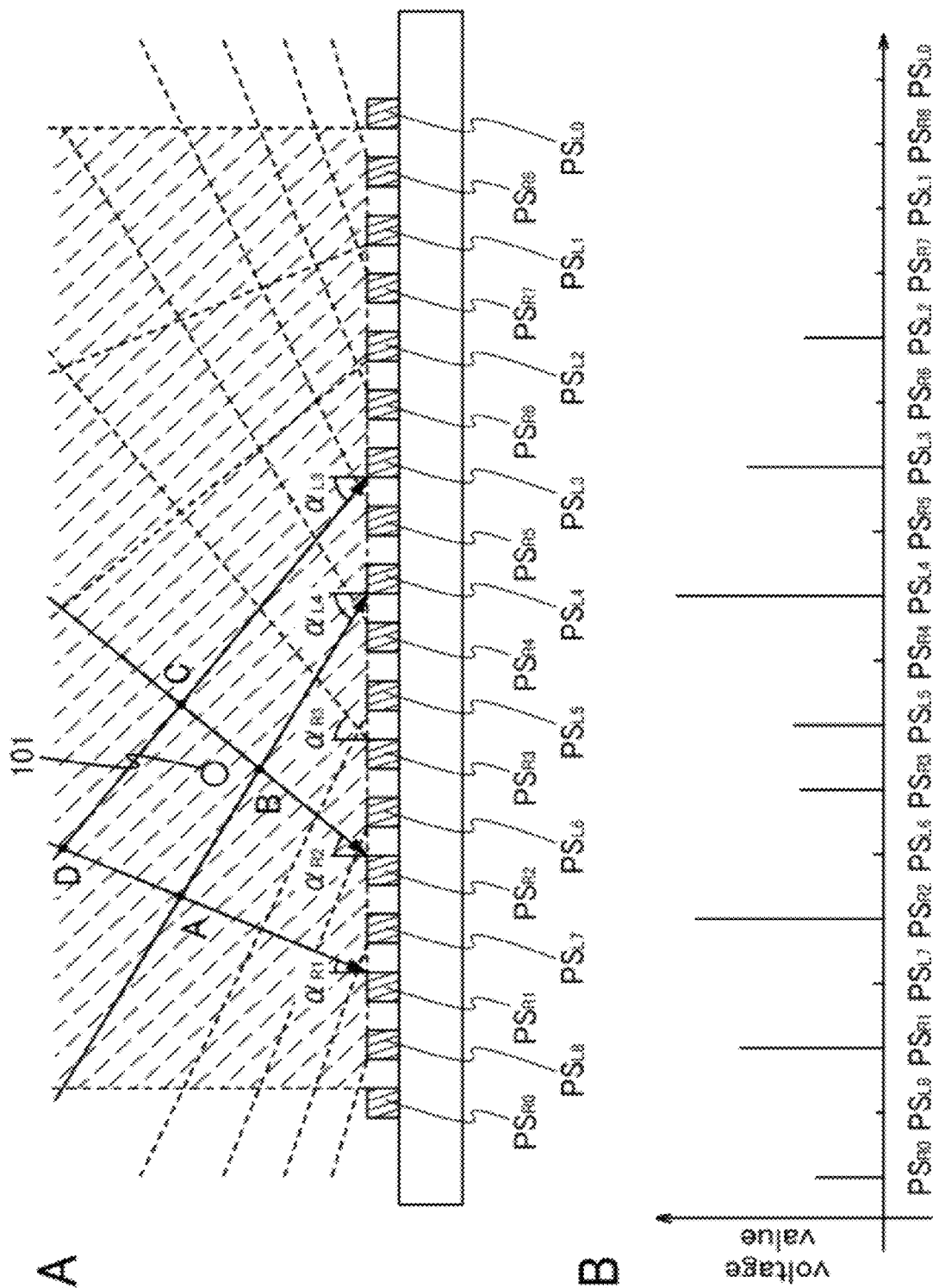
FIG. 4A is a cross-sectional view of a pixel portion.
FIG. 4B shows voltage values obtained in photosensors.

The object 101 may exist at a point deviating from the paths of rays of light incident on the plurality of first photosensors $PS_R$'s and the paths of rays of light incident on the plurality of second photosensors $PS_L$'s. FIG. 4A is a cross-sectional view of the case where the object 101 does not exist along the paths of rays of light incident on the photosensors.

In the case of FIG. 4A, the object 101 exists between the path of a ray of light incident on the first photosensor $PS_{R1}$ and the path of a ray of light incident on the first photosensor $PS_{R2}$ and between the path of a ray of light incident on the second photosensor $PS_{L3}$ and the path of a ray of light incident on the second photosensor $PS_{L4}$. In this case, the object 101 exists inside an area surrounded by lines drawn by connecting four intersections A to D of the paths of the rays of light.

Note that an intersection A is an intersection of the path of a ray of light incident on the first photosensor $PS_{R1}$ and the path of a ray of light incident on the second photosensor $PS_{L4}$. An intersection B is an intersection of the path of a ray of light incident on the first photosensor $PS_{R2}$ and the path of a ray of light incident on the second photosensor $PS_{L4}$. An intersection C is an intersection of the path of a ray of light incident on the first photosensor $PS_{R2}$ and the path of a ray of light incident on the second photosensor $PS_{L3}$. An intersection D is an intersection of the path of a ray of light incident on the first photosensor $PS_{R1}$ and the path of a ray of light incident on the second photosensor $PS_{L3}$.

In the case of FIG. 4A, high accuracy of the positional data of the object 101 is not prioritized, by determining the first photosensors $PS_R$'s and the second photosensors $PS_L$'s by which the highest voltage values or current values are obtained, the positional data of the intersection which is the closest to the object 101 among the intersections A to D can be obtained as the positional data of the object 101.

FIG. 4B shows as an example the voltage values obtained in the first photosensors $PS_{R0}$ to $PS_{R8}$ and the second photosensors $PS_{L0}$ to $PS_{L8}$ in the case where the object 101 exists as in FIG. 4A. The horizontal axis shows the positions of the first photosensors $PS_{R0}$ to $PS_{R8}$ and the second photosensors $PS_{L0}$ to $PS_{L8}$, and the vertical axis shows the voltage values of the photosensors, which are obtained from light from the object 101.

In FIG. 4B, the voltage value obtained in the first photosensor $PS_{R2}$ is the highest of those obtained in the first photosensors $PS_{R0}$ to $PS_{R8}$. Further, the voltage value obtained in the second photosensor $PS_{L4}$ is the highest of those obtained in the second photosensors $PS_{L0}$ to $PS_{L8}$. Thus, it can be found that the intersection B of the path of a ray of light incident on the first photosensor $PS_{R2}$ and the path of a ray of light incident on the second photosensor $PS_{L4}$ is the closest to the object 101. The positional data of the intersection B can be worked out on the basis of the distance between the first photosensor $PS_{R2}$ and the second photosensor $PS_{L4}$, the first incident angle $\alpha_{R2}$ of light incident on the first photosensor $PS_{R2}$, and the second incident angle $\alpha_{L4}$ of light incident on the second photosensor $PS_{L4}$. The worked-out positional data can be used as an approximate value of the positional data of the object 101.

Note that in the case of FIG. 4A, when high accuracy of the positional data of the object 101 is necessary, the positional data of the object 101 may be worked out on the basis of the positional data of the intersections A to D and the voltage values or the current values of the photosensors. In that case, diffusion of light from the object 101 is figured out in advance to increase accuracy of the positional data of the object 101. Therefore, it is preferable to calculate the voltage values or the current values of the photosensors in the case where the object 101 corresponds to the intersection A, the case where it corresponds to the intersections B, the case where it corresponds to the intersection C, and the case where it corresponds to the intersection D, in advance.

Note that FIG. 1, FIGS. 3A and 3B, and FIGS. 4A and 4B illustrate as examples the cases where the plurality of first photosensors $PS_R$'s and the plurality of second photosensors $PS_L$'s are alternately arranged; however, one embodiment of the present invention is not limited thereto. Alternatively, the plurality of first photosensors $PS_R$'s and the plurality of second photosensors $PS_L$'s may be arranged so that every second set of some photosensors is a set of the first photosensors $PS_R$'s and the other sets of some photosensors are sets of the second photosensors $PS_L$'s.

In the case of FIG. 1, FIGS. 3A and 3B, and FIGS. 4A and 4B, the distance between rays of light incident on the adjacent first photosensors $PS_R$'s is shorter as the adjacent first photosensors $PS_R$'s are closer to the first incident direction side. Conversely, the distance between rays of light incident on the adjacent first photosensors $PS_R$'s is longer as the adjacent first photosensors $PS_R$'s are farther from the first incident direction side. This tendency is more significant as the distance from a boundary surface where the photosensors are formed increases. In view of the above, in order to make the distances between rays of light more uniform, the plurality of first photosensors $PS_R$'s may be arranged so that the distance between the adjacent first photosensors $PS_R$'s is longer as the adjacent first photosensors $PS_R$'s are closer to the first incident direction side, and conversely, the distance between the adjacent first photosensors $PS_R$'s is shorter as the adjacent first photosensors $PS_R$'s are farther from the first incident direction side. Further, the plurality of second photosensors $PS_L$'s may be arranged between the first photosensors $PS_R$'s arranged so that the distance therebetween is long. Furthermore, one of the second photosensors $PS_L$'s may be arranged between the first photosensors $PS_R$'s arranged so that the distance therebetween is short. Alternatively, only the first photosensors $PS_R$'s may be arranged in succession. With the above structure, the distances between rays of light can be made more uniform, which leads to acquisition of more accurate positional data.

In addition, in the case of FIG. 1, FIGS. 3A and 3B, and FIGS. 4A and 4B, the plurality of first photosensors $PS_R$'s are arranged in a line in parallel with the first incident direction, and the plurality of second photosensors $PS_L$'s are arranged in a line in parallel with the second incident direction. However, according to one embodiment of the present invention, it is not always necessary that planes of incidence of light incident on the plurality of photosensors from a common incident direction be the same. In other words, it is only necessary that light be incident on the plurality of photosensors from the common incident direction and the plurality of photosensors are not necessarily arranged in a line in parallel with the incident direction.

Comparative Example

Next, to simply describe an effect of widening a detectable area, which can be achieved in one embodiment of the present invention, a structure of a pixel portion in the case where first incident angles and second incident angles are uniformly set will be described.

Figure 5:
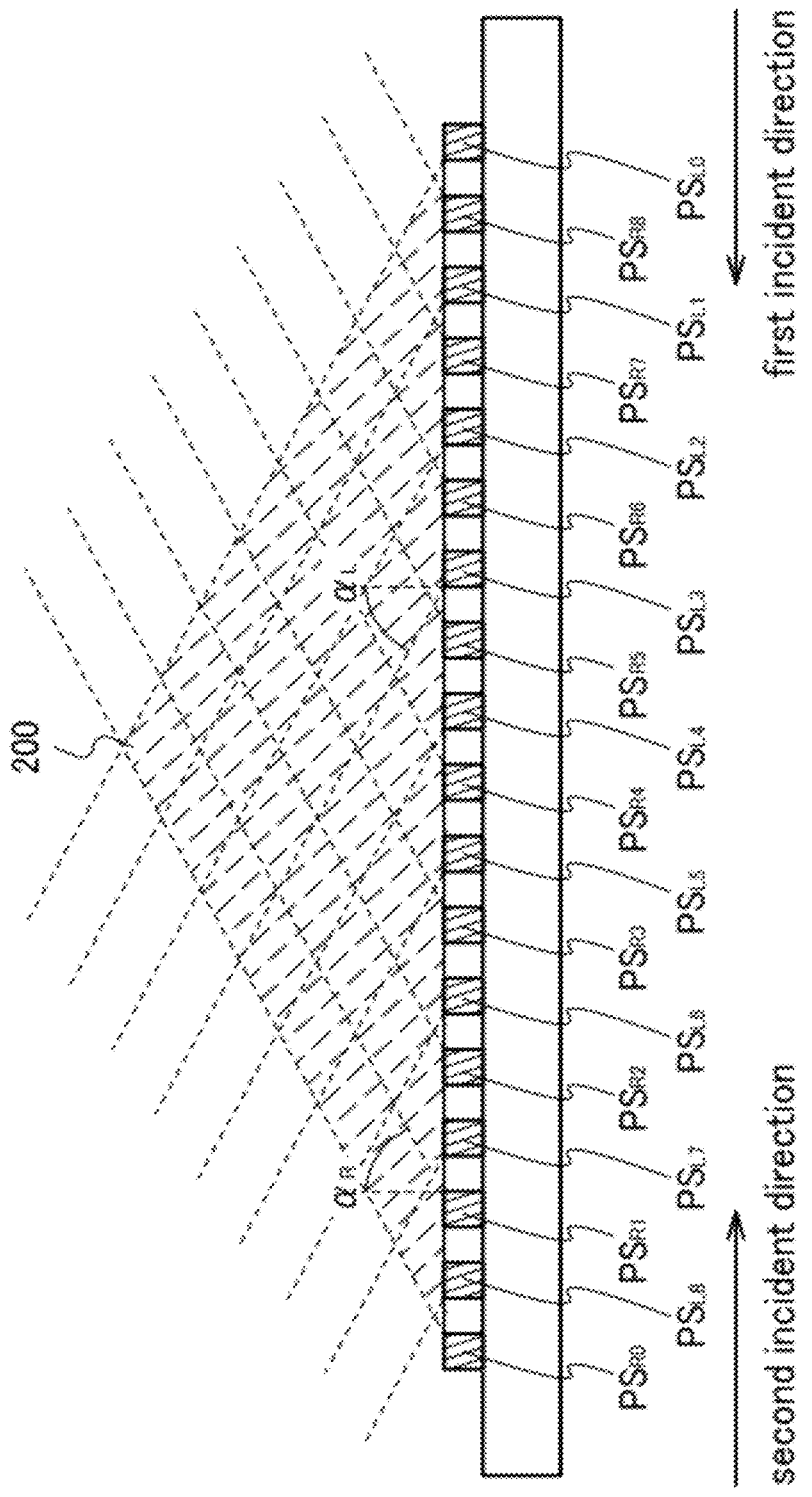
FIG. 5 is a cross-sectional view of a pixel portion.

FIG. 5 is an example of a cross-sectional view of a pixel portion provided with a plurality of photosensors in the case where first and second incident angles are uniformly set. Specifically, as in FIG. 1, FIG. 5 illustrates as an example the case where the nine first photosensors $PS_{R0}$ to $PS_{R8}$ and the nine second photosensors $PS_{L0}$ to $PS_{L8}$ are alternately arranged, that is, the photosensors are arranged from the left side of the drawing in the following order: $PS_{R0}$, $PS_{L8}$, $PS_{R1}$, $PS_{L7}$, ..., $PS_{R7}$, $PS_{L1}$, $PS_{R8}$, and $PS_{L0}$.

In FIG. 5, a first incident direction corresponds to the direction from the right side to the left side of the drawing, and a second incident direction corresponds to the direction from the left side to the right side of the drawing. That is to say, the case where the angle between the first incident direction and the second incident direction is 180° is illustrated as an example. Light with a first incident angle enters the first photosensors $PS_{R0}$ to $PS_{R8}$ from the first incident direction. Light with a second incident angle enters the second photosensors $PS_{L0}$ to $PS_{L8}$ from the second incident direction.

In FIG. 5, all the first incident angles $\alpha_R$'s of light incident on the plurality of first photosensors $PS_R$'s are the same, and all the second incident angles $\alpha_L$'s of light incident on the plurality of second photosensors $PS_L$'s are the same. Thus, in the case of FIG. 5, a detectable area 200 is an area surrounded by a ray of light incident on the first photosensor $PS_{R0}$ and a ray of light incident on the second photosensor $PS_{L0}$.

In FIG. 5, distribution of the detectable area 200 is uneven. Specifically, the width of the detectable area 200 in the direction normal to the pixel portion is narrower at an end part of the pixel portion than at a central part thereof. Thus, even when the distances from a boundary surface where the plurality of first photosensors $PS_R$'s and the plurality of second photosensors $PS_L$'s are formed are the same, an object can be detected in some cases and cannot be detected in other cases depending on a part of the pixel portion.

In the case of FIG. 5, by setting the first incident angle $\alpha_R$ to be small, the detectable area 200 can be widened. However, in the case where the first incident angle $\alpha_R$ is small, when even a small amount of light is diffused from the object, the light is likely to enter the plurality of first photosensors $PS_R$'s which are adjacent to each other concurrently. Accordingly, the accuracy of positional data obtained on the basis of the first photosensors $PS_R$'s might be reduced. In addition, in the case where the first incident angle $\alpha_R$ is small, external light, specifically, light from a body other than the object, light reflected by a body other than the object, or the like is likely to enter the first photosensor $PS_R$. Thus, the sensitivity of the first photosensor $PS_R$ is low. When the first incident angles $\alpha_R$'s of light incident on the plurality of first photosensors $PS_R$'s are set to be small and the same, the distance between rays of light incident on the adjacent first photosensors $PS_R$'s is short, resulting in lower accuracy of the positional data and lower sensitivity.

The same applies to the second incident angle $\alpha_L$ of light incident on the second photosensor $PS_L$. That is, by setting the second incident angle $\alpha_L$ to be small, the detectable area 200 can be widened. However, in the case where the second incident angle $\alpha_L$ is small, when even a small amount of light is diffused from the object, the light is likely to enter the plurality of second photosensors $PS_L$'s which are adjacent to each other concurrently. Accordingly, the accuracy of positional data obtained on the basis of the second photosensors $PS_L$'s might be reduced. In addition, in the case where the second incident angle $\alpha_L$ is small, external light, specifically, light from a body other than the object, light reflected by a body other than the object, or the like is likely to enter the second photosensor $PS_L$. Thus, the sensitivity of the second photosensor $PS_L$ is low. When the second incident angles $\alpha_L$'s of light incident on the plurality of second photosensors $PS_L$'s are set to be small and the same, the distance between rays of light incident on the adjacent second photosensors $PS_L$'s is short, resulting in lower accuracy of the positional data and lower sensitivity.

On the other hand, in the case of the solid-state image sensing device or the semiconductor display device according to one embodiment of the present invention, which is illustrated in FIG. 1, not all incident angles of light incident on a plurality of photosensors having a common incident direction are the same but at least one of the incident angles is different from one of the other incident angles. With the above structure, the detectable area 100 can be widened without uniformly setting the incident angles of light incident on the plurality of photosensors to be small. Further, even when the incident angles of light incident on the photosensors are small, by making the incident angles of light incident on the adjacent photosensors different from each other, the distance between rays of light incident on the photosensors can be increased as compared to the case in FIG. 5. Thus, in the case of a solid-state image sensing device or a semiconductor display device, according to one embodiment of the present invention, the detectable area 100 can be widened with high accuracy of positional data and high sensitivity ensured.

<Example of Method for Working out Positional Data>

Positional data can be worked out by triangulation or the like. Next, a specific method for working out positional data will be described taking an example.

Figure 6:
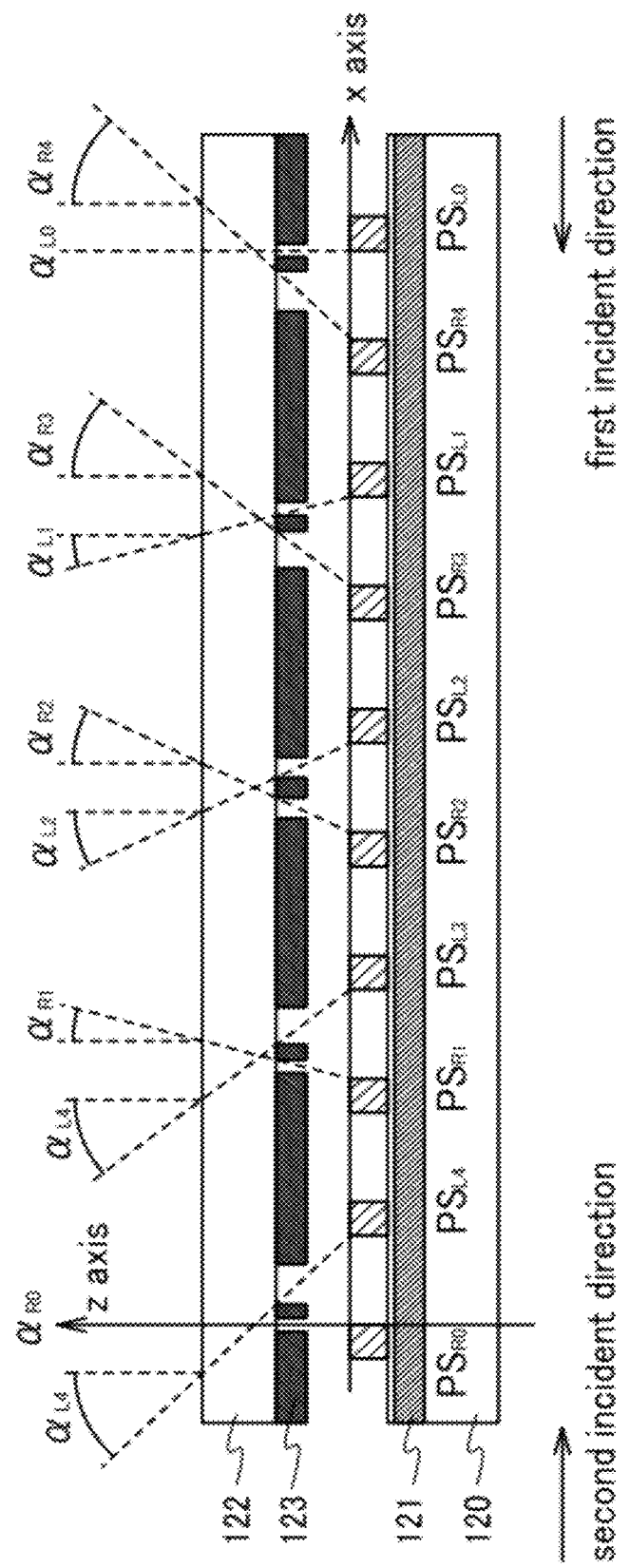
FIG. 6 is a cross-sectional view of a pixel portion.

First, FIG. 6 illustrates an example of a structure of a solid-state image sensing device or a semiconductor display device which is used to obtain positional data. In a cross-sectional view of a pixel portion of the solid-state image sensing device or the semiconductor display device in FIG. 6, arrangement of five first photosensors $PS_{R0}$ to $PS_{R4}$ having a first incident direction and five second photosensors $PS_{L0}$ to $PS_{L4}$ having a second incident direction opposite to the first incident direction is illustrated.

Specifically, in FIG. 6, a light-blocking film 121 is formed over a substrate 120, and the first photosensors $PS_{R0}$ to $PS_{R4}$ and the second photosensors $PS_{L0}$ to $PS_{L4}$ are provided over the light-blocking film 121. It is assumed that the first photosensors $PS_{R0}$ to $PS_{R4}$ and the second photosensors $PS_{L0}$ to $PS_{L4}$ are alternately arranged from the left side of the drawing in the following order: $PS_{R0}$, $PS_{L4}$, $PS_{R1}$, $PS_{L3}$, ..., $PS_{R3}$, $PS_{L1}$, $PS_{R4}$, and $PS_{L0}$. Further, a substrate 122 is provided so as to face the substrate 120 with the first photosensors $PS_{R0}$ to $PS_{R4}$ and the second photosensors $PS_{L0}$ to $PS_{L4}$ provided therebetween, and a light-blocking film 123 in which openings are formed is provided on the substrate 122.

Note that FIG. 6 illustrates an example where the light-blocking film 123 is formed on a surface of the substrate 122, which is closer to the first photosensors $PS_{R0}$ to $PS_{R4}$ and the second photosensors $PS_{L0}$ to $PS_{L4}$; however, one embodiment of the present invention is not limited to this structure. The light-blocking film 123 may be formed on a surface of the substrate 122, which is different from the surface closer to the first photosensors $PS_{R0}$ to $PS_{R4}$ and the second photosensors $PS_{L0}$ to $PS_{L4}$.

In FIG. 6, incident angles of light incident on the first photosensors $PS_{R0}$, $PS_{R1}$, $PS_{R2}$, $PS_{R3}$, and $PS_{R4}$ are denoted by $\alpha_{R0}$, $\alpha_{R1}$, $\alpha_{R2}$, $\alpha_{R3}$, and $\alpha_{R4}$, respectively. It is assumed that the incident angle $\alpha_{R0}$ is 0° and the ascending order of the incident angles is as follows: $\alpha_{R0}$, $\alpha_{R1}$, $\alpha_{R2}$, $\alpha_{R3}$, and $\alpha_{R4}$. Further, in FIG. 6, incident angles of light incident on the second photosensors $PS_{L0}$, $PS_{L1}$, $PS_{L2}$, $PS_{L3}$, and $PS_{L4}$ are denoted by $\alpha_{L0}$, $\alpha_{L1}$, $\alpha_{L2}$, $\alpha_{L3}$, and $\alpha_{L4}$, respectively. It is assumed that the incident angle $\alpha_{L0}$ is 0° and the ascending order of the incident angles is as follows: $\alpha_{L0}$, $\alpha_{L1}$, $\alpha_{L2}$, $\alpha_{L3}$, and $\alpha_{L4}$.

Note that the incident angles can be controlled by the positions of the openings in the light-blocking film 123. In other words, the first incident angles can be controlled by forming the openings in the light-blocking film 123 so that angles formed by the direction normal to the substrate 120 and the directions from the openings to the first photosensors $PS_{R0}$, $PS_{R1}$, $PS_{R2}$, $PS_{R3}$, and $PS_{R4}$ are $\alpha_{R0}$, $\alpha_{R1}$, $\alpha_{R3}$, and $\alpha_{R4}$, respectively. In addition, the second incident angles can be controlled by forming the openings in the light-blocking film 123 so that angles formed with the second photosensors $PS_{L0}$, $PS_{L1}$, $PS_{L2}$, $PS_{L3}$, and $PS_{L4}$ are $\alpha_{L0}$, $\alpha_{L1}$, $\alpha_{L2}$, $\alpha_{L3}$, and $\alpha_{L4}$, respectively.

The first photosensor $PS_{R0}$ is positioned at the origin point (0, 0), an x axis is in the first incident direction, that is, the lateral direction in the drawing and a z axis is in the longitudinal direction in the drawing. The position of the first photosensor $PS_{Rn}$ (n=0 to 4) is represented by coordinates ($x_{Rn}$, 0), and the position of an object is represented by coordinates (xd, zd). When light from the object enters the first photosensor $PS_{Rn}$, Equation 1 below is satisfied.

$$xd = x_{Rn} + zd \cdot \tan \alpha_{Rn} \quad \text{(Equation 1)}$$

The position of the second photosensor $PS_{L0}$ is represented by coordinates (W, 0). In other words, the second photosensor $PS_{L0}$ is W apart from the first photosensor $PS_{R0}$ in the x axis direction. In addition, the position of the second photosensor $PS_{Lm}$ (m=0 to 4) is represented by coordinates (W−$x_{Lm}$, 0) ($x_{L0}$=0). When light from the object enters the second photosensor $PS_{Lm}$, Equation 2 below is satisfied.

$$W - xd = x_{Lm} + zd \cdot \tan \alpha_{Lm} \quad \text{(Equation 2)}$$

Accordingly, Equations 3 and 4 below are derived from Equations 1 and 2.

$$xd = (x_{Rn} \cdot \tan \alpha_{Lm} + (W - x_{Lm}) \cdot \tan \alpha_{Rn}) / (\tan \alpha_{Rn} + \tan \alpha_{Lm}) \quad \text{(Equation 3)}$$

$$zd = (W - x_{Rn} - x_{Lm}) / (\tan \alpha_{Rn} + \tan \alpha_{Lm}) \quad \text{(Equation 4)}$$

Note that in the case where the first photosensors $PS_{Rn}$'s are provided at predetermined intervals (pitches p) and rays of light incident on the first photosensors $PS_{Rn}$'s intersect with each other at a virtual focal point ($D_{Rx}$, −$D_{Rz}$), Equation 5 below is satisfied.

$$\tan \alpha_{Rn} = (p \cdot n - D_{Rx}) / D_{Rz} \quad \text{(Equation 5)}$$

Similarly, in the case where the second photosensors $PS_{Lm}$'s are provided at predetermined intervals (pitches p)

and rays of light incident on the second photosensors $PS_{Lm}$'s intersect with each other at a virtual focal point (W–$D_{Lx}$, –$D_{Lz}$), Equation 6 below is satisfied.

$$\tan \alpha_{Lm} = (p \cdot m - D_{Lx})/D_{Lz} \quad \text{(Equation 6)}$$

When the position of the virtual focal point and Equation 5 or 6 are used, it is not necessary to set the values of $\tan \alpha_{Rn}$ and $\tan \alpha_{Lm}$ for all the photosensors, which are used in calculation of (xd, zd), so that calculation of the coordinates (xd, zd) is facilitated.

Note that described in this embodiment is a method for obtaining positional data of an object with the use of photosensors arranged in one dimension. It is also possible to obtain positional data of an object with the use of photosensors arranged in two dimensions in a pixel portion in a similar manner.

In addition, when the distance from an object, that is, the state where zd is a specific value is detected, a control signal set in advance can be generated. For example, the state where zd is smaller than or equal to a specific value is detected, a control signal for input of a specific key can be generated.

With the above structure, a solid-state image sensing device or a semiconductor display device, which can obtain positional data of an object without contact between the object and the solid-state image sensing device or the semiconductor display device, can be provided.

Embodiment 2

In this embodiment, a specific structure of a photosensor included in a solid-state image sensing device or a semiconductor display device, according to one embodiment of the present invention, will be described.

Figure 7A:
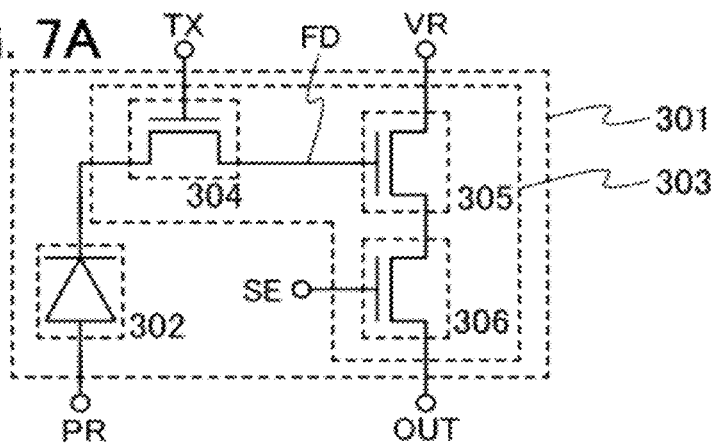
FIG. 7A is a circuit diagram of a photosensor.

FIG. 7A is an example of a circuit diagram illustrating a connection configuration of a photosensor 301. The photosensor 301 includes a photodiode 302 and an amplifier circuit 303. The photodiode 302 is a photoelectric conversion element which generates current when a junction of semiconductors is exposed to light. The amplifier circuit 303 is a circuit which amplifies current obtained through light reception by the photodiode 302 or a circuit which holds electric charge accumulated with the current.

The configuration of the amplifier circuit 303 may be any configuration as long as current generated in the photodiode 302 can be amplified or electric charge accumulated with the current can be held. It is necessary that the amplifier circuit 303 include a transistor 305 which amplifies current generated in the photodiode 302.

The terms of a "source electrode" and a "drain electrode" included in a transistor are interchangeable with each other depending on the polarity of the transistor or a difference between the levels of potentials supplied to the electrodes. In general, in an n-channel transistor, an electrode to which a lower potential is supplied is called a source electrode, and an electrode to which a higher potential is supplied is called a drain electrode. Further, in a p-channel transistor, an electrode to which a lower potential is supplied is called a drain electrode, and an electrode to which a higher potential is supplied is called a source electrode. A specific configuration of the photosensor 301 in FIG. 7A will be described below on the assumption that one of a source electrode and a drain electrode is a first terminal and the other is a second terminal.

In the photosensor 301 in FIG. 7A, the amplifier circuit 303 includes a transistor 304, a transistor 305, and a transistor 306. The transistor 304 functions as a switching element which controls supply of the current to the amplifier circuit 303. The current value or the resistance value between a first terminal and a second terminal of the transistor 305 depends on a potential supplied to a second terminal of the transistor 304. The transistor 306 functions as a switching element for supplying the potential of an output signal, which is set in accordance with the current value or the resistance value, to a wiring OUT.

Specifically, in FIG. 7A, an anode of the photodiode 302 is connected to a wiring PR. A cathode of the photodiode 302 is connected to a first terminal of the transistor 304. The second terminal of the transistor 304 is connected to another semiconductor element included in the amplifier circuit 303, so that the connection of the second terminal of the transistor 304 differs depending on the configuration of the amplifier circuit 303; in FIG. 7A, the second terminal of the transistor 304 is connected to a gate electrode of the transistor 305. A gate electrode of the transistor 304 is connected to a wiring TX. The wiring TX is supplied with a potential of a signal for controlling the switching of the transistor 304. The first terminal of the transistor 305 is connected to a wiring VR which is supplied with a high-level power supply potential VDD. The second terminal of the transistor 305 is connected to a first terminal of the transistor 306. A second terminal of the transistor 306 is connected to the wiring OUT. A gate electrode of the transistor 306 is connected to a wiring SE, and the wiring SE is supplied with the potential of a signal for controlling the switching of the transistor 306. The wiring OUT is supplied with the potential of an output signal which is output from the amplifier circuit 303.

In FIG. 7A, a node where the second terminal of the transistor 304 and the gate electrode of the transistor 305 are connected to each other is denoted by a node FD. The potential of the output signal depends on the amount of electric charge accumulated at the node FD. In order to hold electric charge at the node FD more reliably, a storage capacitor may be connected to the node FD.

Note that the term "connection" in this specification refers to electrical connection and corresponds to the state in which current, voltage, or a potential can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted.

In addition, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

Note that FIG. 7A illustrates as an example the case where the wiring PR, the wiring TX, and the wiring OUT are connected to each of the photosensors 301; however, the number of wirings included in each of the photosensors 301 in one embodiment of the present invention is not limited to the number in this example. In addition to the above wirings, a wiring supplied with a power supply potential, a wiring supplied with a potential of a signal for resetting the amount of electric charge held by the amplifier circuit 303, or the like may be connected to each of the photosensors 301.

Note that although FIG. 7A illustrates the configuration of the photosensor 301 in which the amplifier circuit 303 includes only one transistor 304 which functions as a switching element, one embodiment of the present invention is not limited to this configuration. Although the configuration in which one transistor functions as one switching element is described, a plurality of transistors may function as one switching element in one embodiment of the present invention. In the case where a plurality of transistors functions as one switching element, the plurality of transistors may be connected to each other in parallel, in series, or in combination of parallel connection and serial connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

FIG. 7A illustrates the case where the transistor 304 includes the gate electrode only on one side of an active layer. When the transistor 304 has a pair of gate electrodes with an active layer provided therebetween, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be supplied to the pair of electrodes, or a fixed potential such as a ground potential may be supplied only to the other of the gate electrodes. By controlling the level of potential supplied to the other of the gate electrodes, the threshold voltage of the transistor 304 can be controlled.

Note that in FIG. 7A, for active layers of the transistors 304, 305, and 306 included in the amplifier circuit 303, oxide semiconductors or the following semiconductors other than oxide semiconductors may be used: amorphous silicon, microcrystalline silicon, polycrystalline silicon, single crystal silicon, amorphous germanium, microcrystalline germanium, polycrystalline germanium, single crystal germanium, or the like. With the use of semiconductors including the same materials for the active layers of all the transistors in the photosensor 301, a manufacturing process can be simplified. When an oxide semiconductor is used for the active layer of the transistor 304, the off-state current of the transistor 304 can be significantly reduced. The transistor 304 functions as a switching element for holding electric charge accumulated in the photosensor 301; thus, leakage of the electric charge in an electric charge holding period can be suppressed. With the use of a semiconductor material capable of providing higher mobility than an oxide semiconductor, such as polycrystalline silicon or single crystal silicon, for the active layers of the transistor 305 and the transistor 306, positional data can be read from the photosensor 301 at high speed.

Unless otherwise specified, in the case of an n-channel transistor, off-state current in this specification is current which flows between a source electrode and a drain electrode when the potential of the drain electrode is higher than that of the source electrode and that of a gate electrode while the potential of the gate electrode is lower than or equal to zero when a reference potential is the potential of the source electrode. Alternatively, in this specification, in the case of a p-channel transistor, an off-state current is current which flows between a source electrode and a drain electrode when the potential of the drain electrode is lower than that of the source electrode or that of a gate electrode while the potential of the gate electrode is higher than or equal to zero when a reference potential is the potential of the source electrode.

Note that an oxide semiconductor which is highly purified by reduction of impurities serving as electron donors (donors), such as moisture and hydrogen, and which includes reduced oxygen vacancies (purified OS) is an intrinsic (i-type) semiconductor or a substantially i-type semiconductor. Therefore, a transistor including the oxide semiconductor has a characteristic of significantly low off current. Specifically, the concentration of hydrogen in the highly purified oxide semiconductor including reduced oxygen vacancies, which is measured by secondary ion mass spectrometry (SIMS), is less than or equal to $5\times10^{19}/cm^3$, preferably less than or equal to $5\times10^{18}/cm^3$, further preferably less than or equal to $5\times10^{17}/cm^3$, still further preferably less than or equal to $1\times10^{16}/cm^3$. In addition, the carrier density of the oxide semiconductor film, which can be measured by Hall effect measurement, is less than $1\times10^{14}/cm^3$, preferably less than $1\times10^{12}/cm^3$, more preferably less than $1\times10^{11}/cm^3$. Furthermore, the band gap of the oxide semiconductor is 2 eV or more, preferably 2.5 eV or more, more preferably 3 eV or more. With the use of the oxide semiconductor film which has been highly purified by sufficiently reducing the concentration of impurities such as moisture and hydrogen and which includes reduced oxygen vacancies, the off-state current of the transistor can be reduced.

The analysis of the concentration of hydrogen in the oxide semiconductor film is described here. The hydrogen concentrations in the oxide semiconductor film and a conductive film are measured by SIMS. It is known that it is difficult to obtain data in the proximity of a surface of a sample or in the proximity of an interface between stacked films formed using different materials by SIMS in principle. Therefore, when a distribution of hydrogen concentrations of the film in its thickness direction is analyzed by SIMS, an average value in a region in which values do not extremely vary and are substantially the same in a range where the target film exists is employed as the hydrogen concentration. Further, in the case where the thickness of the film is small, a region where almost the same value can be obtained cannot be found in some cases due to the influence of the hydrogen concentration in the films adjacent to each other. In this case, the maximum value or the minimum value of the hydrogen concentration in a region where the film is provided is employed as the hydrogen concentration in the film. Furthermore, in the case where a maximum peak and a minimum valley do not exist in the region where the film is provided, the value of the inflection point is employed as the hydrogen concentration.

Specifically, various experiments can prove the low off-state current of the transistor whose active layer is the highly purified oxide semiconductor having reduced oxygen deficiencies. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it can be found that an off current density corresponding to a value obtained by dividing the off current by the channel width of the transistor is less than or equal to 100 zA/μm. In addition, the off-state current density of the transistor was measured using a circuit in which a capacitor and the transistor were connected to each other and electric charge flowing into or from the capacitor was controlled by the transistor. In the measurement, the highly-purified oxide semiconductor film was used for a channel formation region in the transistor, and the off-state current density of the transistor was measured from change in electric charge amount of the capacitor per unit time. As a result, it was found that in the case where the voltage between the source electrode and the drain electrode of the transistor was 3 V, a lower off-state current density of several tens of yoctoamperes per micrometer (yA/μm) was able to be obtained. Thus, in the semiconductor display device according to one embodiment of the present invention, the off-state current density of the transistor including the highly purified oxide semiconductor film as the active layer can be set to less than or equal to 100 yA/μm, preferably less than or equal to 10 yA/μm, more preferably less than or equal to 1 yA/μm depending on the voltage between the source electrode and the drain electrode. Thus, the transistor including the highly-purified oxide semiconductor film as the active layer has much lower off-state current than a transistor including silicon having crystallinity.

An oxide semiconductor to be used preferably contains In or Zn, or more preferably contains In and Ga, or In and Zn. In order to obtain an i-type (intrinsic) oxide semiconductor film, dehydration or dehydrogenation to be described later is effective. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. The above oxide semiconductor may contain silicon.

Note that for example, an "In—Ga—Zn-based oxide" means an oxide containing In, Ga, and Zn and there is no particular limitation on the ratio of In, Ga, and Zn. The In—Ga—Z-based oxide may contain another metal element in addition to In, Ga, and Zn. Note that an In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material used for a solid-state image sensing device or a semiconductor display device.

Alternatively, a material represented by $InMO_3(ZnO)_m$ (m>0) may be used as an oxide semiconductor. Note that M represents one or more metal elements selected from Ga, Al, Mn, and Co. For example, M may be Ga, Ga and Al, Ga and Fe, Ga and Ni, Ga and Mn, Ga and Co, or the like. Still alternatively, a material represented by $In_3SnO_5(ZnO)_n$ (n>0 is satisfied, and n is an integer) may be used as an oxide semiconductor. Note that the above compositions are derived from crystal structures and are only examples.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that one embodiment of the disclosed invention is not limited thereto, and a material having appropriate composition depending on semiconductor characteristics (mobility, threshold, variation, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same can be applied to other oxides.

The oxide semiconductor film may be either amorphous or crystalline. In the latter case, the crystalline oxide semiconductor film may be a single crystal oxide semiconductor film or a polycrystalline oxide semiconductor. Alternatively, the crystalline oxide semiconductor film may have a partly crystalline structure, an amorphous structure including a portion having crystallinity or a non-amorphous structure. As an example of such a partly crystalline structure, an oxide including a crystal with c-axis alignment (also referred to as a c-axis-aligned crystal (CAAC)), which has a triangular or hexagonal atomic arrangement when seen from the direction of an a-b plane, a surface, or an interface, may be used. In the crystal, metal atoms are arranged in a layered manner, or metal atoms and oxygen atoms are arranged in a layered manner along the c-axis, when seen from the direction perpendicular to the c-axis, and the direction of the a-axis or the b-axis is varied in the a-b plane (the crystal rotates around the c-axis).

In an oxide semiconductor in an amorphous state, a flat surface can be obtained with relative ease, so that when a transistor is manufactured with the use of the oxide semiconductor, interface scattering can be suppressed, and relatively high mobility can be obtained with relative ease.

In an oxide semiconductor having crystallinity, defects in the bulk can be reduced as compared to in an oxide semiconductor layer in an amorphous state and when surface evenness is improved, mobility higher than that of an oxide semiconductor layer in an amorphous state can be realized. In order to improve the surface evenness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with Equation 7.

[EQUATION 7]

$$Ra = \frac{1}{S_0} \int_{x_2}^{x_1} \int_{y_2}^{y_1} |f(x, y) - Z_0| dx dy \quad \text{(Equation 7)}$$

Note that in Equation 7, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of a measurement surface. Ra can be measured using an atomic force microscope (AFM).

Figure 7B:
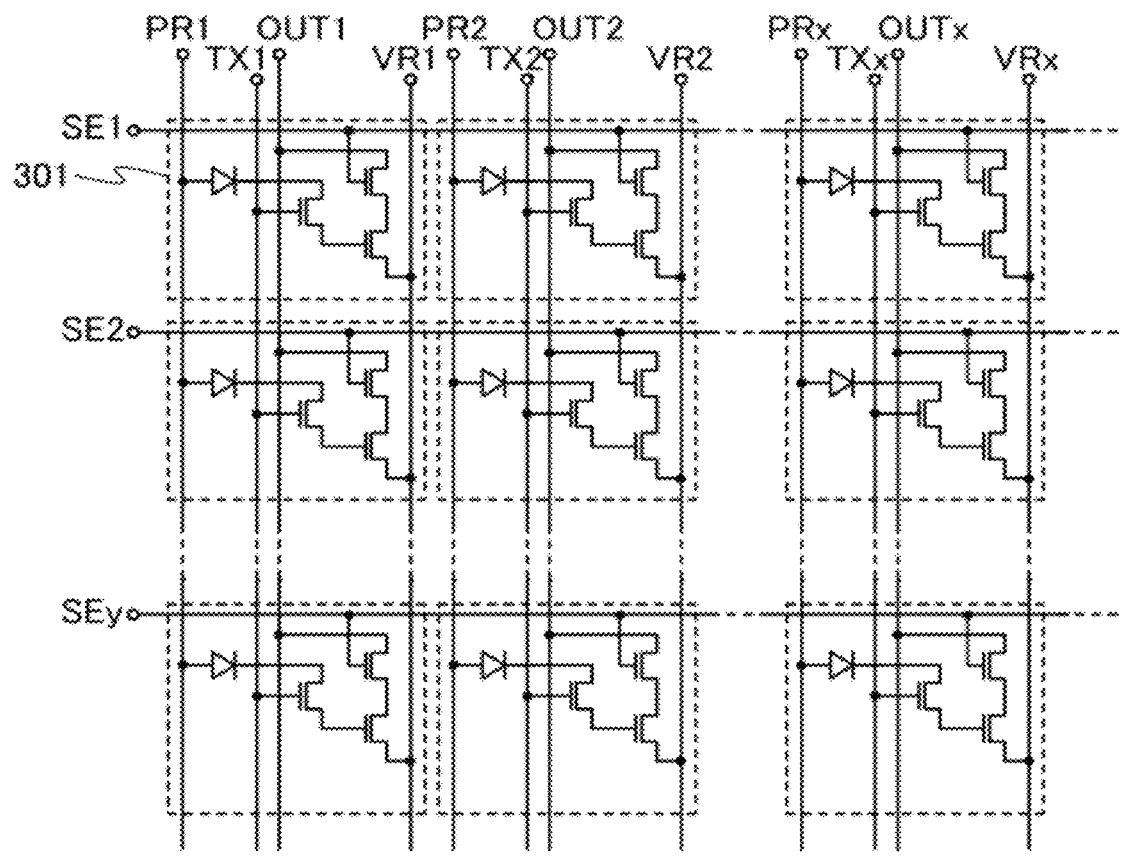
FIG. 7B is a diagram of a configuration of a pixel portion.

FIG. 7B illustrates an example of a configuration of a pixel portion including the photosensor 301 in FIG. 7A.

In FIG. 7B, a plurality of photosensors 301 is arranged in matrix. The photosensors 301 in each column are connected to one of a plurality of wirings PR (referred to as wirings PR1 to PRx), one of a plurality of wirings TX (referred to as wirings TX1 to TXx), one of a plurality of wirings OUT (referred to as wirings OUT1 to OUTx), and one of a plurality of wirings VR (referred to as wirings VR1 to VRx). The photosensors 301 in each row are connected to one of a plurality of wirings SE (referred to as wirings SE1 to SEy).

Next, an example of operation of the photosensors 301 illustrated in FIGS. 7A and 7B will be described.

Figure 8:
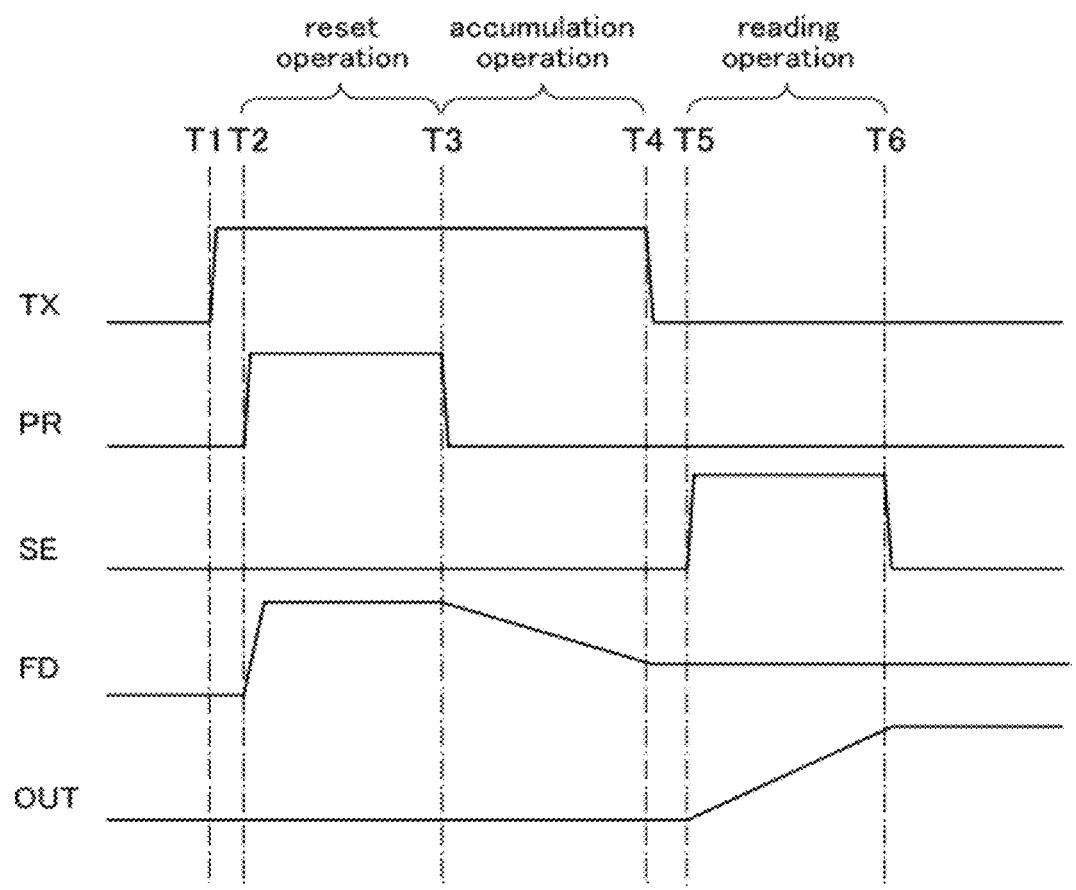
FIG. 8 is a timing chart of a photosensor.

First, the operation of each of the photosensors 301 will be described. FIG. 8 is a timing chart of various potentials supplied to the photosensor 301 illustrated in FIGS. 7A and 7B, as an example.

Note that in the timing chart in FIG. 8, for easy understanding of the operation of the photosensor 301, it is assumed that the wiring TX, the wiring SE, and the wiring PR are supplied with a high-level potential and a low-level potential. Specifically, it is assumed that the wiring TX is supplied with a high-level potential HTX and a low-level potential LTX; the wiring SE, a high-level potential HSE and a low-level potential LSE; and the wiring PR, a high-level potential HPS and a low-level potential LPS.

First, at a time T1, the potential of the wiring TX is changed from the potential LTX to the potential HTX. When the potential of the wiring TX is changed to the potential HTX, the transistor 304 is turned on. Note that at the time T1, the wiring SE is supplied with the potential LSE, and the wiring PR is supplied with the potential LPR.

Next, at a time T2, the potential of the wiring PR is changed from the potential LPR to the potential HPR. At the time T2, the potential of the wiring TX remains at the potential HTX, and the potential of the wiring SE remains at the potential LSE. Accordingly, the node FD is supplied with the potential HPR of the wiring PR; thus, the amount of electric charge held at the node FD is reset.

Then, at a time T3, the potential of the wiring PR is changed from the potential HPR to the potential LPR. Until shortly before the time T3, the potential of the node FD remains at the potential HPR. Thus, when the potential of the wiring PR is changed to the potential LPR, a reverse bias voltage is applied to the photodiode 302. Then, when light enters the photodiode 302 in a state where a reverse bias voltage is applied to the photodiode 302, current flows from the cathode of the photodiode 302 toward the anode thereof. The value of the current varies according to the intensity of light. In other words, as the intensity of light entering the photodiode 302 increases, the value of the current increases and the amount of electric charge leaking from the node FD also increases. Conversely, as the intensity of light entering the photodiode 302 decreases, the value of the current decreases and the amount of electric charge leaking from the node FD also decreases. Thus, as the intensity of light is higher, the amount of change in potential of the node FD increases, and as the intensity of light is lower, the amount of change decreases.

Then, at a time T4, when the potential of the wiring TX is changed from the potential HTX to the potential LTX, the transistor 304 is turned off. Then, at the time T4, when the potential of the wiring TX is changed from the potential HTX to the potential LTX, the transistor 304 is turned off. Accordingly, the transfer of electric charge from the node FD to the photodiode 302 is stopped and thus the potential of the node FD is determined.

Next, at the time T5, when the potential of the wiring SE is changed from the potential LSE to the potential HSE, the transistor 306 is turned on. Then, according to the potential of the node FD, electric charge is transferred from the wiring VR to the wiring OUT.

Next, at the time T6, when the potential of the wiring SE is changed from the potential HSE to the potential LSE, the transfer of electric charge from the wiring VR to the wiring OUT is stopped and thus the potential of the wiring OUT is determined. The potential of the wiring OUT corresponds to the potential of the output signal of the photosensor 301. The potential of the output signal includes the positional data of a taken image of an object.

The series of operations described above can be classified into a reset operation, an accumulation operation, and a reading operation. In other words, operation from the time T2 to the time T3 corresponds to the reset operation; operation from the time T3 to the time T4, the accumulation operation; and an operation from the time T5 to the time T6, the reading operation. By performing the reset operation, the accumulation operation, and the reading operation, positional data can be obtained.

Furthermore, a period between the end of the accumulation operation and the start of the reading operation, i.e., a period from the time T4 to the time T5, corresponds to an electric charge holding period in which electric charge is held at the node FD.

In a solid-state image sensing device or a semiconductor display device, according to one embodiment of the present invention, a pixel portion may be operated either by a rolling shutter system or a global shutter system. A rolling shutter system is a driving method in which electric charge accumulation operation and reading operation in photosensors are performed sequentially row by row. A global shutter system is a driving method in which accumulation operation is performed in all pixels at a time.

Figure 9:
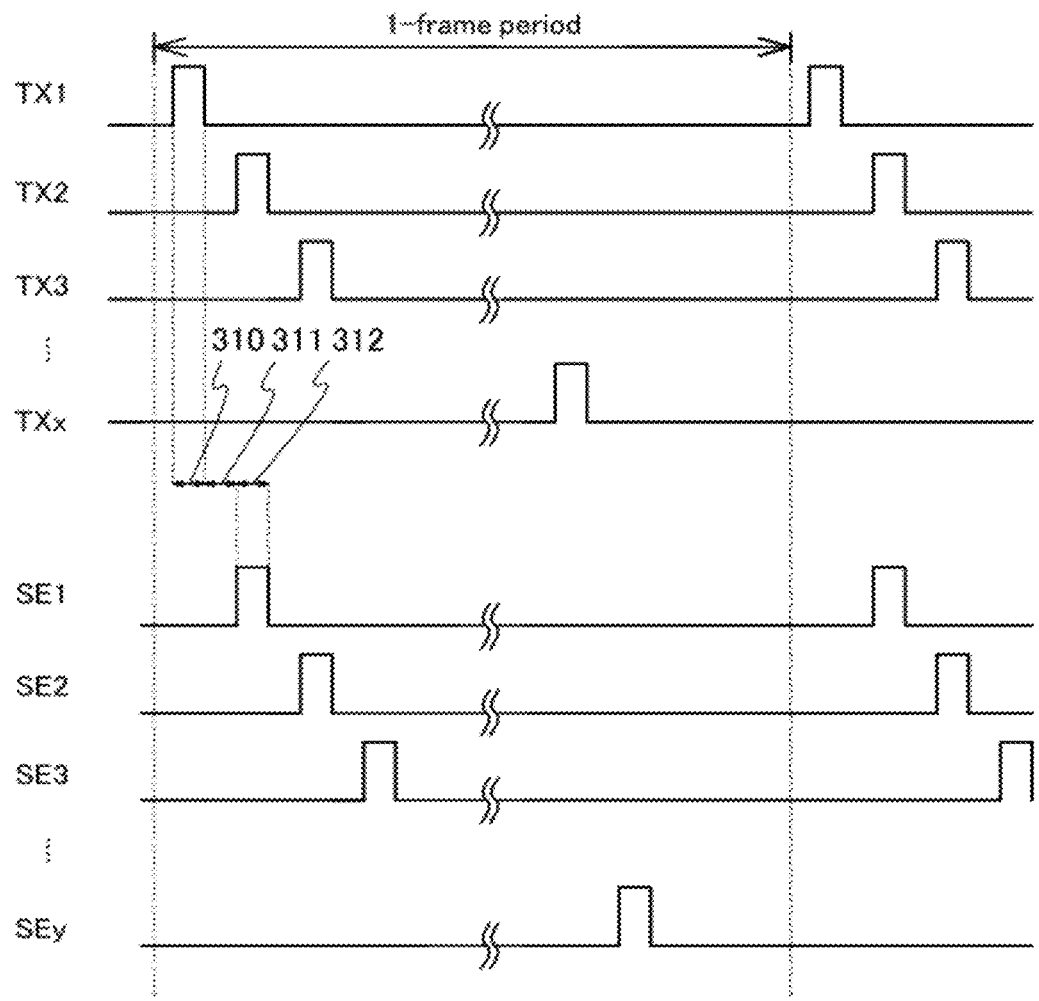
FIG. 9 is a timing chart of the case where a rolling shutter system is employed.

First, an example of operation of a pixel portion by a global shutter system will be described. FIG. 9 shows a timing chart of potentials supplied to the wirings TX1 to TXx and the wirings SE1 to SEy in the pixel portion illustrated in FIG. 7B in the case where a rolling shutter system is employed, as an example.

In the timing chart in FIG. 9, reset operation and accumulation operation from the time T2 to the time T4 are performed sequentially by the photosensors 301 row by row. In other words, the timings of the time T2 to T4 differ among rows of the photosensors 301. Thus, the potential of the wiring TX1 is changed from the potential LTX to the potential HTX and is then changed from the potential HTX to the potential LTX. After that, the potentials of the wirings TX2 to TXx are also sequentially changed in a similar manner. In FIG. 9, a period in which the reset operation and the accumulation operation are performed is referred to as a light exposure period 310.

In the timing chart in FIG. 9, the reading operation from the time T5 to the time T6 is performed sequentially by the photosensors 301 row by row. In other words, the timings of the time T5 and the time T6 differ among rows of the photosensors 301. Specifically, the potential of the wiring SE1 is changed from the potential LSE to the potential HSE and is then changed from the potential HSE to the potential LSE. After that, the potentials of the wirings SE2 to SEy are also sequentially changed in a similar manner. In FIG. 9, a period in which the reading operation is performed is referred to as a reading period 311.

Figure 10:
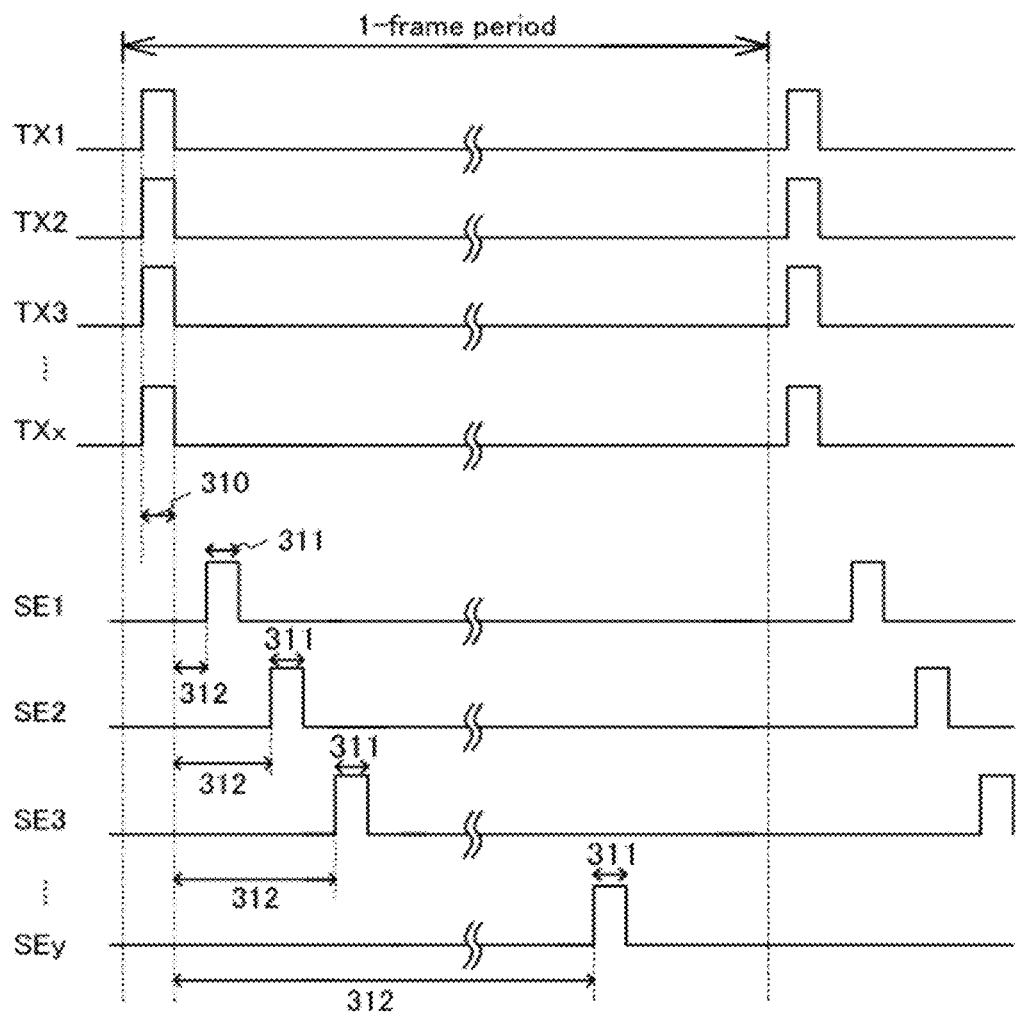
FIG. 10 is a timing chart of the case where a global shutter system is employed.

Next, an example of operation of a pixel portion by a global shutter system will be described. FIG. 10 shows a timing chart of potentials supplied to the wirings TX1 to TXx and the wirings SE1 to SEy in the pixel portion illustrated in FIG. 7B in the case where a global shutter system is employed, as an example.

In the timing chart in FIG. 10, the reset operation and the accumulation operation from the time T2 to the time T4 are performed in all the photosensors 301 concurrently. Thus, the potentials of the wirings TX1 to TXx are changed from the potential LTX to the potential HTX all at once at the time T1 and changed from the potential HTX to the potential LTX all at once at the time T4. In FIG. 10, a period in which the reset operation and the accumulation operation are performed is referred to as the light exposure period 310.

In the timing chart in FIG. 10, the reading operation from the time T5 to the time T6 is performed sequentially by the photosensors 301 row by row. In other words, the timings of the time T5 and the time T6 differ among rows of the photosensors 301. Specifically, the potential of the wiring SE1 is changed from the potential LSE to the potential HSE and is then changed from the potential HSE to the potential LSE. After that, the potentials of the wirings SE2 to SEy are also sequentially changed in a similar manner. In FIG. 10, a period in which the reading operation is performed is referred to as the reading period 311.

Note that in taking an image by a rolling shutter system, a period in which accumulation operation of the first row differs from that of the last row. Thus, when an image of a fast-moving object is taken by a rolling shutter system, positional data of the object with distortion is obtained. On the other hand, a global shutter system is a method in which accumulation operation is performed in all pixels at a time; thus, accumulation operation periods of all rows coincide with one another. Therefore, in the case of a global shutter system, such a problem of the distortion of the positional data can be solved.

However, in a global shutter system, accumulation operation is performed in all photosensors at a time, whereas reading operation is performed in the photosensors row by row. Accordingly, the length of an electric charge holding period 312 between the end of the light exposure period 310 and the start of the reading period 311 differs among rows of the photosensors, and the electric charge holding period 312 of the photosensors in the last row is the longest. Electric charge accumulated at the node FD leaks as time passes; therefore, in the case where the length of the electric charge holding period 312 differs among rows of the photosensors, the potentials of output signals of the photosensors might vary among the rows. Consequently, it becomes difficult to accurately determine a photosensor on which light from an object is selectively incident in order to obtain exact positional data of the object.

However, in one embodiment of the present invention, the oxide semiconductor film may be used for the active layer of the transistor 304. When the oxide semiconductor film is used for the active layer of the transistor 304, the off-state current of the transistor 304 can be significantly reduced. The transistor 304 with significantly low off-state current is used as a switching element for holding electric charge accumulated in the photosensor 301, specifically, electric charge accumulated at the node FD, whereby leakage of electric charge in the electric charge holding period can be suppressed. Therefore, even when an image is taken by a global shutter system, false extraction of a photosensor due to difference between electric charge holding periods can be prevented so that accuracy of positional data can be increased.

Note that with a solid-state image sensing device, external light can be utilized to take an image, and it is also possible to utilize light from a backlight instead of external light in order to take an image, like with a contact area sensor, for example. In the case where a backlight is used in one embodiment of the present invention, a plurality of light sources which emits light of different colors may be used in the backlight, and field sequential operation (FS operation) in which the light sources are sequentially turned on may be performed to obtain color positional data. By FS operation, color positional data can be obtained by an additive process using positional data corresponding to a plurality of colors. Note that a non-light-emitting period may be added, and positional data may be obtained in the non-light-emitting period. By subtracting positional data obtained in the non-light-emitting period from the positional data corresponding to the colors, high-contrast color positional data with less influence of external light can be obtained.

In the case of FS operation of the backlight, light sources of different colors need to be sequentially turned on one after another so as to emit light, unlike in the case of combining a light source of a single color with color filters. In addition, the frequency at which switching of the light sources is performed needs to be set higher than the frame frequency in the case of using a light source of a single color. For example, when the frame frequency in the case of using a light source of a single color is 60 Hz, the frequency at which switching of the light sources is performed in the case of performing FS operation using light sources corresponding to colors of red, green, and blue is 180 Hz which is about three times as high as the frame frequency. Thus, a period when the light source of each color emits light is very short. On the other hand, when an image is taken by a global shutter system, electric charge reset operation and accumulation operation can be performed in all pixels at a time. Accordingly, it can take less time to complete accumulation operation in all the pixels, as compared to the case of using a rolling shutter system. Therefore, even when a period in which the light source of each color emits light shortens in the case of employing FS operation, accumulation operation can be completed in all the pixels within the above period.

In addition, the adoption of FS operation eliminates the need to provide a color filter in each pixel and can increase use efficiency of light from a backlight. Accordingly, power consumption of a solid-state image sensing device can be reduced. With a single pixel, positional data corresponding to different colors can be obtained, or images corresponding to different colors can be displayed; thus, high-resolution positional data can be obtained, or a high-definition image can be displayed.

Next, an example of a pixel in a semiconductor display device according to one embodiment of the present invention will be described. In a solid-state image sensing device, a photosensor is provided in each pixel, whereas in a semiconductor display device, a display element as well as a photosensor is provided in each pixel. In a semiconductor display device, the configuration illustrated in FIG. 7B can also be employed as a configuration of connections among photosensors. Furthermore, in a semiconductor display device, the configuration of the photosensor illustrated in FIG. 7A can also be employed.

Figure 11:
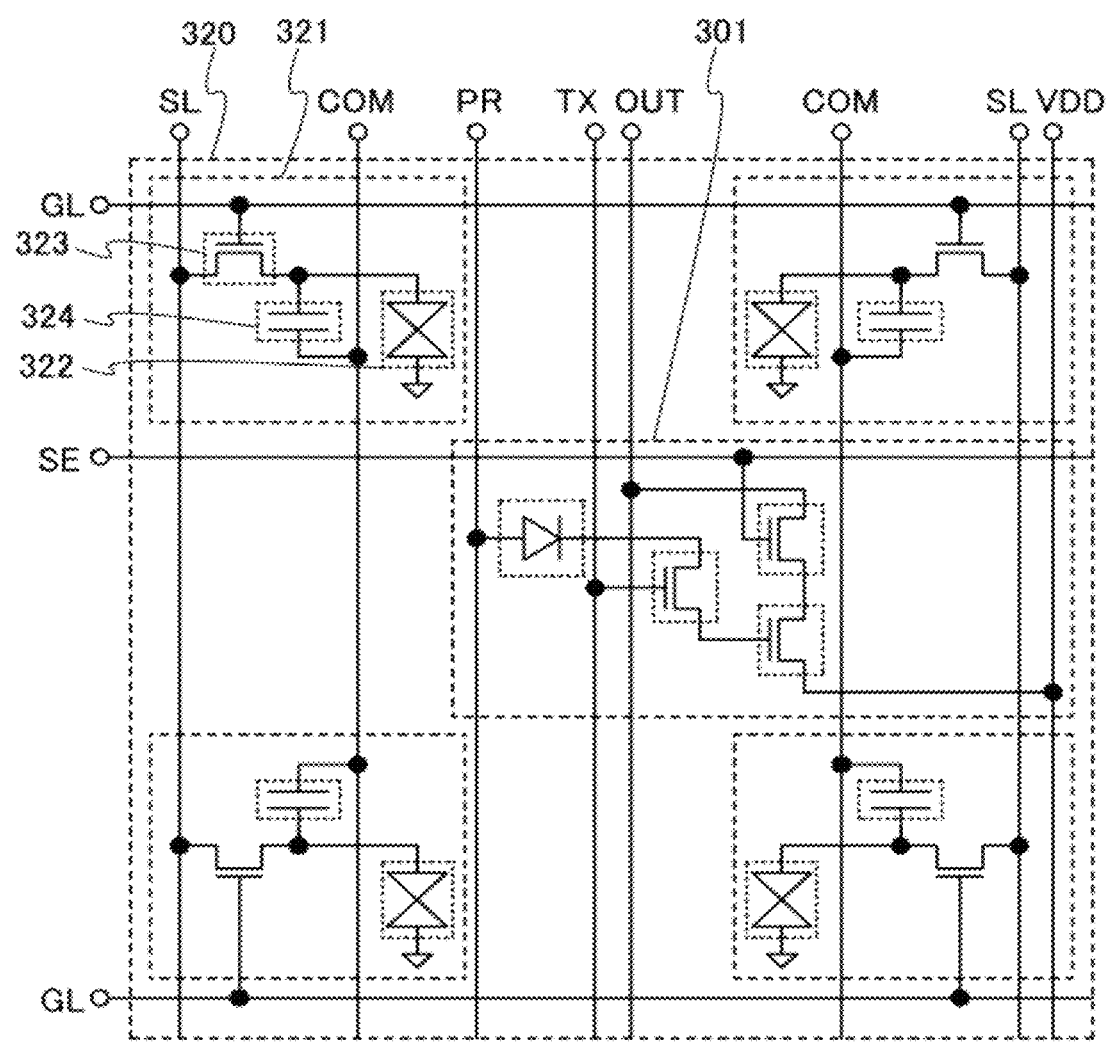
FIG. 11 is a circuit diagram of a configuration of a pixel.

FIG. 11 is a circuit diagram illustrating an example of a configuration of a pixel included in a semiconductor display device. In FIG. 11, a pixel 320 includes four display elements 321 and one photosensor 301. FIG. 11 illustrates as an example the case where the photosensor 301 having the configuration in FIG. 7A is used in the pixel 320. Note that in a semiconductor display device according to one embodiment of the present invention, the number of the display elements 321 and the number of the photosensors 301 included in each pixel are not limited to those in the configuration illustrated in FIG. 11.

The display element 321 includes a liquid crystal element 322 and a circuit element such as a transistor for controlling operation of the liquid crystal element 322. Specifically, FIG. 11 illustrates as an example the case where the display element 321 includes the liquid crystal element 322, a transistor 323 functioning as a switching element, and a capacitor 324. The liquid crystal element 322 includes a pixel electrode, a counter electrode, and liquid crystal to which voltage is applied using the pixel electrode and the counter electrode.

Note that the display element 321 may further include another circuit element such as a transistor, a diode, a resistor, a capacitor, or an inductor as needed.

A gate electrode of the transistor 323 is connected to a scan line GL. A first terminal of the transistor 323 is connected to a signal line SL, and a second terminal thereof is connected to the pixel electrode of the liquid crystal element 322. One of a pair of electrodes of the capacitor 324 is connected to the pixel electrode of the liquid crystal element 322, and the other thereof is connected to a wiring COM which is supplied with a fixed potential.

Figure 12:
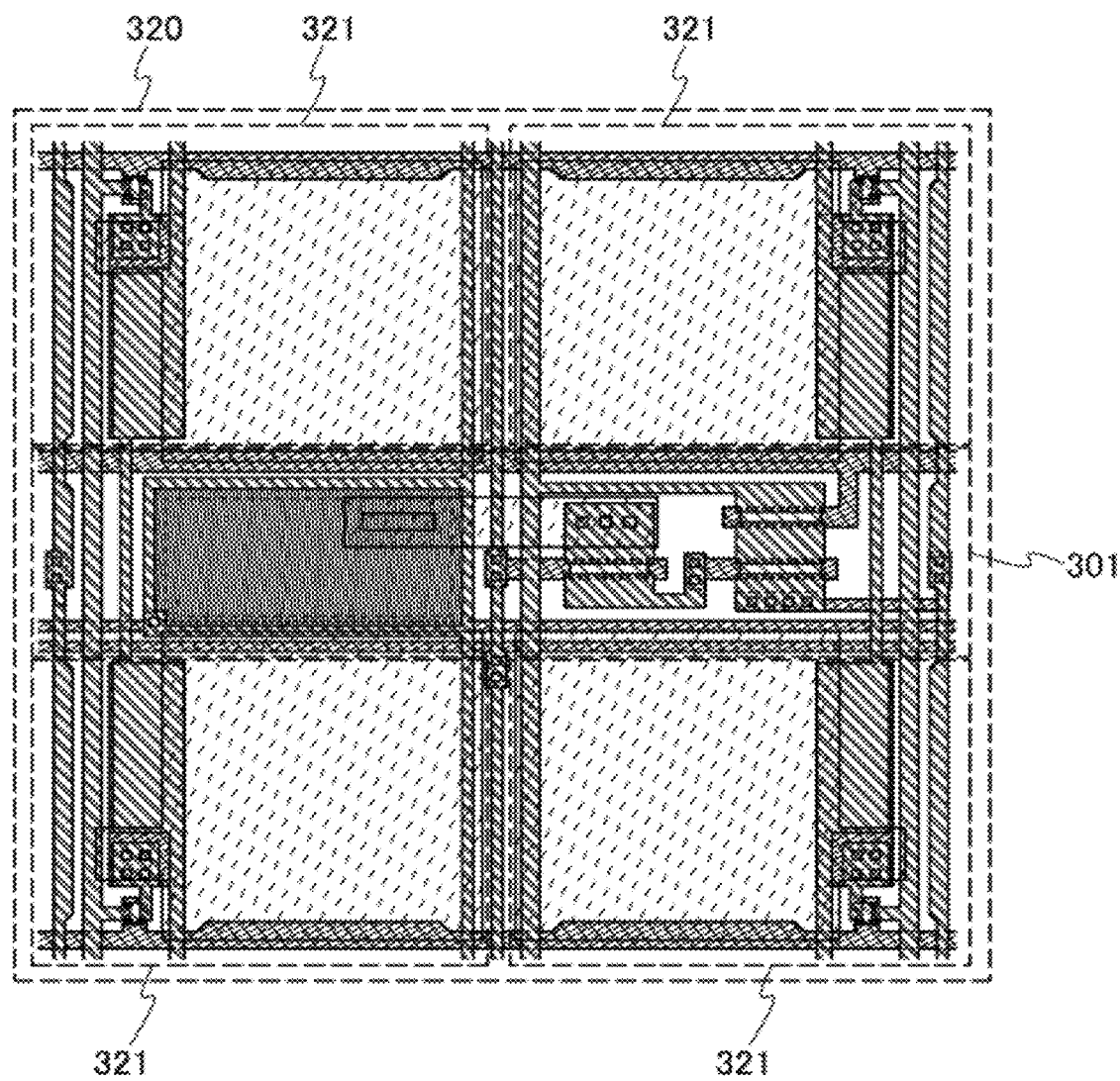
FIG. 12 is a top view of a pixel.

Next, FIG. 12 is an example of a top view of the pixel 320 illustrated in FIG. 11. The pixel 320 illustrated in FIG. 12 includes one photosensor 301 and four display elements 321 as in FIG. 11.

Figure 13:
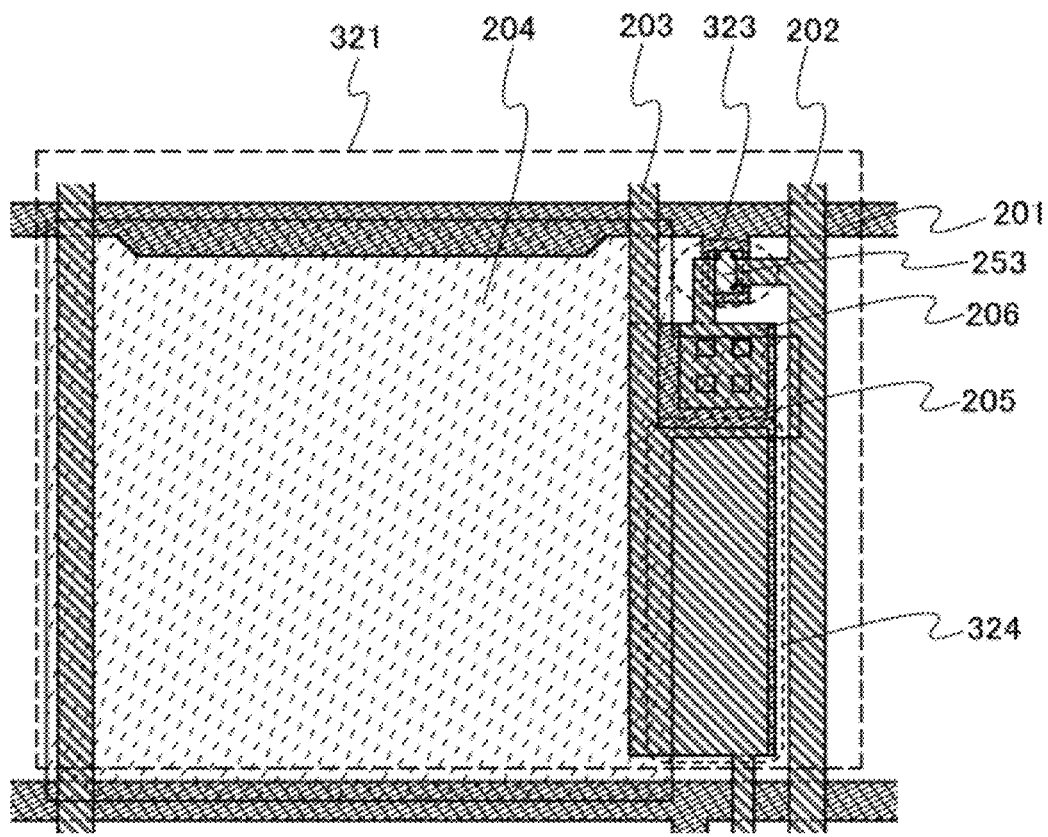
FIG. 13 is a top view of a display element.

FIG. 13 is an enlarged view of one of the display elements 321 illustrated in FIG. 12. The display element 321 includes a conductive film 201 functioning as the scan line GL, a conductive film 202 functioning as the signal line SL, and a conductive film 203 functioning as the wiring COM. The conductive film 201 also functions as the gate electrode of the transistor 323. The conductive film 202 also functions as the first terminal of the transistor 323. The display element 321 further includes a pixel electrode 204, a conductive film 205, and a conductive film 206. The conductive film 206 functions as the second terminal of the transistor 323. The conductive film 206 and the pixel electrode 204 are connected to each other.

The conductive film 206 is connected to the conductive film 205, and a portion where the conductive film 203 functioning as the wiring COM and the conductive film 205 overlap with each other with a gate insulating film provided therebetween functions as the capacitor 324.

Note that various insulating films including the gate insulating film are not illustrated in FIG. 12 and FIG. 13 for clear illustration of a configuration of the various circuit elements such as the wiring, the transistor, and the capacitor.

The conductive film 201 and the conductive film 205 can be formed by processing one conductive film formed over an insulating surface into a desired shape. The gate insulating film is formed over the conductive film 201 and the conductive film 205. Furthermore, the conductive film 202, the conductive film 203, and the conductive film 206 can be formed by processing one conductive film formed over the gate insulating film into a desired shape.

Note that in the case where the transistor 323 is a bottom-gate transistor and an active layer 253 thereof includes an oxide semiconductor, it is preferable to employ a structure in which the active layer 253 is provided over the conductive film 201 functioning as the gate electrode, so as not to extend beyond the conductive film 201 as illustrated in FIG. 13. This configuration can prevent the oxide semiconductor in the active layer 253 from deteriorating due to light incident from the substrate side and can thus prevent deterioration of characteristics such as a shift of the threshold voltage of the transistor 323.

Figure 14:
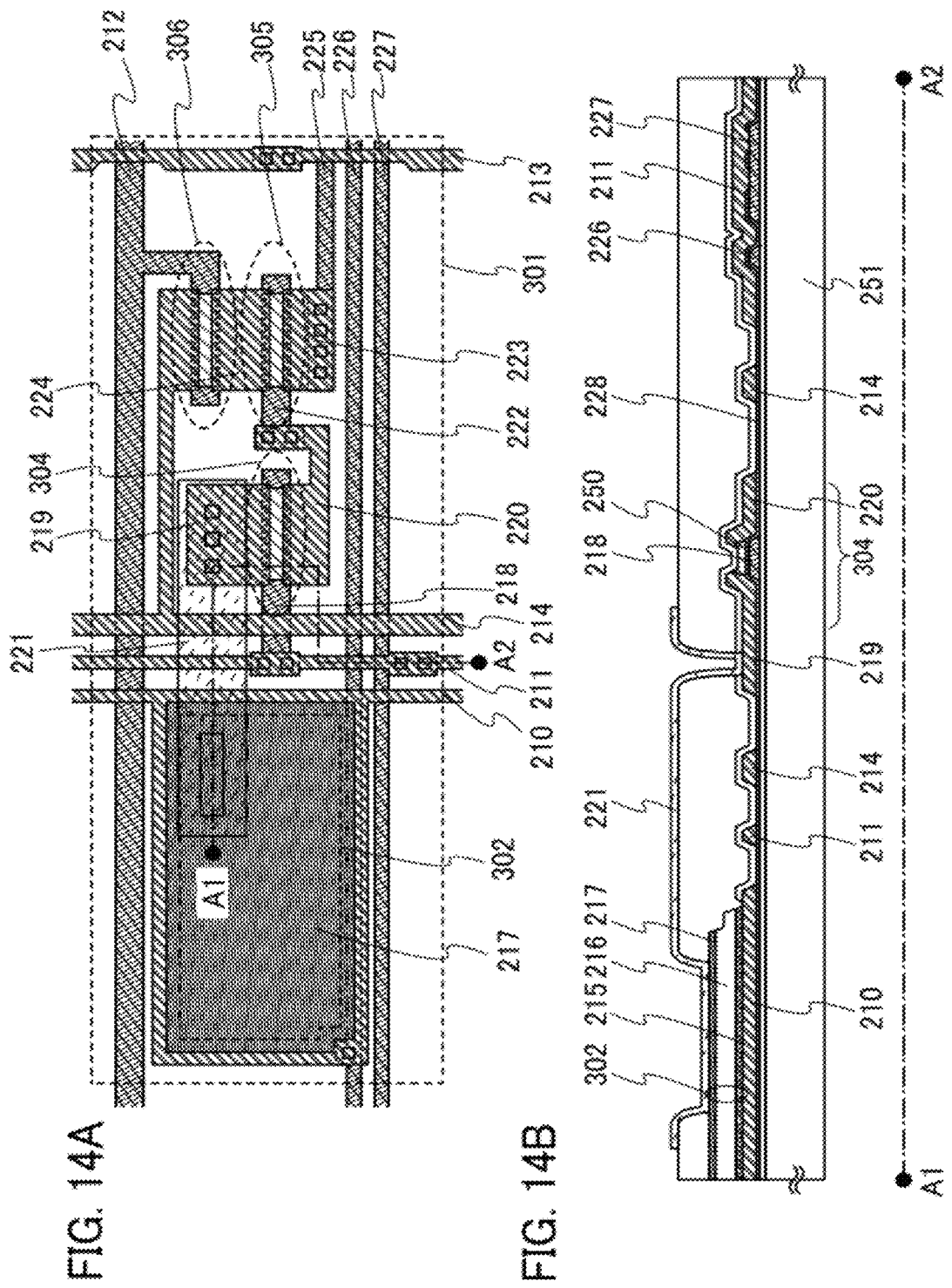
FIG. 14A is a top view of a photosensor.
FIG. 14B is a cross-sectional view thereof.

FIG. 14A is an enlarged view of one of the photosensors 301 illustrated in FIG. 12. FIG. 14B is a cross-sectional view along dashed line A1-A2 of FIG. 14A.

The photosensor 301 includes a conductive film 210 functioning as the wiring PR, a conductive film 211 functioning as the wiring TX, a conductive film 212 functioning as the wiring SE, a conductive film 213 functioning as the wiring VR, and a conductive film 214 functioning as the wiring OUT.

The photodiode 302 included in the photosensor 301 includes a p-type semiconductor film 215, an i-type semiconductor film 216, and an n-type semiconductor film 217 which are sequentially stacked. The conductive film 210 is connected to the p-type semiconductor film 215 functioning as the anode of the photodiode 302.

A conductive film 218 included in the photosensor 301 functions as the gate electrode of the transistor 304 and is connected to the conductive film 211. A conductive film 219 included in the photosensor 301 functions as the first terminal of the transistor 304. A conductive film 220 included in the photosensor 301 functions as the second terminal of the transistor 304. A conductive film 221 included in the photosensor 301 is connected to the n-type semiconductor film 217 and the conductive film 219. A conductive film 222 included in the photosensor 301 functions as the gate electrode of the transistor 305 and is connected to the conductive film 220.

A conductive film 223 included in the photosensor 301 functions as the first terminal of the transistor 305. A conductive film 224 included in the photosensor 301 functions as the second terminal of the transistor 305 and the first terminal of the transistor 306. The conductive film 214 also functions as the second terminal of the transistor 306. The conductive film 212 also functions as the gate electrode of the transistor 306. The conductive film 225 included in the photosensor 301 is connected to the conductive film 223 and the conductive film 213.

Note that in FIGS. 14A and 14B, a conductive film 226 included in the photosensor 301 is connected to the conductive film 210 functioning as the wiring PR. A conductive film 227 included in the photosensor 301 is connected to the conductive film 211 functioning as the wiring TX.

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film formed over the gate insulating film 228 into a desired shape.

Note that the cross-sectional view of the photosensor 301 in FIG. 14B illustrates a state at the time after the steps up to and including the step of forming the conductive film 221 are performed. In the semiconductor display device, the display element 321 as well as the photosensor 301 is provided in the pixel 320; thus, practically, a liquid crystal element is formed after the conductive film 221 is formed.

Note that in the case where the transistor 304 is a bottom-gate transistor and an active layer 250 thereof includes an oxide semiconductor, it is preferable to employ a structure in which the active layer 250 is provided over the conductive film 218 functioning as the gate electrode, so as not to extend beyond the conductive film 218 as illustrated in FIGS. 14A and 14B. This configuration can prevent the oxide semiconductor in the active layer 250 from deteriorating due to light incident from the substrate 251 side and can thus prevent deterioration of characteristics such as a shift of the threshold voltage of the transistor 304. Note that by employing the above configuration for the transistor 305 and the transistor 306, a similar effect can be obtained.

Figure 15:
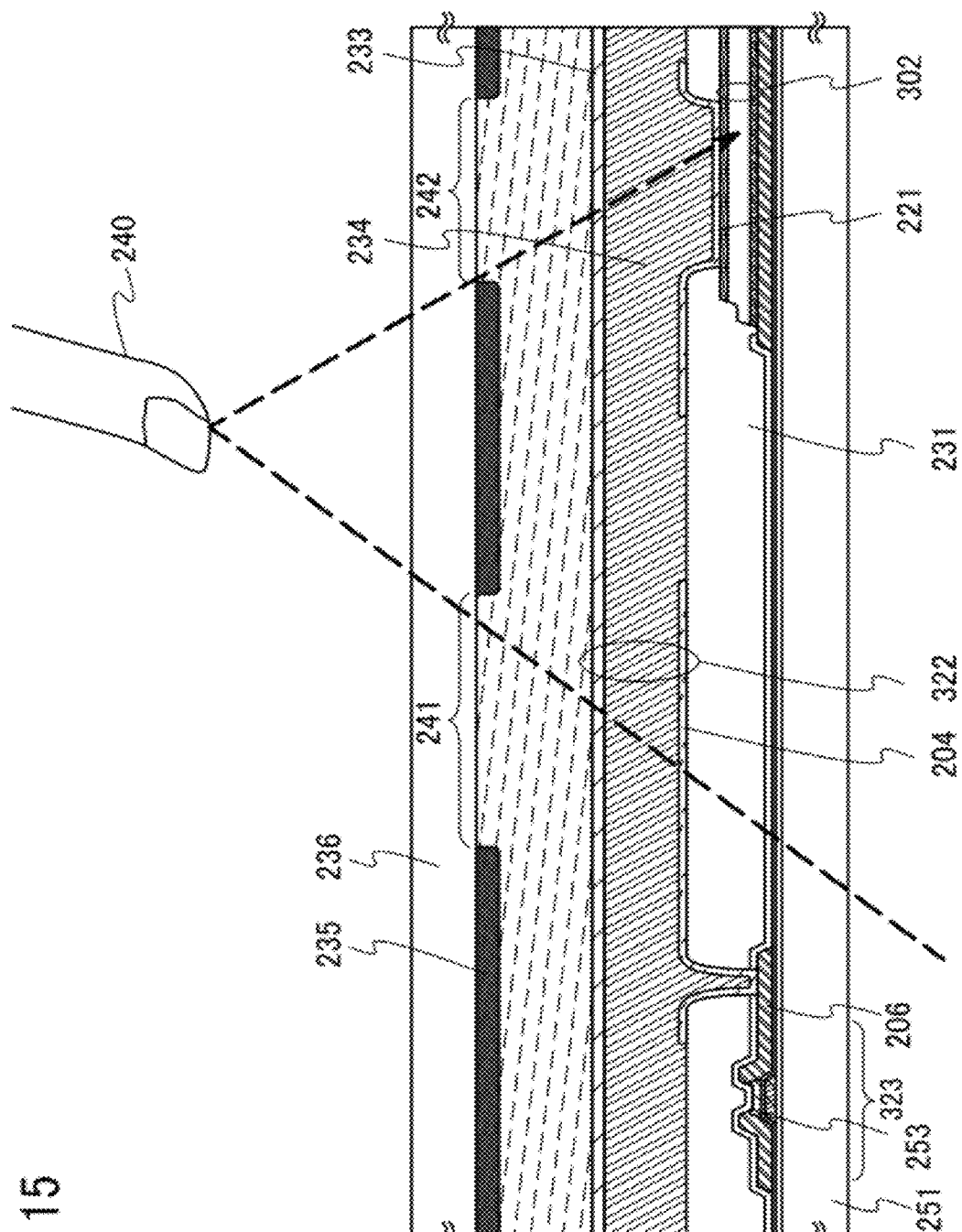
FIG. 15 is a cross-sectional view of a pixel.

FIG. 15 is a cross-sectional view of a pixel, which illustrates the transistor 323 of the display element 321 and the photodiode 302 of the photosensor 301. The conductive film 206 functioning as the second terminal of the transistor 323 is connected to the pixel electrode 204. The conductive film 221 connected to the photodiode 302 and the pixel electrode 204 can be formed by processing one conductive film formed over an insulating film 231 covering the transistor 323 and the photodiode 302 into a desired shape.

A substrate 236 is disposed so as to face a substrate 251 provided with the pixel electrode 204. The substrate 236 is provided with a counter electrode 233, and a liquid crystal layer 234 including liquid crystal is provided between the pixel electrode 204 and the counter electrode 233. The liquid crystal element 322 is formed in a portion where the pixel electrode 204, the counter electrode 233, and the liquid crystal layer 234 overlap with each other.

Note that an alignment film may be provided as appropriate between the pixel electrode 204 and the liquid crystal layer 234 or between the counter electrode 233 and the liquid crystal layer 234. The alignment film can be formed using an organic resin such as polyimide or polyvinyl alcohol. Alignment treatment such as rubbing is performed on the surface in order to align liquid crystal molecules in a certain direction. Rubbing can be performed in such a manner that a roller wrapped with cloth of nylon or the like is rolled while being in contact with the alignment film so that the surface of the alignment film can be rubbed in a certain direction. Note that it is also possible to form the alignment film that has alignment characteristics with the use of an inorganic material such as silicon oxide by an evaporation method, without alignment treatment.

Injection of liquid crystal to form the liquid crystal layer 234 may be performed by a dispenser method (dripping method) or a dipping method (pumping method).

Note that the substrate 236 is provided with a light-blocking film 235 capable of blocking light, in order to prevent a disclination due to disordered orientation of the liquid crystal between pixels, or in order to prevent dispersed light from entering a plurality of adjacent pixels at the same time. An organic resin containing black pigment such as carbon black or low-valent titanium oxide whose oxidation number is smaller than that of titanium dioxide can be used for the light-blocking film 235. Alternatively, a film of chromium can be used for the light-blocking film.

Note that the light-blocking film 235 is preferably provided for not only the display element 321 but also the photosensor 301. By forming the light-blocking film 235, the light-blocking film 235 shields the active layers from light even when the active layers of the transistors included in the display element 321 and the photosensor 301 include oxide semiconductors; accordingly, it is possible to prevent photodegradation of the oxide semiconductors, and it is possible to prevent deterioration of characteristics such as a shift of the threshold voltage of the transistors.

Note that in the case of forming a driver circuit on a panel, by disposing a gate electrode or a light-blocking film to block light also for a transistor used in the driver circuit, deterioration in characteristics such as a shift of the threshold voltage of the transistor can be prevented.

The pixel electrode 204 and the counter electrode 233 can be formed using a light-transmitting conductive material such as indium tin oxide containing silicon oxide (ITSO), a mixture of indium oxide and tin oxide (ITO), zinc oxide (ZnO), indium zinc oxide (IZO), or gallium-doped zinc oxide (GZO), for example.

The following are examples of a liquid crystal material applicable to the liquid crystal layer 234: nematic liquid crystal, cholesteric liquid crystal, smectic liquid crystal, discotic liquid crystal, thermotropic liquid crystal, lyotropic liquid crystal, low-molecular liquid crystal, polymer dispersed liquid crystal (PDLC), ferroelectric liquid crystal, anti-ferroelectric liquid crystal, main-chain liquid crystal, side-chain polymer liquid crystal, and banana-shaped liquid crystal.

Moreover, the following methods can be used for driving the liquid crystal: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

Alternatively, liquid crystal exhibiting a blue phase for which an alignment film is unnecessary may be used for the liquid crystal layer 234. A blue phase is one of liquid crystal phases, which is generated just before a cholesteric phase changes into an isotropic phase while temperature of cholesteric liquid crystal is increased. Since the blue phase is only generated within a narrow range of temperatures, a chiral agent or an ultraviolet curable resin is added so that the temperature range is increased. The liquid crystal composition which includes liquid crystal exhibiting a blue phase and a chiral agent is preferable because it has a small response time of 1 msec or less, has optical isotropy, which makes the alignment process unneeded, and has a small viewing angle dependence.

Note that although the liquid crystal element in which the liquid crystal layer 234 is sandwiched between the pixel electrode 204 and the counter electrode 233 is illustrated in FIG. 15 as an example, a semiconductor display device according to one embodiment of the present invention is not limited to this structure. A pair of electrodes may be formed over one substrate as in an IPS liquid crystal element or a liquid crystal element using a blue phase.

Note that according to one embodiment of the present invention, by controlling the position of an opening formed in the light-blocking film 235, the incident angle and the incident direction of light incident on the photodiode 302 can be selectively set. In FIG. 15, as shown by a dashed line, light from the backlight on the substrate 251 side passes through the liquid crystal element 322, passes through an opening 241 formed in the light-blocking film 235, and then is transmitted through the substrate 236. The light transmitted through the substrate 236 is reflected by a finger which is an object 240 and enters the substrate 236. The light incident on the substrate 236 passes through an opening 242 formed in the light-blocking film 235 and enters the photodiode 302. The incident angle and the incident direction of light incident on the photodiode 302 depend on the position of the opening 242, which is relative to the position of the diode 302.

Note that FIG. 15 is a cross-sectional view of a pixel including a transmissive liquid crystal element 322; however, a semiconductor display device according to one embodiment of the present invention may include a transflective liquid crystal element or a reflective liquid crystal element. In the case of using a reflective liquid crystal element, for the pixel electrode 204, a conductive material which reflects external light, for example, a metal having high visible-light reflectivity, such as aluminum, titanium, silver, rhodium, or nickel, or an alloy containing at least one of the above metals. Note that in the case of using a transflective or reflective liquid crystal element, unlike in the case of FIG. 15, conductive films formed using different materials are processed into desired shapes, so that a conductive film 221 and a pixel electrode 204 are formed.

Note that in the case where a reflective liquid crystal element is used and an object is a light source which emits light, a backlight is not necessary. However, in the case where a reflective liquid crystal element is used and an object does not emit light, a backlight is preferably provided.

Figure 16:
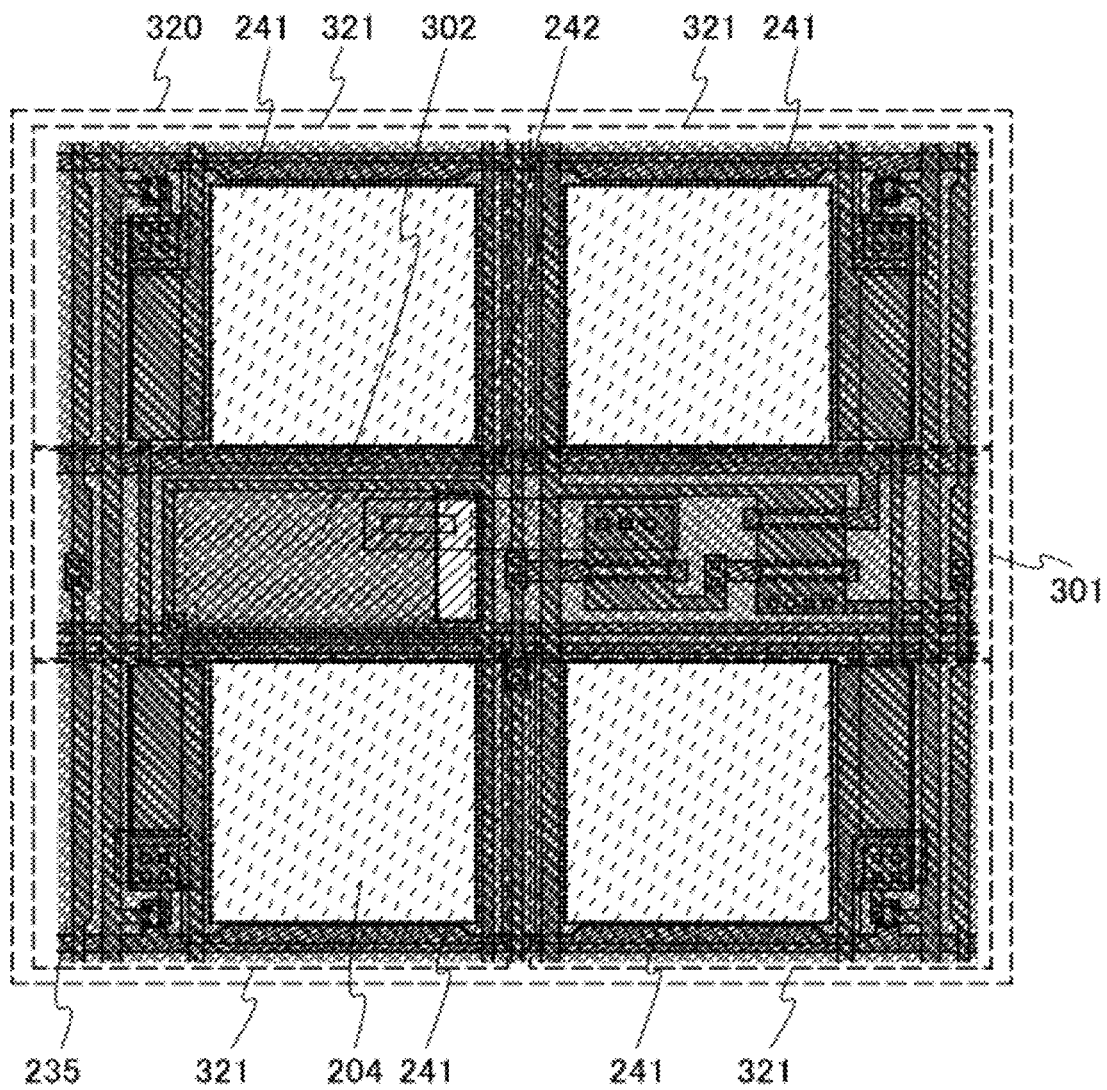
FIG. 16 is a top view of a pixel.

FIG. 16 illustrates a state where the light-blocking film 235 is provided over the pixel 320 in FIG. 12. In FIG. 16, the light-blocking film 235 has the openings 241 so as to overlap with the pixel electrode 204 of the display element 321 and has the opening 242 so as to overlap with the photodiode 302 of the photosensor 301. The position of the opening 242 relative to the position of the photodiode 302 may be determined depending on the value of the incident angle and the incident direction of light incident on the photodiode 302. For example, the opening 242 is formed so as to overlap with the photodiode 302 as in FIG. 16, whereby the incident angle of light can be set to 0°.

In an actual case, there are a range in value of the incident angle of light incident on the photodiode 302 and a range in incident direction of light incident on the photodiode 302. In one embodiment of the present invention, it is necessary to control the incident angle and the incident direction of most intense light by the position of the opening 242 relative to the position of the photodiode 302.

Next, the positional relation between openings formed in the light-blocking film and photodiodes will be described in detail with reference to FIGS. 17A and 17B, FIG. 18, and FIG. 19.

FIG. 17A is a top view illustrating a state where first photodiodes $PD_{R0}$ to $PD_{R5}$ included in the plurality of the first photosensors and second photodiodes $PD_{L0}$ to $PD_{L5}$ included in the plurality of second photosensors are alternately arranged. Specifically, in FIG. 17A, the first photodiodes and the second photodiodes are arranged from the left side of the drawing in the following order: $PD_{R0}$, $PD_{L5}$, $PD_{R1}$, $PD_{L4}$, ..., $PD_{R4}$, $PD_{L1}$, $PD_{R5}$, and $PD_{L0}$.

Being part of the photosensor, the photodiode is actually provided together with various transistors included in the photosensor; however, in FIG. 17A, semiconductor elements except for the photodiode are omitted in order to clarify the position of the photodiode.

Further, in FIG. 17A, a light-blocking film 350 in which openings are formed is provided so as to overlap with the first photodiodes $PD_{R0}$ to $PD_{R5}$ and the second photodiodes $PD_{L0}$ to $PD_{L5}$. The incident angles and the incident directions of light incident on the first photodiodes $PD_{R0}$ to $PD_{R5}$ and the second photodiodes $PD_{L0}$ to $PD_{L5}$ depend on the positional relation between the openings in the light-blocking film 350 and the first and second photodiodes $PD_{R0}$ to $PD_{R5}$ and $PD_{L0}$ to $PD_{L5}$.

In FIGS. 17A and 17B, the first incident direction corresponds to the direction from the right side to the left side of the drawing, and the second incident direction corresponds to the direction from the left side to the right side of the drawing.

FIG. 17B is a cross-sectional view along dashed line A1-A2 in FIG. 17A. As in FIG. 17B, as the values of the incident angles $\alpha_{R0}$ to $\alpha_{R5}$ of light incident on the first photodiodes $PD_{R0}$ to $PD_{R5}$ increase, the positions of the openings $351_{R0}$ to $351_{R5}$ that are light paths recede from the first photodiodes $PD_{R0}$ to $PD_{R5}$ and are closer to the first incident direction side. Further, as the values of the incident angles $\alpha_{L0}$ to $\alpha_{L5}$ of light incident on the second photodiodes $PD_{L0}$ to $PD_{L5}$ increase, the positions of the openings $351_{L0}$ to $351_{L5}$ that are light paths recede from the second photodiodes $PD_{L0}$ to $PD_{L5}$ and are closer to the second incident direction side.

FIGS. 17A and 17B illustrate as an example the case where the first photodiodes and the second photodiodes are arranged in one line; however, the first photodiodes and the second photodiodes may be arranged in different lines.

FIG. 18 is a top view illustrating a state where first photodiodes $PD_R$'s included in the plurality of the first photosensors and second photodiodes $PD_L$'s included in the plurality of second photosensors are arranged in different lines. In FIG. 18, the light-blocking film 350 in which openings are formed is provided so as to overlap with the plurality of first photodiodes $PD_R$'s and the plurality of second photodiodes $PD_L$'s. Further, in FIG. 18, the first incident direction corresponds to the direction from the right side to the left side of the drawing, and the second incident direction corresponds to the direction from the left side to the right side of the drawing.

Note that although the plurality of first photodiodes $PD_R$'s is arranged in one line along the first incident direction in FIG. 18, the plurality of first photodiodes $PD_R$'s may be arranged in one line along a direction different from the first incident direction. Similarly, although the plurality of second photodiodes $PD_L$'s is arranged in one line along the second incident direction in FIG. 18, the plurality of second photodiodes $PD_L$'s may be arranged in one line along a direction different from the second incident direction.

FIGS. 17A and 17B and FIG. 18 illustrate as examples the cases using the first photodiodes and the second photodiodes on which light is incident from different incident directions; however, one embodiment of the present invention is not limited to this structure. In one embodiment of the present invention, three or more photodiodes on which light is incident from different incident directions may be used.

FIG. 19 is a top view illustrating a state where the plurality of first photodiodes $PD_R$'s included in the plurality of the first photosensors, the plurality of second photodiodes $PD_L$'s included in the plurality of second photosensors, a plurality of third photodiodes $PD_U$'s included in a plurality of the third photosensors, a plurality of fourth photodiodes $PD_D$'s included in a plurality of fourth photosensors are arranged.

In FIG. 19, the light-blocking film 350 in which openings are formed is provided so as to overlap with the plurality of first photodiodes PD$_R$'s, the plurality of second photodiodes PD$_L$'s, the plurality of third photodiodes PD$_U$'s, and the plurality of fourth photodiodes PD$_D$'s. Further, in FIG. 19, the first incident direction corresponds to the direction from the right side to the left side, the second incident direction corresponds to the direction from the left side to the right side of the drawing, a third incident direction corresponds to the direction from the top to the bottom of the drawing, and a fourth incident direction corresponds to the direction from the bottom to the top of the drawing.

When three or more photodiodes on which light is incident from different incident directions are used, high accuracy of the positional data of an object can be achieved as compared to the case of using two photodiodes on which light is incident from different incident directions.

Note that a solid-state image sensing device or a semiconductor display device, according to one embodiment of the present invention, includes in its scope a panel where a pixel portion is formed between a pair of substrates, and a module in which an IC including a driver circuit, a controller, a CPU, a memory, or the like and a backlight are mounted on the panel. A driver circuit may be formed on the panel.

Embodiment 3

In this embodiment, the photosensor 301 having a circuit configuration different from that in FIG. 7A will be described.

Figure 20A:
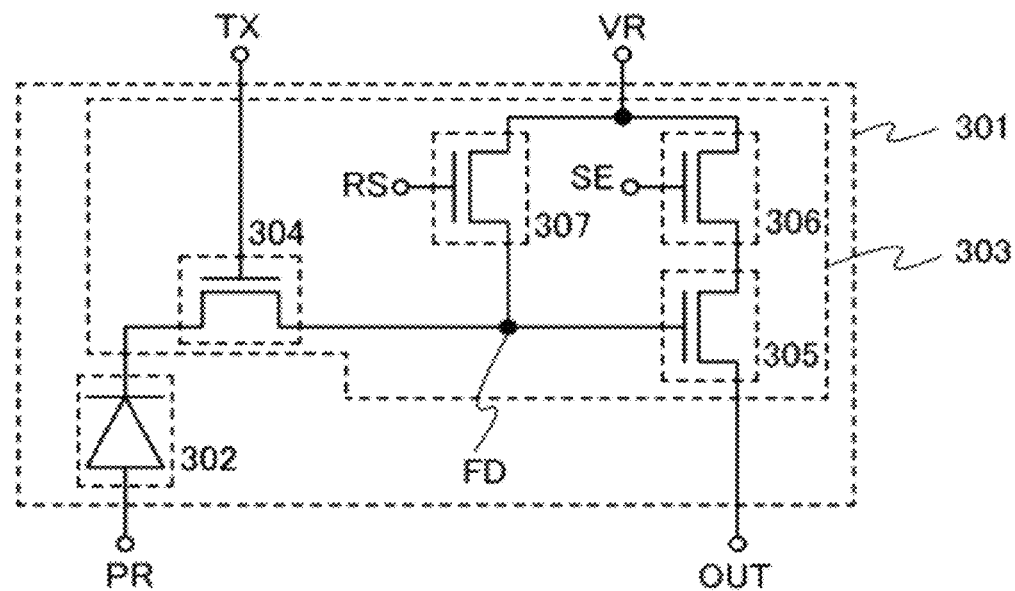
FIGS. 20A and 20B are circuit diagrams of photosensors.

FIG. 20A is a circuit diagram of an example of the photosensor 301. In the photosensor 301 illustrated in FIG. 20A, the amplifier circuit 303 includes a transistor 304, a transistor 305, a transistor 306, and a transistor 307. The transistor 304 controls the supply of current generated in the photodiode 302 to the amplifier circuit 303. In the transistor 305, the current value or resistance value between a first terminal and a second terminal thereof depends on a potential supplied to the second terminal of the transistor 304. The transistor 306 functions as a switching element for supplying a potential of an output signal determined by the current value or resistance value, to the wiring OUT. The transistor 307 functions to reset the amount of electric charge accumulated in the amplifier circuit 303.

Specifically, in FIG. 20A, a first terminal of the transistor 304 is connected to the cathode of the photodiode 302, and a second terminal of the transistor 304 is connected to the gate electrode of the transistor 305 and a first terminal of the transistor 307. The first terminal of the transistor 305 and a second terminal of the transistor 307 are connected to the wiring VR which is supplied with the high-level power supply potential VDD. A gate electrode of the transistor 307 is connected to a wiring RS, and the wiring RS is supplied with a potential of a signal for controlling the switching of the transistor 307. The second terminal of the transistor 305 is connected to the first terminal of the transistor 306. The second terminal of the transistor 306 is connected to the wiring OUT. The gate electrode of the transistor 306 is connected to the wiring SE, and the wiring SE is supplied with a potential of a signal for controlling the switching of the transistor 306.

In FIG. 20A, a node where the second terminal of the transistor 304, the first terminal of the transistor 307, and the gate electrode of the transistor 305 are connected to one another is denoted by the node FD. The potential of the output signal depends on the amount of electric charge accumulated at the node FD. In order to hold electric charge at the node FD more reliably, a capacitor may be connected to the node FD.

Figure 21:
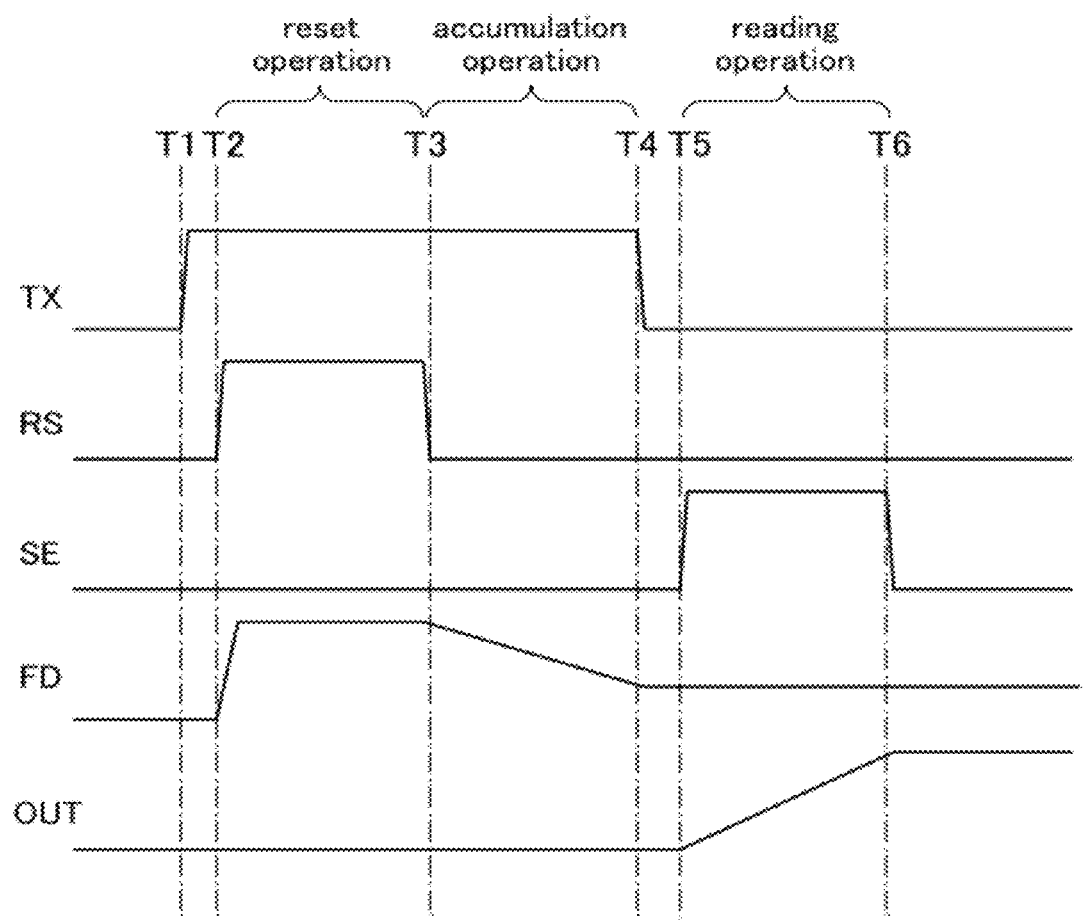
FIG. 21 is a timing chart of a photosensor.

Next, an example of operation of the photosensor 301 in FIG. 20A will be described. FIG. 21 is an example of a timing chart of various potentials supplied to the photosensor 301 in FIG. 20A.

Note that in the timing chart in FIG. 21, for easy understanding of the operation of the photosensor 301, it is assumed that the wiring TX, the wiring SE, and the wiring RS are supplied with a high-level potential and a low-level potential. Specifically, it is assumed that the wiring TX is supplied with the high-level potential HTX and the low-level potential LTX; the wiring SE, the high-level potential HSE and the low-level potential LSE; and the wiring RS, a high-level potential HRS and a low-level potential LRS. The wiring PR is supplied with a low-level power supply potential VSS.

First, at the time T1, the potential of the wiring TX is changed from the potential LTX to the potential HTX. When the potential of the wiring TX is changed to the potential HTX, the transistor 304 is turned on. Note that at the time T1, the wiring SE is supplied with the potential LSE, and the wiring RS is supplied with the potential LRS.

Next, at the time T2, the potential of the wiring RS is changed from the potential LRS to the potential HRS. When the potential of the wiring RS is changed to the potential HRS, the transistor 307 is turned on. At the time T2, the potential of the wiring TX remains at the potential HTX, and the potential of the wiring SE remains at the potential LSE. Accordingly, the node FD is supplied with the power supply potential VDD; thus, the amount of electric charge held at the node FD is reset. A reverse bias voltage is applied to the photodiode 302.

Then, at the time T3, the potential of the wiring RS is changed from the potential HRS to the potential LRS. Until shortly before the time T3, the potential of the node FD remains at the power supply potential VDD. Thus, even after the potential of the wiring RS is changed to the potential LRS, a reverse bias voltage continues to be applied to the photodiode 302. Then, when light enters the photodiode 302 in that state, current flows from the cathode of the photodiode 302 toward the anode thereof. The value of the current varies according to the intensity of light. In other words, as the intensity of light entering the photodiode 302 increases, the value of the current increases and the amount of electric charge leaking from the node FD also increases. Conversely, as the intensity of light entering the photodiode 302 decreases, the value of the current decreases and the amount of electric charge leaking from the node FD also decreases. Thus, as the intensity of light is higher, the amount of change in potential of the node FD increases, and as the intensity of light is lower, the amount of change decreases.

Then, at the time T4, when the potential of the wiring TX is changed from the potential HTX to the potential LTX, the transistor 304 is turned off. Accordingly, the transfer of electric charge from the node FD to the photodiode 302 is stopped and thus the potential of the node FD is determined.

Next, at the time T5, when the potential of the wiring SE is changed from the potential LSE to the potential HSE, the transistor 306 is turned on. Then, according to the potential of the node FD, electric charge is transferred from the wiring VR to the wiring OUT.

Next, at the time T6, when the potential of the wiring SE is changed from the potential HSE to the potential LSE, the transfer of electric charge from the wiring VR to the wiring OUT is stopped and thus the potential of the wiring OUT is determined. The potential of the wiring OUT corresponds to the potential of the output signal of the photosensor 301. The potential of the output signal includes the positional data of a taken image of an object.

The series of operations described above can be classified into reset operation, accumulation operation, and reading operation. That is to say, operation from the time T1 to the time T3 corresponds to the reset operation; operation from the time T3 to the time T4, the accumulation operation; and operation from the time T5 to the time T6, the reading operation. By performing the reset operation, the accumulation operation, and the reading operation, positional data can be obtained.

Next, the photosensor 301 having a connection configuration different from those in FIG. 2A and FIG. 20A will be described.

Figure 20B:
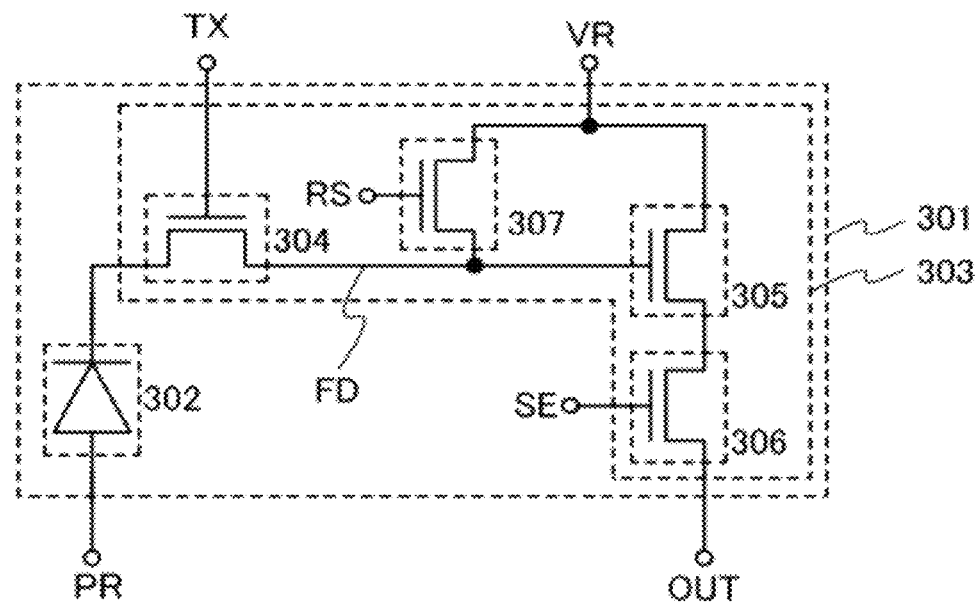

FIG. 20B is a circuit diagram of an example of the photosensor 301. In the photosensor 301 illustrated in FIG. 20B, the amplifier circuit 303 includes the transistor 304, the transistor 305, the transistor 306, and the transistor 307. The transistor 304 controls the supply of current generated in the photodiode 302 to the amplifier circuit 303. In the transistor 305, the current value or resistance value between the first terminal and the second terminal thereof depends on a potential supplied to the second terminal of the transistor 304. The transistor 306 functions as a switching element for supplying a potential of an output signal determined by the current value or resistance value, to the wiring OUT. The transistor 307 functions to reset the amount of electric charge accumulated in the amplifier circuit 303.

Specifically, in FIG. 20B, the first terminal of the transistor 304 is connected to the cathode of the photodiode 302, and the second terminal of the transistor 304 is connected to the gate electrode of the transistor 305 and the first terminal of the transistor 307. The first terminal of the transistor 305 is connected to the second terminal of the transistor 306, and the second terminal of the transistor 305 is connected to the wiring OUT. The first terminal of the transistor 306 and the second terminal of the transistor 307 are connected to the wiring VR which is supplied with the high-level power supply potential VDD. The gate electrode of the transistor 307 is connected to the wiring RS, and the wiring RS is supplied with a potential of a signal for controlling the switching of the transistor 307. The gate electrode of the transistor 306 is connected to the wiring SE, and the wiring SE is supplied with a potential of a signal for controlling the switching of the transistor 306.

In FIG. 20B, a node at which the second terminal of the transistor 304, the first terminal of the transistor 307, and the gate electrode of the transistor 305 are connected to one another is denoted by the node FD. The potential of the output signal depends on the amount of electric charge accumulated at the node FD. In order to hold electric charge at the node FD more reliably, a capacitor may be connected to the node FD.

For operation of the photosensor 301 in FIG. 20B, the timing chart in FIG. 21 can be referred to.

Note that in FIG. 20A or 20B, for active layers of the transistors 304, 305, 306, and 307 included in the amplifier circuit 303, oxide semiconductors or the following semiconductors other than oxide semiconductors may be used: amorphous silicon, microcrystalline silicon, polycrystalline silicon, single crystal silicon, amorphous germanium, microcrystalline germanium, polycrystalline germanium, single crystal germanium, or the like. With the use of semiconductors including the same materials for the active layers of all the transistors in the photosensor 301, a manufacturing process can be simplified. When an oxide semiconductor is used for the active layer of the transistor 304, the off-state current of the transistor 304 can be significantly reduced. The transistor 304 functions as a switching element for holding electric charge accumulated in the photosensor 301; thus, leakage of the electric charge in an electric charge holding period can be suppressed. With the use of a semiconductor material capable of providing higher mobility than an oxide semiconductor, such as polycrystalline silicon or single crystal silicon, for the active layers of the transistor 305, the transistor 306, and the transistor 307, positional data can be read from the photosensor 301 at high speed.

Note that the photosensors 301 in FIGS. 20A and 20B can be operated either by a rolling shutter system or a global shutter system.

Next, the photosensor 301 having a circuit configuration different from those in FIG. 2A and FIGS. 20A and 20B will be described.

Figure 22A:
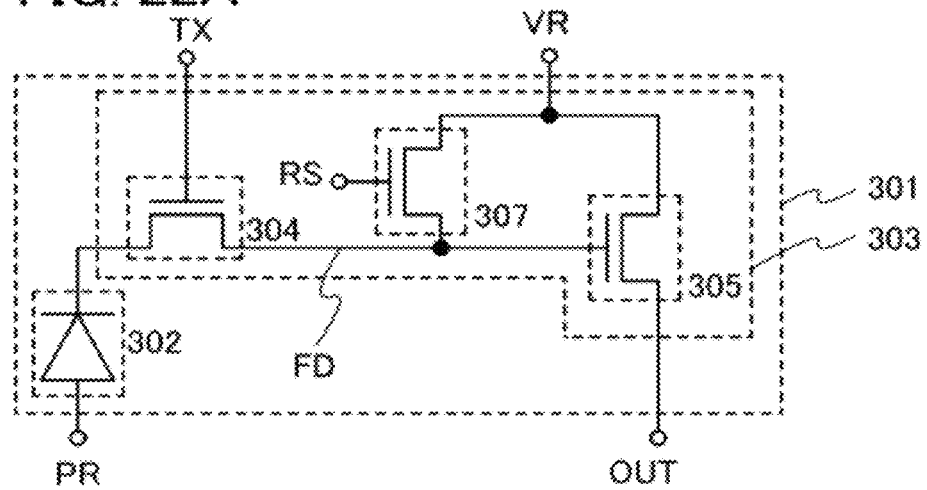
FIGS. 22A to 22C are circuit diagrams of photosensors.

FIG. 22A is a circuit diagram of an example of the photosensor 301. In the photosensor 301 illustrated in FIG. 22A, the amplifier circuit 303 includes the transistor 304, the transistor 305, and the transistor 307. The transistor 304 controls the supply of current generated in the photodiode 302 to the amplifier circuit 303. In the transistor 305, the current value or resistance value between the first terminal and the second terminal thereof depends on a potential supplied to the second terminal of the transistor 304. The transistor 307 functions to reset the amount of electric charge accumulated in the amplifier circuit 303.

Specifically, in FIG. 22A, the first terminal of the transistor 304 is connected to the cathode of the photodiode 302, and the second terminal of the transistor 304 is connected to the gate electrode of the transistor 305 and the first terminal of the transistor 307. The first terminal of the transistor 305 and the second terminal of the transistor 307 are connected to the wiring VR which is supplied with the high-level power supply potential VDD. The gate electrode of the transistor 307 is connected to the wiring RS, and the wiring RS is supplied with a potential of a signal for controlling the switching of the transistor 307. The second terminal of the transistor 305 is connected to the wiring OUT.

In FIG. 22A, a node where the second terminal of the transistor 304, the first terminal of the transistor 307, and the gate electrode of the transistor 305 are connected to one another is denoted by the node FD. The potential of the output signal depends on the amount of electric charge accumulated at the node FD. In order to hold electric charge at the node FD more reliably, a capacitor may be connected to the node FD.

Next, the photosensor 301 having a circuit configuration different from those in FIG. 2A, FIGS. 20A and 20B, and FIG. 22A will be described.

Figure 22B:
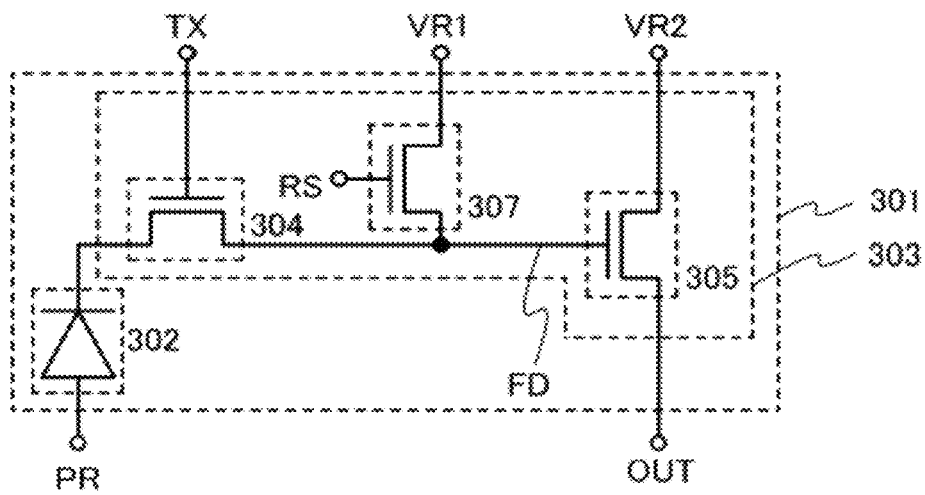

FIG. 22B is a circuit diagram of an example of the photosensor 301. In the photosensor 301 illustrated in FIG. 22B, the amplifier circuit 303 includes the transistor 304, the transistor 305, and the transistor 307. The transistor 304 controls the supply of current generated in the photodiode 302 to the amplifier circuit 303. In the transistor 305, the current value or resistance value between the first terminal and the second terminal thereof depends on a potential supplied to the second terminal of the transistor 304. The transistor 307 functions to reset the amount of electric charge accumulated in the amplifier circuit 303.

Specifically, in FIG. 22B, the first terminal of the transistor 304 is connected to the cathode of the photodiode 302, and the second terminal of the transistor 304 is connected to the gate electrode of the transistor 305 and the first terminal of the transistor 307. The second terminal of the transistor 307 is connected to a wiring VR1 which is supplied with a high-level power supply potential VDD1. The first terminal of the transistor 305 is connected to a wiring VR2 which is supplied with a high-level power supply potential VDD2. The gate electrode of the transistor 307 is connected to the wiring RS, and the wiring RS is supplied with a potential of a signal for controlling the switching of the transistor 307. The second terminal of the transistor 305 is connected to the wiring OUT.

In FIG. 22B, a node where the second terminal of the transistor 304, the first terminal of the transistor 307, and the gate electrode of the transistor 305 are connected to one another is denoted by the node FD. The potential of the output signal depends on the amount of electric charge accumulated at the node FD. In order to hold electric charge at the node FD more reliably, a capacitor may be connected to the node FD.

Next, the photosensor 301 having a circuit configuration different from those in FIG. 2A, FIGS. 20A and 20B, and FIGS. 22A and 22B will be described.

Figure 22C:
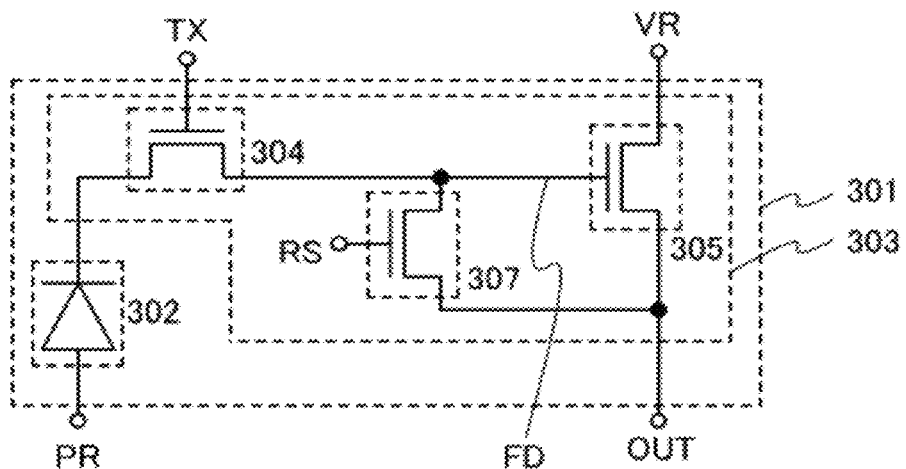

FIG. 22C is a circuit diagram of an example of the photosensor 301. In the photosensor 301 illustrated in FIG. 22C, the amplifier circuit 303 includes the transistor 304, the transistor 305, and the transistor 307. The transistor 304 controls the supply of current generated in the photodiode 302 to the amplifier circuit 303. In the transistor 305, the current value or resistance value between the first terminal and the second terminal thereof depends on a potential supplied to the second terminal of the transistor 304. The transistor 307 functions to reset the amount of electric charge accumulated in the amplifier circuit 303.

Specifically, in FIG. 22C, the first terminal of the transistor 304 is connected to the cathode of the photodiode 302, and the second terminal of the transistor 304 is connected to the gate electrode of the transistor 305 and the first terminal of the transistor 307. The first terminal of the transistor 305 is connected to the wiring VR which is supplied with the high-level power supply potential VDD. The gate electrode of the transistor 307 is connected to the wiring RS, and the wiring RS is supplied with a potential of a signal for controlling the switching of the transistor 307. The second terminal of the transistor 307 and the second terminal of the transistor 305 are connected to the wiring OUT.

In FIG. 22C, a node at which the second terminal of the transistor 304, the first terminal of the transistor 307, and the gate electrode of the transistor 305 are connected to one another is denoted by the node FD. The potential of the output signal depends on the amount of electric charge accumulated at the node FD. In order to hold electric charge at the node FD more reliably, a capacitor may be connected to the node FD.

Note that the photosensors 301 in FIGS. 22A to 22C can be operated by a rolling shutter system.

This embodiment can be implemented in combination with any of the other embodiments.

Embodiment 4

In this embodiment, a method for manufacturing a solid-state image sensing device or a semiconductor display device, according to one embodiment of the present invention, which has a transistor including silicon and a transistor including an oxide semiconductor, will be described.

Note that in one embodiment of the present invention, for a transistor included in an amplifier circuit, an oxide semiconductor or a general semiconductor such as germanium, silicon, silicon germanium, or single crystal silicon carbide may be used. For example, a transistor including silicon can be formed using a single crystal semiconductor substrate such as a silicon wafer, a silicon thin film which is formed by an SOI method, a silicon thin film which is formed by a vapor deposition method, or the like.

Figure 23A:
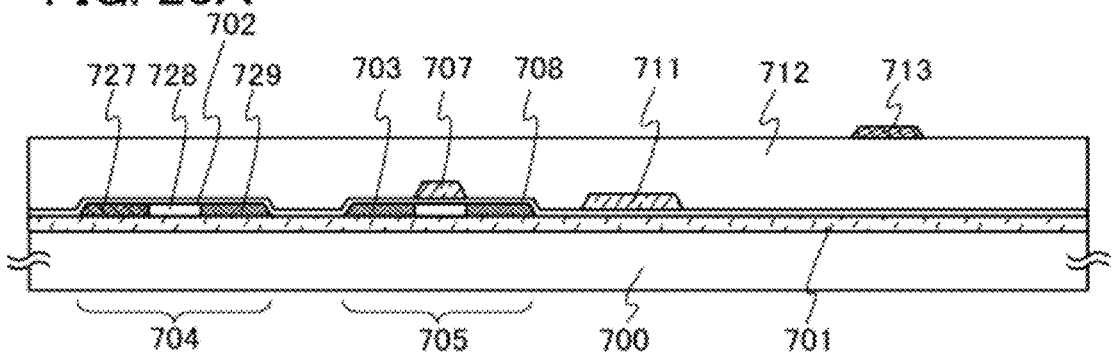
FIGS. 23A to 23C are cross-sectional views illustrating a method for manufacturing a solid-state image sensing device or a semiconductor display device.

First, as illustrated in FIG. 23A, a photodiode 704 and an n-channel transistor 705 are formed over an insulating surface of a substrate 700 by a known CMOS manufacturing method.

In this embodiment, the case where the photodiode 704 and the n-channel transistor 705 are formed with a single crystal semiconductor film which is separated from a single crystal semiconductor substrate is given as an example.

A specific example of a manufacturing method of the single crystal semiconductor film will be briefly described. First, an ion beam including ions which are accelerated by an electric field is delivered to the single crystal semiconductor substrate and a fragile layer which is weakened by local disorder of the crystal structure is formed in a region at a certain depth from the surface of the semiconductor substrate. The depth at which the fragile layer is formed can be adjusted by the acceleration energy and the incident angle of the ion beam. Then, the semiconductor substrate and the substrate 700 over which an insulating film 701 is formed are attached to each other so that the insulating film 701 is provided therebetween. The attachment is performed as follows. After the semiconductor substrate and the substrate 700 are overlapped with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the semiconductor substrate and the substrate 700. When the pressure is applied to a portion, bonding between the semiconductor substrate and the insulating film 701 starts from the portion, and resultingly, the bonding processes in the entire surface where the semiconductor substrate and the insulating film 701 are in contact with each other. Subsequently, heat treatment is performed, whereby microvoids that exist in the fragile layer are expanded and the microvoids are combined with each other. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701, and the n-channel transistor 705 is formed using the island-shaped semiconductor film 703 over the insulating film 701. The photodiode 704 is a lateral junction type in which the island-shaped semiconductor film 702 includes a region 727 having p-type conductivity, a region 728 having i-type conductivity, and a region 729 having n-type conductivity. The n-channel transistor 705 includes a gate electrode 707. In addition, the n-channel transistor 705 includes an insulating film 708 between the island-shaped semiconductor film 703 and the gate electrode 707.

Note that the region 728 having i-type conductivity refers to a region of the semiconductor film, which contains an impurity imparting p-type or n-type conductivity at a concentration of $1 \times 10^{20}$ cm$^{-3}$ or less and has photoconductivity 100 or more times as high as dark conductivity. The region 728 having i-type conductivity includes, in its category, that containing an impurity element belonging to Group 13 or Group 15 of the periodic table. That is, since an i-type semiconductor has weak n-type electric conductivity when an impurity element for controlling valence electrons is not added intentionally, the region 728 having i-type conductivity includes, in its category, that to which an impurity element imparting p-type conductivity is added intentionally or unintentionally during film formation or after the film formation.

Although there is no particular limitation on a material which can be used for the substrate 700, when a transmissive or a transflective liquid crystal element is used, a light transmitting material is used for the substrate 700. It is necessary that a material which can be used for the substrate 700 has at least enough heat resistance to heat treatment performed later. For example, a glass substrate manufactured by a fusion process or a float process, a quartz substrate, a ceramic substrate, or the like can be used as the substrate 700. In the case where a glass substrate is used and the temperature at which the heat treatment is to be performed later is high, a glass substrate whose strain point is greater than or equal to 730° C. is preferably used. Alternatively, in the case where a reflective liquid crystal element is used and a backlight is not used, a metal substrate such as a stainless-steel substrate, which has a surface provided with an insulating film, or a silicon substrate which has a surface provided with an insulating film may be used. Although a substrate formed of a flexible synthetic resin such as plastic generally tends to have a lower resistance temperature than the aforementioned substrates, such a substrate can be used as long as it is resistant to a processing temperature during a manufacturing process.

Note that although the case where the photodiode 704 and the n-channel transistor 705 are formed using a single crystal semiconductor film is described as an example in this embodiment, the present invention is not limited to this structure. For example, a polycrystalline or microcrystalline semiconductor film which is formed over the insulating film 701 by a vapor deposition method may be used. Alternatively, the above semiconductor film may be formed by crystallization with a known technique. As the known technique of crystallization, a laser crystallization method using a laser beam and a crystallization method using a catalytic element are given. Alternatively, a crystallization method using a catalytic element and a laser crystallization method may be used in combination. When a highly-heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method in which the temperature is approximately 950° C.

In FIG. 23A, after a conductive film is formed over the insulating film 708, the conductive film is processed into a desired shape by etching or the like, whereby a wiring 711 is formed together with the gate electrode 707.

Next, as illustrated in FIG. 23A, an insulating film 712 is formed so as to cover the photodiode 704, the n-channel transistor 705, and the wiring 711. Note that although the case where a single-layer insulation film is used as the insulating film 712 is shown as an example in this embodiment, the insulating film 712 is not necessarily a single-layer insulating film and a stack of two or more insulating films may be used as the insulating film 712.

The insulating film 712 is formed using a material which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 712.

Note that in this specification, an oxynitride refers to a material in which the amount of oxygen is larger than that of nitrogen, and a nitride oxide refers to a material in which the amount of nitrogen is larger than that of oxygen.

The insulating film 712 may have a surface planarized by a CMP method or the like.

Next, as illustrated in FIG. 23A, a gate electrode 713 is formed over the insulating film 712.

The gate electrode 713 can be formed to have a single-layer structure or a layered structure using one or more conductive films containing a metal material such as molybdenum, titanium, chromium, tantalum, tungsten, neodymium, or scandium or an alloy material which contains any of these metal materials as a main component, or a nitride of any of these metals. Note that aluminum or copper may be used as such a metal material if aluminum or copper can withstand the temperature of heat treatment to be performed in a later step. Aluminum or copper is preferably combined with a refractory metal material so as to prevent problems with heat resistance and corrosion. As the refractory metal material, molybdenum, titanium, chromium, tantalum, tungsten, neodymium, scandium, or the like can be used.

For example, as a two-layer structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713, the following structure is preferable: a layered structure where an aluminum film, an alloy film of aluminum and silicon, an alloy film of aluminum and titanium, or an alloy film of aluminum and neodymium as an intermediate layer is sandwiched between two films as a top layer and a bottom layer, which are selected from a tungsten film, a tungsten nitride film, a titanium nitride film, and a titanium film.

Further, a light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like may be used as the gate electrode 713.

The thickness of the gate electrode 713 is in the range of 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 713 is formed. Note that the formed gate electrode preferably has a tapered end portion because coverage with a gate insulating film stacked thereover is improved. Note that a resist mask may be formed by an inkjet method. Formation of the resist mask by an inkjet method needs no photomask; thus, manufacturing cost can be reduced.

Figure 23B:
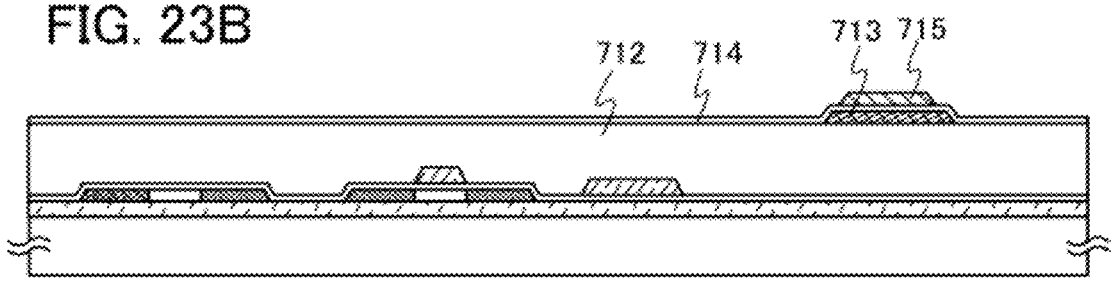

Next, as illustrated in FIG. 23B, a gate insulating film 714 is formed over the gate electrode 713, and then an island-shaped oxide semiconductor film 715 is formed over the gate insulating film 714 so as to overlap with the gate electrode 713.

The gate insulating film 714 can be formed to have a single-layer structure or a layered structure using any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like. It is preferable that the gate insulating film 714 contains as few impurities such as moisture or hydrogen as possible. In the case of forming a silicon oxide film by a sputtering method, a silicon target or a quartz target is used as a target, and oxygen or a mixed gas of oxygen and argon is used as a sputtering gas.

An oxide semiconductor that is made to be i-type or a substantially i-type (a highly purified oxide semiconductor)

by removal of impurities is extremely sensitive to interface state density and interface electric charge; thus, an interface between the highly purified oxide semiconductor and the gate insulating film 714 is important. Therefore, the gate insulating film (GI) that is in contact with the highly-purified oxide semiconductor needs to have higher quality.

For example, high-density plasma CVD using a microwave (frequency: 2.45 GHz) is preferably used, by which an insulating film which is dense, has high withstand voltage, and is of high quality can be formed. This is because when the highly purified oxide semiconductor is closely in contact with the high-quality gate insulating film, the interface state density can be reduced and interface properties can be favorable.

Needless to say, other film formation methods, such as a sputtering method or a plasma CVD method, can be applied as long as a high-quality insulating film can be formed as the gate insulating film 714. In addition, any insulating film can be used as long as film quality and characteristics of an interface with an oxide semiconductor are modified by heat treatment performed after the formation of the insulating film. In any case, an insulating film that has favorable film quality as the gate insulating film and can reduce interface state density with an oxide semiconductor to form a favorable interface is formed.

The gate insulating film 714 may be formed to have a structure in which an insulating film formed using a material having a high barrier property and an insulating film having low proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film. As the insulating film having a high barrier property, for example, a silicon nitride film, a silicon nitride oxide film, an aluminum nitride film, an aluminum nitride oxide film, and the like can be given. The insulating film having a high barrier property can prevent impurities in an atmosphere, such as moisture or hydrogen, or impurities in the substrate, such as an alkali metal or a heavy metal, from entering the oxide semiconductor film, the gate insulating film 714, or the interface between the oxide semiconductor film and another insulating film and the vicinity thereof. In addition, the insulating film having low proportion of nitrogen, such as a silicon oxide film or a silicon oxynitride film, which is formed in contact with the oxide semiconductor film can prevent the insulating film having a high barrier property from being in direct contact with the oxide semiconductor film.

For example, the gate insulating film 714 having a thickness of 100 nm may be formed in the following manner: a silicon nitride film ($SiN_y$ (y>0)) having a thickness of greater than or equal to 50 nm and less than or equal to 200 nm is formed by a sputtering method as a first gate insulating film, and a silicon oxide film ($SiO_x$ (x>0)) having a thickness of greater than or equal to 5 nm and less than or equal to 300 nm is stacked over the first gate insulating film as a second gate insulating film. The thickness of the gate insulating film 714 may be set as appropriate depending on characteristics needed for the transistor and may be approximately 350 nm to 400 nm.

In this embodiment, the gate insulating film 714 having a structure in which a silicon oxide film having a thickness of 100 nm formed by a sputtering method is stacked over a silicon nitride film having a thickness of 50 nm formed by a sputtering method is formed.

Note that the gate insulating film 714 is in contact with an oxide semiconductor to be formed later. When hydrogen is contained in the oxide semiconductor, characteristics of the transistor are adversely affected; therefore, it is preferable that the gate insulating film 714 does not contain hydrogen, a hydroxyl group, and moisture. In order that the gate insulating film 714 may contain hydrogen, a hydroxyl group, and moisture as little as possible, it is preferable that an impurity adsorbed on the substrate 700, such as moisture or hydrogen, is eliminated and removed by preheating the substrate 700, over which the gate electrode 713 is formed, in a preheating chamber of a sputtering apparatus, for pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment may be omitted.

The island-shaped oxide semiconductor film 715 can be formed by processing an oxide semiconductor film formed over the gate insulating film 714 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor as a target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to a surface of the gate insulating film 714 is preferably removed by reverse sputtering in which an argon gas is introduced and plasma is generated. The reverse sputtering refers to a method in which, without application of voltage to the target side, an RF power source is used for application of voltage to the substrate side under an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, as described above, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

As the oxide semiconductor, it is preferable to use an oxide semiconductor containing In or Zn, and it is further preferable to use an oxide semiconductor containing In and Ga, or In and Zn. In order to obtain an i-type (intrinsic) oxide semiconductor film, dehydration or dehydrogenation to be described later is effective. As a stabilizer for reducing variations in electrical characteristics of the transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

In this embodiment, as the oxide semiconductor film, an In—Ga—Zn-based oxide semiconductor thin film having a thickness of 30 nm, which is obtained by a sputtering method using a target containing indium (In), gallium (Ga), and zinc (Zn), is used. In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the aforementioned atomic ratio, a polycrystal or CAAC is likely to be formed. The filling rate of the target including In, Ga, and Zn is greater than or equal to 90% and less than or equal to 100%, preferably greater than or equal to 95% and less than 100%. With the use of such a target with a high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of $Z>1.5X+Y$ is satisfied. The mobility can be improved by keeping the rate of Zn within the above range.

In this embodiment, the substrate is held in the treatment chamber kept at reduced pressure, a sputtering gas from which hydrogen and moisture have been removed is introduced into the treatment chamber from which remaining moisture is being removed, and the oxide semiconductor film is formed over the substrate 700 with the use of the above target. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities contained in the formed oxide semiconductor film can be reduced. In addition, damage due to sputtering can be reduced. In order to remove remaining moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the film formation chamber can be reduced.

As one example of the film formation conditions, the distance between the substrate and the target is 100 mm, the pressure is 0.6 Pa, the direct-current (DC) power source is 0.5 kW, and the atmosphere is an oxygen atmosphere (the oxygen flow rate is 100%). Note that a pulsed direct-current (DC) power source is preferable because dust generated in film formation can be reduced and the film thickness can be made uniform.

In order that the oxide semiconductor film may contain hydrogen, a hydroxyl group, and moisture as little as possible, it is preferable that an impurity adsorbed on the substrate 700, such as moisture or hydrogen, is eliminated and removed by preheating the substrate 700 over which films up to and including the gate insulating film 714 are formed, in a preheating chamber of a sputtering apparatus, for pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment may be omitted. This preheating may be similarly performed on the substrate 700 over which films up to and including a conductive film 720 and a conductive film 721 are formed, before the formation of an insulating film 722.

Note that etching for forming the island-shaped oxide semiconductor film 715 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As a dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask for forming the island-shaped oxide semiconductor film 715 may be formed by an inkjet method. Formation of the resist mask by an inkjet method needs no photomask; thus, manufacturing cost can be reduced.

Note that it is preferable that reverse sputtering is performed before formation of a conductive film in a subsequent step so that a resist residue or the like adhering to surfaces of the island-shaped oxide semiconductor film 715 and the gate insulating film 714 is removed.

Note that the oxide semiconductor film formed by sputtering or the like contains a large amount of moisture or hydrogen (including a hydroxyl group) as an impurity in some cases. Moisture and hydrogen each easily form a donor level and thus serves as an impurity in the oxide semiconductor. In one embodiment of the present invention, in order to reduce impurities such as moisture or hydrogen in the oxide semiconductor film (dehydrate or dehydrogenate the oxide semiconductor film), the island-shaped oxide semiconductor film 715 is subjected to heat treatment under a reduced-pressure atmosphere, an inert gas atmosphere of nitrogen, a rare gas, or the like, an oxygen gas atmosphere, or an ultra dry air (the air whose moisture amount is 20 ppm (−55° C. by conversion into a dew point) or less, preferably 1 ppm or less, more preferably 10 ppb or less, in the case where measurement is performed with a dew point meter in a cavity ring down laser spectroscopy (CRDS) method) atmosphere.

By performing the heat treatment on the island-shaped oxide semiconductor film 715, moisture or hydrogen in the island-shaped oxide semiconductor film 715 can be eliminated. Specifically, the heat treatment may be performed at a temperature higher than or equal to 250° C. and lower than or equal to 750° C., preferably at a temperature higher than or equal to 400° C. and lower than the strain point of the substrate. For example, the heat treatment may be performed at 500° C. for approximately more than or equal to 3 minutes and less than or equal to 6 minutes. When an RTA method is used for the heat treatment, dehydration or dehydrogenation can be performed in a short time; therefore, the treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

Note that it is preferable that in the heat treatment, moisture, hydrogen, and the like are not contained in nitrogen or a rare gas such as helium, neon, or argon. It is preferable that the purity of nitrogen or a rare gas such as helium, neon, or argon, which is introduced into a heat treatment apparatus, is set to be 6N (99.9999%) or higher, preferably 7N (99.99999%) or higher (that is, the impurity concentration is 1 ppm or lower, preferably 0.1 ppm or lower).

Through the above-described steps, the concentration of hydrogen in the island-shaped oxide semiconductor film 715 can be reduced and the island-shaped oxide semiconductor film 715 can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, the transistor can be manufactured using a large-sized substrate, so that the productivity can be increased. Further, by using the oxide semiconductor film which has been highly purified by reducing the hydrogen concentration, it is possible to manufacture a transistor with high withstand voltage and an extremely small off-state current. The above heat treatment can be performed at any time as long as it is performed after the oxide semiconductor film is formed.

Note that in the case where the oxide semiconductor film is heated, although depending on a material of the oxide semiconductor film or heating conditions, plate-like crystals are formed in the surface of the oxide semiconductor film in some cases. The plate-like crystals are preferably single crystal bodies with c-axis alignment in a direction substantially perpendicular to a surface of the oxide semiconductor film. Even if the plate-like crystals are not single crystal bodies, each crystal is preferably a polycrystalline body with c-axis alignment in a direction substantially perpendicular to the surface of the oxide semiconductor film. In the above-described polycrystalline body, in addition to having c-axis-aligned, the crystals preferably have identical a-b planes, a-axes, or b-axes. Note that when a base surface of the oxide semiconductor film is uneven, a plate-like crystal is a polycrystalline body. Therefore, the base surface is preferably as even as possible.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Figure 23C:
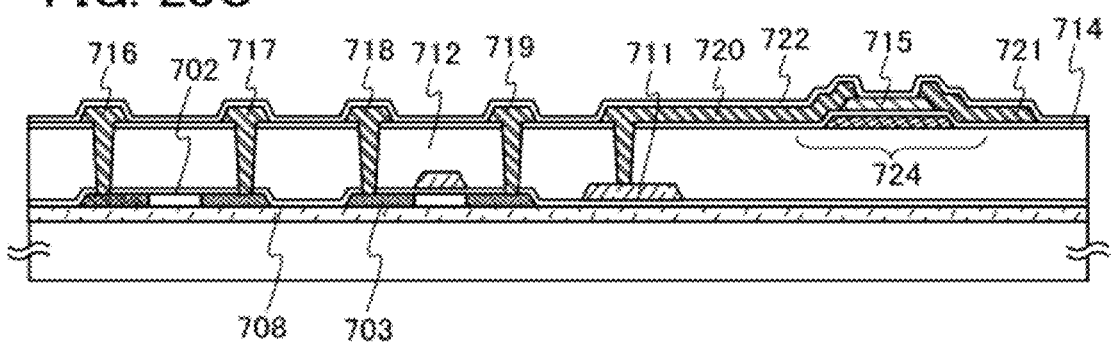

Then, a conductive film is formed so as to cover the oxide semiconductor film 715 by a sputtering method or a vacuum evaporation method. After that, the conductive film is patterned by etching or the like, so that conductive films 716 to 721 each of which functions as a source electrode, a drain electrode, or a wiring are formed as illustrated in FIG. 23C.

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor film 715. The conductive film 721 is in contact with the oxide semiconductor film 715.

As a material of the conductive film for forming the conductive films 716 to 721, any of the following materials can be used: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is provided over or below a metal film of aluminum, copper, or the like. Aluminum or copper is preferably combined with a refractory metal material so as to prevent problems with heat resistance and corrosion. As the refractory metal material, molybdenum, titanium, chromium, tantalum, tungsten, neodymium, scandium, yttrium, or the like can be used.

Further, the conductive film may have a single-layer structure or a layered structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

The conductive film for forming the conductive films 716 to 721 may be formed using a conductive metal oxide. As a conductive metal oxide, indium oxide, tin oxide, zinc oxide, a mixture of indium oxide and tin oxide, a mixture of indium oxide and zinc oxide, or the metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor film 715 is not removed in etching of the conductive film as much as possible. Depending on etching conditions, an exposed portion of the island-shaped oxide semiconductor film 715 may be partly etched, so that a groove (a recessed portion) is formed in some cases.

In this embodiment, a titanium film is used as the conductive film. Therefore, wet etching can be selectively performed on the conductive film with the use of a solution containing ammonia and hydrogen peroxide water (an ammonia hydrogen peroxide mixture); however, the oxide semiconductor film 715 is also partly etched. As the solution containing an ammonia hydrogen peroxide mixture, specifically, a solution in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography process, an etching step may be performed with the use of a resist mask formed with the use of a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing to provide different patterns. Therefore, a resist mask corresponding to at least two kinds or more of different patterns can be formed with one multi-tone mask. Thus, the number of light-exposure masks can be reduced and the number of corresponding photolithography steps can be also reduced, whereby simplification of a process can be realized.

Next, plasma treatment is performed using a gas such as $N_2O$, $N_2$, or Ar. By this plasma treatment, water or the like adhering to an exposed surface of the oxide semiconductor film is removed. Alternatively, plasma treatment using a mixture gas of oxygen and argon may be performed.

After the plasma treatment, as illustrated in FIG. 23C, the insulating film 722 is formed so as to cover the conductive films 716 to 721 and the oxide semiconductor film 715. The insulating film 722 preferably contains as few impurities such as moisture, hydrogen, and oxygen as possible, and may be formed using a single-layer insulating film or a plurality of insulating films stacked. When hydrogen is contained in the insulating film 722, entry of the hydrogen into the oxide semiconductor film or extraction of oxygen from the oxide semiconductor film by the hydrogen occurs, whereby a back channel portion of the oxide semiconductor film has low resistance (n-type conductivity); thus, a parasitic channel might be formed. Therefore, it is important that a film formation method in which hydrogen is not used is employed in order to form the insulating film 722 containing as little hydrogen as possible. A material having a high barrier property is preferably used for the insulating film 722. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having low proportion of nitrogen, such as a silicon oxide film or a silicon oxynitride film, is formed so that the oxide semiconductor film 715 is closer to the insulating film having low proportion of nitrogen than to the insulating film having a high barrier property. Then, the insulating film having a high barrier property is formed so as to overlap with the conductive films 716 to 721 and the oxide semiconductor film 715 with the insulating film having a low proportion of nitrogen sandwiched therebetween. By using the insulating film having a high barrier property, the impurities such as moisture or hydrogen can be prevented from entering the oxide semiconductor film 715, the gate insulating film 714, or the interface between the oxide semiconductor film 715 and another insulating film and the vicinity thereof. In addition, the insulating film having low proportion of nitrogen, such as a silicon oxide film or a silicon oxynitride film formed in contact with the oxide semiconductor film 715 can prevent the insulating film formed using a material having a high barrier property from being in direct contact with the oxide semiconductor film 715.

In this embodiment, the insulating film 722 having a structure in which a silicon nitride film having a thickness of 100 nm formed by a sputtering method is stacked over a silicon oxide film having a thickness of 200 nm formed by a sputtering method is formed. The substrate temperature in film formation may be higher than or equal to room temperature and lower than or equal to 300° C. and in this embodiment, is 100° C.

After the insulating film 722 is formed, heat treatment may be performed. The heat treatment is performed under a nitrogen atmosphere, an atmosphere of ultra-dry air, or a rare gas (e.g., argon, helium) atmosphere preferably at a temperature higher than or equal to 200° C. and lower than or equal to 400° C., for example, at a temperature higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. under a nitrogen atmosphere for 1 hour. Alternatively, RTA treatment for a short time at a high temperature may be performed before the formation of the conductive films 716 to 721 in a manner similar to that of the previous heat treatment performed on the oxide semiconductor film to reduce moisture or hydrogen. Even when oxygen vacancies are generated in the oxide semiconductor film 715 by the previous heat treatment performed on the oxide semiconductor film, oxygen is supplied to the oxide semiconductor film 715 from the insulating film 722 by performing heat treatment after providing the insulating film 722 containing oxygen. By supplying oxygen to the oxide semiconductor film 715, oxygen vacancies that serve as donors can be reduced in the oxide semiconductor film 715 and the stoichiometric ratio can be satisfied. It is preferable that the proportion of oxygen in the oxide semiconductor film 715 is higher than that in the stoichiometric composition. As a result, the oxide semiconductor film 715 can be made to be substantially i-type and variations in electrical characteristics of the transistor due to oxygen vacancies can be reduced; thus, electrical characteristics can be improved. The timing of this heat treatment is not particularly limited as long as it is after the formation of the insulating film 722. When this heat treatment doubles as another step such as heat treatment for formation of a resin film or heat treatment for reduction of the resistance of a transparent conductive film, the oxide semiconductor film 715 can be made to be substantially i-type without the number of steps increased.

Moreover, the oxygen vacancies that serve as donors in the oxide semiconductor film 715 may be reduced by subjecting the oxide semiconductor film 715 to heat treatment under an oxygen atmosphere so that oxygen is added to the oxide semiconductor. The heat treatment is performed, for example, at a temperature higher than or equal to 100° C. and lower than 350° C., preferably at a temperature higher than or equal to 150° C. and lower than 250° C. It is preferable that an oxygen gas used for the heat treatment under an oxygen atmosphere does not contain water, hydrogen, and the like. Alternatively, it is preferable that the purity of the oxygen gas which is introduced into a heat treatment apparatus is set to be 6N (99.9999%) or higher, preferably 7N (99.99999%) or higher (that is, the impurity concentration in the oxygen is 1 ppm or lower, preferably 0.1 ppm or lower).

Alternatively, oxygen may be added to the oxide semiconductor film 715 by an ion implantation method, an ion doping method, or the like to reduce oxygen vacancies serving as donors. For example, oxygen which is made to be plasma with a microwave of 2.45 GHz may be added to the oxide semiconductor film 715.

As illustrated in FIG. 23C, a back gate electrode may be formed so as to overlap with the oxide semiconductor film 715 by forming a conductive film over the insulating film 722 and then patterning the conductive film. In the case where the back gate electrode is formed, an insulating film is preferably formed to cover the back gate electrode. The back gate electrode can be formed using a material and a structure similar to those of the gate electrode 713 or the conductive films 716 to 721.

The thickness of the back gate electrode is in the range of 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above process, a transistor 724 is formed.

The transistor 724 includes the gate electrode 713, the gate insulating film 714 over the gate electrode 713, the oxide semiconductor film 715 which is over the gate insulating film 714 and overlaps with the gate electrode 713, and the pair of conductive films 720 and 721 formed over the oxide semiconductor film 715. Further, the transistor 724 may include the insulating film 722 as its component. The transistor 724 illustrated in FIG. 23C has a channel-etched structure in which part of the oxide semiconductor film 715 between the conductive film 720 and the conductive film 721 is etched.

Although the transistor 724 is described as a single-gate transistor, a multi-gate transistor including a plurality of channel formation regions can be manufactured if needed. The multi-gate transistor includes a plurality of the gate electrodes 713 electrically connected to each other.

Note that an insulating film in contact with the oxide semiconductor film 715 (corresponding to the gate insulating film 714 and the insulating film 722, in this embodiment) may be formed using an insulating material containing a Group 13 element and oxygen. Many of oxide semiconductor materials contain Group 13 elements, and an insulating material containing a Group 13 element works well with oxide semiconductors. By using such an insulating material containing a Group 13 element for the insulating film in contact with the oxide semiconductor film, an interface with the oxide semiconductor film can keep a favorable state.

An insulating material containing a Group 13 element refers to an insulating material containing one or more Group 13 elements. As the insulating material containing a Group 13 element, for example, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material containing gallium oxide may be used for an insulating film, so that favorable characteristics can be kept at the interface between the oxide semiconductor film and the insulating film. When the oxide semiconductor film and the insulating film containing gallium oxide are provided in contact with each other, accumulation of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide is impermeable to water; therefore, it is preferable to use a material containing aluminum oxide in terms of preventing entry of water to the oxide semiconductor film.

The insulating film in contact with the oxide semiconductor film 715 preferably contains oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor film 715 is formed using gallium oxide, the composition of gallium oxide can be set to be $Ga_2O_x$ ($x=3+\alpha$, $0<\alpha<1$) by heat treatment under an oxygen atmosphere or by oxygen doping.

In the case where the insulating film in contact with the oxide semiconductor film 715 is formed using aluminum oxide, the composition of aluminum oxide can be set to be $Al_2O_x$ ($x=3+\alpha$, $0<\alpha<1$) by heat treatment under an oxygen atmosphere or by oxygen doping.

In the case where the insulating film in contact with the oxide semiconductor film 715 is formed using gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment under an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen vacancies in the oxide semiconductor film or at an interface between the oxide semiconductor film and the insulating film are reduced. Thus, the oxide semiconductor film can be made to be an i-type or substantially i-type oxide semiconductor.

Note that the insulating film including a region where the proportion of oxygen is higher than that in the stoichiometric composition may be applied to either the insulating film located on the upper side of the oxide semiconductor film or the insulating film located on the lower side of the oxide semiconductor film of the insulating films in contact with the oxide semiconductor film 715; however, it is preferable to apply such an insulating film to both of the insulating films in contact with the oxide semiconductor film 715. The above-described effect can be enhanced with a structure where the insulating films each including a region where the proportion of oxygen is higher than that in the stoichiometric composition are used as the insulating films in contact with the oxide semiconductor film 715 and placed on the upper side and the lower side of the oxide semiconductor film 715, in order that the oxide semiconductor film 715 may be sandwiched between the insulating films.

The insulating films on the upper side and the lower side of the oxide semiconductor film 715 may contain the same constituent element or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed using gallium oxide whose composition is $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor film 715 may be formed by stacking insulating films each including a region where the proportion of oxygen is higher than that in the stoichiometric composition. For example, the insulating film on the upper side of the oxide semiconductor film 715 may be formed as follows: gallium oxide whose composition is $Ga_2O_x$ ($x=3+\alpha$, $0<\alpha<1$) is formed and gallium aluminum oxide (or aluminum gallium oxide) whose composition is $Ga_xAl_{2-x}O_{3+\alpha}$ ($0<x<2$, $0<\alpha<1$) is formed thereover. Note that the insulating film on the lower side of the oxide semiconductor film 715 may be formed by stacking insulating films each including a region where the proportion of oxygen is higher than that in the stoichiometric composition. Further, both of the insulating films on the upper side and the lower side of the oxide semiconductor film 715 may be formed by stacking insulating films each including a region where the proportion of oxygen is higher than that in the stoichiometric composition.

This embodiment can be implemented in combination with any of the other embodiments.

Embodiment 5

In this embodiment, a transistor which includes an oxide semiconductor film and has a structure different from that in Embodiment 4 will be described.

Figure 24A:
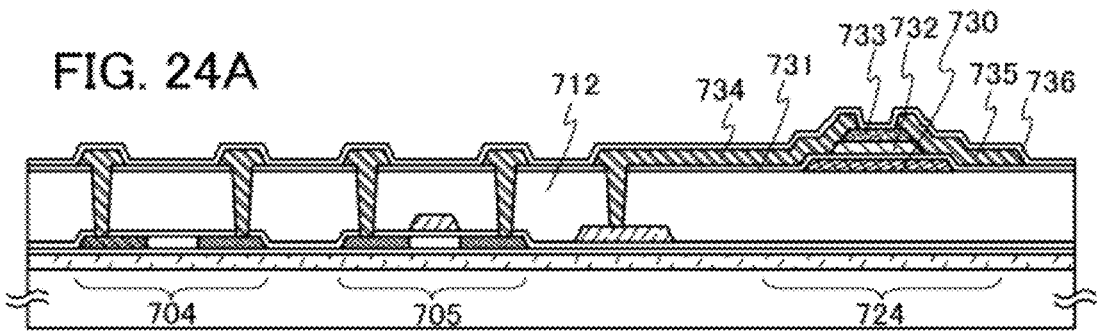
FIGS. 24A to 24D are cross-sectional views each illustrating a solid-state image sensing device or a semiconductor display device.

A solid-state image sensing device or a semiconductor display device illustrated in FIG. 24A includes the photodiode 704 and the n-channel transistor 705 as in Embodiment 4. In addition, the transistor 724 which includes an oxide semiconductor film and has a channel-protective structure and a bottom-gate structure is formed above the photodiode 704 and the n-channel transistor 705 in FIG. 24A.

The transistor 724 includes a gate electrode 730 formed over the insulating film 712; a gate insulating film 731 over the gate electrode 730; an oxide semiconductor film 732 over the gate insulating film 731 and overlapping with the gate electrode 730; a channel protective film 733 over the oxide semiconductor film 732 and in a position overlapping with the gate electrode 730; and a conductive film 734 and a conductive film 735 formed over the oxide semiconductor film 732. The transistor 724 may further include, as its component, an insulating film 736 formed over the conductive film 734, the conductive film 735, and the channel protective film 733.

The channel protective film 733 can prevent a portion of the oxide semiconductor film 732, which serves as a channel formation region, from being damaged in a later step, for example, reduction in thickness due to plasma or an etchant in etching. Therefore, reliability of the transistor can be improved.

An inorganic material containing oxygen (silicon oxide, silicon nitride oxide, silicon oxynitride, aluminum oxide, aluminum oxynitride, or the like) can be used for the channel protective film 733. The channel protective film 733 can be formed by a vapor deposition method such as a plasma CVD method or a thermal CVD method, or a sputtering method. After the formation of the channel protective film 733, the shape thereof is processed by etching. Here, the channel protective film 733 is formed in such a manner that a silicon oxide film is formed by a sputtering method and processed by etching using a mask formed by photolithography.

An inorganic material containing oxygen is used for the channel protective film 733, whereby a structure can be provided in which oxygen is supplied from the channel protective film 733 to the oxide semiconductor film 732 and oxygen vacancies serving as donors are reduced to satisfy the stoichiometric composition even when the oxygen vacancies are generated in the oxide semiconductor film 732 by heat treatment performed to reduce moisture or hydrogen. It is preferable that the proportion of oxygen in the oxide semiconductor film 732 be higher than that in the stoichiometric composition. Thus, the channel formation region can be made to be close to i-type and a variation in electric characteristics of the transistor 724 due to oxygen vacancies can be reduced; accordingly, the electric characteristics can be improved.

Figure 24B:
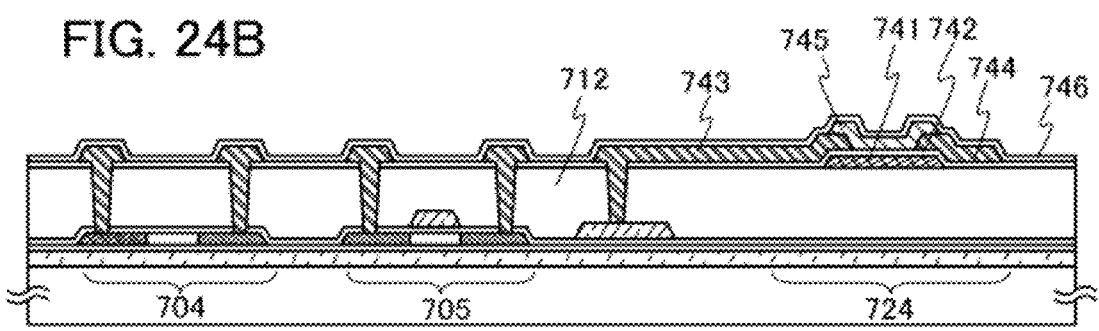

A solid-state image sensing device or a semiconductor display device illustrated in FIG. 24B includes the photodiode 704 including crystalline silicon and the n-channel transistor 705 as in Embodiment 4. In addition, the transistor 724 which includes an oxide semiconductor film and has a bottom-contact structure is formed above the photodiode 704 and the n-channel transistor 705 in FIG. 24B.

The transistor 724 includes a gate electrode 741 formed over the insulating film 712; a gate insulating film 742 over the gate electrode 741; a conductive film 743 and a conductive film 744 over the gate insulating film 742; and an oxide semiconductor film 745 overlapping with the gate electrode 741 with the gate insulating film 742 provided therebetween. In addition, the transistor 724 may include an insulating film 746 formed over the oxide semiconductor film 745, as its component.

Note that the transistor 724 illustrated in FIGS. 24A and 24B may further include a back gate electrode.

Figure 24C:
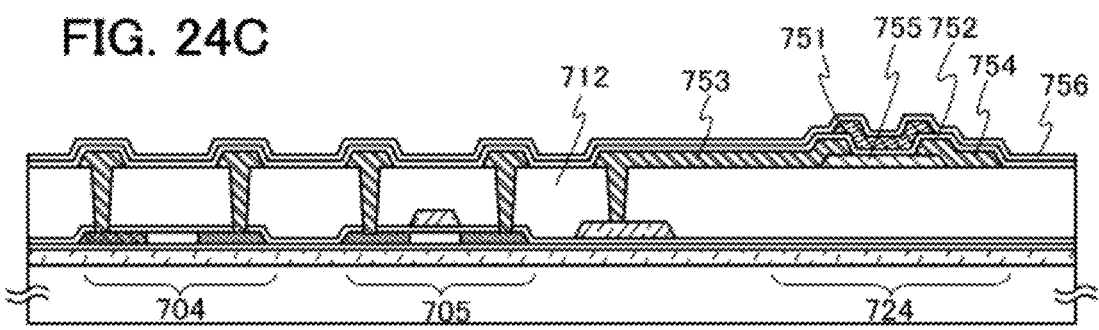

A solid-state image sensing device or a semiconductor display device illustrated in FIG. 24C includes the photodiode 704 including crystalline silicon and the n-channel transistor 705 as in Embodiment 4. In addition, the transistor 724 which includes an oxide semiconductor film and has a top-contact structure is formed above the photodiode 704 and the n-channel transistor 705 in FIG. 24C.

The transistor 724 includes an oxide semiconductor film 755 formed over the insulating film 712; a conductive film 753 and a conductive film 754 over the oxide semiconductor film 755; a gate insulating film 752 over the oxide semiconductor film 755, the conductive film 753, and the conductive film 754; and a gate electrode 751 overlapping with the oxide semiconductor film 755 with the gate insulating film 752 provided therebetween. In addition, the transistor 724 may include an insulating film 756 formed over the gate electrode 751, as its component.

Figure 24D:
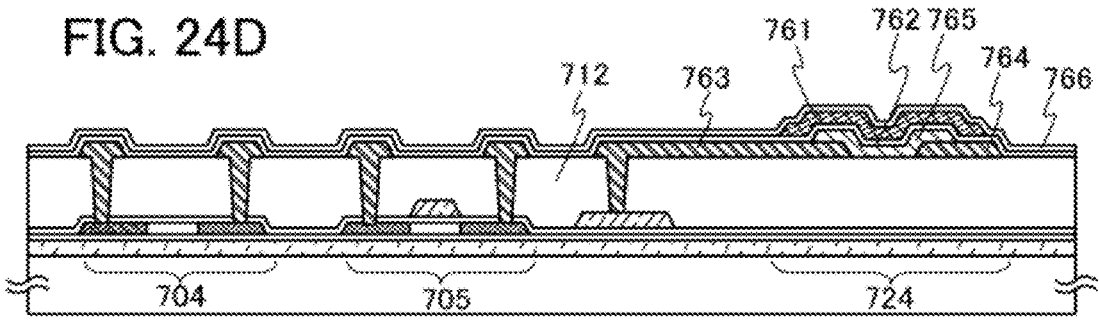

A solid-state image sensing device or a semiconductor display device illustrated in FIG. 24D includes the photodiode 704 including crystalline silicon and the n-channel transistor 705 as in Embodiment 4. In addition, a bottom-contact transistor 724 which includes an oxide semiconductor film and has a top-contact structure is formed over the photodiode 704 and the n-channel transistor 705 in FIG. 24D.

The transistor 724 includes a conductive film 763 and a conductive film 764 formed over the insulating film 712; an oxide semiconductor film 765 over the conductive film 763 and the conductive film 764; a gate insulating film 762 over the oxide semiconductor film 765, the conductive film 763, and the conductive film 764; and a gate electrode 761 overlapping with the oxide semiconductor film 765 with the gate insulating film 762 provided therebetween. In addition, the transistor 724 may include an insulating film 766 formed over the gate electrode 761, as its component.

This embodiment can be implemented in combination with any of the other embodiments.

Embodiment 6

In this embodiment, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner when seen from the direction perpendicular to the c-axis, and the direction of the a-axis or the b-axis is varied in the a-b plane (the crystal rotates around the c-axis).

In a broad sense, an oxide including a CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where a CAAC contains oxygen, nitrogen may be substituted for part of oxygen. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 27A to 27E, FIGS. 28A to 28C, and FIGS. 29A to 29C. In FIGS. 27A to 27E, FIGS. 28A to 28C, and FIGS. 29A to 29C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 27A:
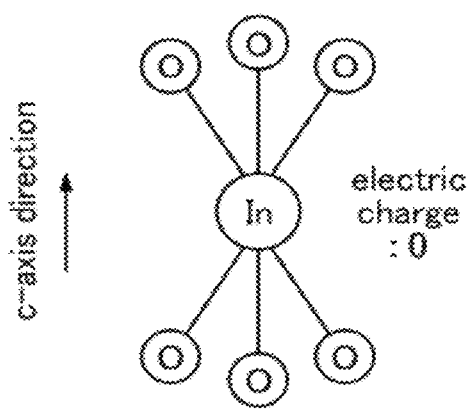
FIGS. 27A to 27E are diagrams each illustrating a structure of an oxide material according to one embodiment of the present invention.

FIG. 27A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 27A is actually an octahedral structure, but is illustrated as a planar structure for simplicity. Note that three tetracoordinate O atoms exist in each of an upper half and a lower half in FIG. 27A. In the small group illustrated in FIG. 27A, electric charge is 0.

Figure 27D:
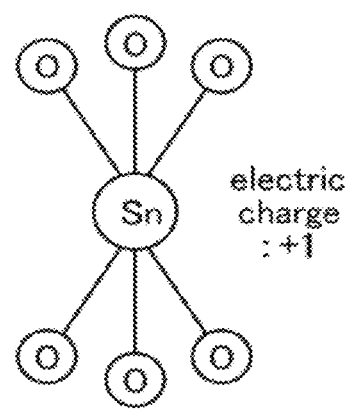
Figure 27B:
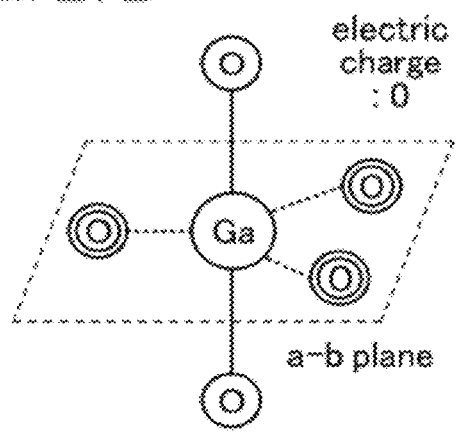

FIG. 27B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 27B. An In atom can also have the structure illustrated in FIG. 27B because an In atom can have five ligands. In the small group illustrated in FIG. 27B, electric charge is 0.

Figure 27E:
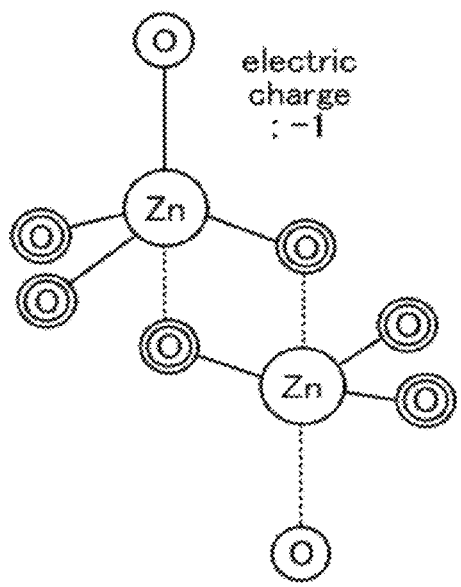
Figure 27C:
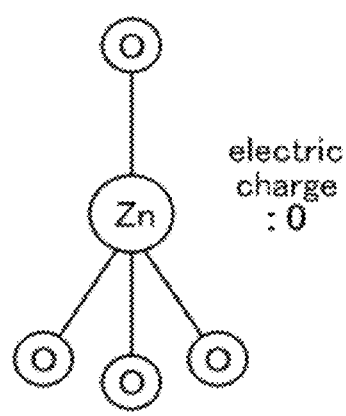

FIG. 27C illustrates a structure including one tetracoordinate Zn atom and four tetracoordinate O atoms proximate to the Zn atom. In FIG. 27C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 27C. In the small group illustrated in FIG. 27C, electric charge is 0.

FIG. 27D illustrates a structure including one hexacoordinate Sn atom and six tetracoordinate O atoms proximate to the Sn atom. In FIG. 27D, three tetracoordinate O atoms exist in each of an upper half and a lower half. In the small group illustrated in FIG. 27D, electric charge is +1.

FIG. 27E illustrates a small group including two Zn atoms. In FIG. 27E, one tetracoordinate O atom exists in each of an upper half and a lower half. In the small group illustrated in FIG. 27E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 27A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 28A:
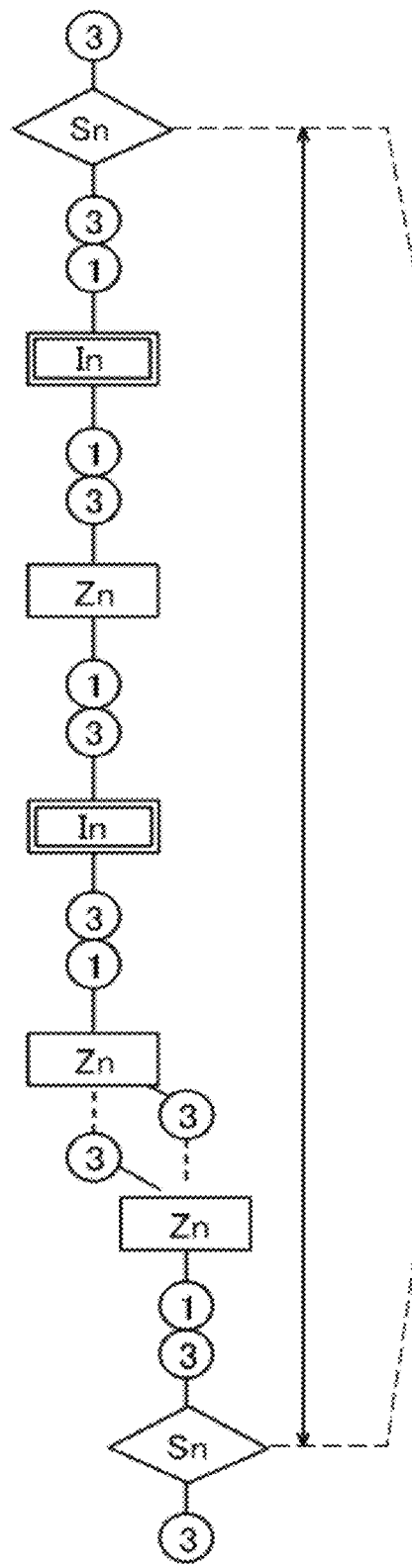
FIGS. 28A to 28C are diagrams illustrating a structure of an oxide material according to one embodiment of the present invention.
Figure 28B:
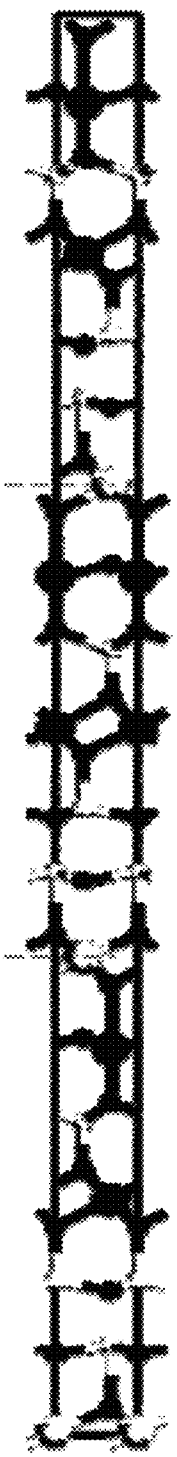
Figure 28C:
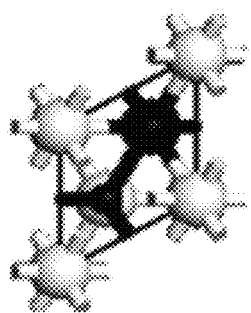

FIG. 28A illustrates a model of a medium group included in a layered structure of an In—Sn—Zn-based oxide. FIG. 28B illustrates a large group including three medium groups. Note that FIG. 28C illustrates an atomic arrangement in the case where the layered structure in FIG. 28B is observed from the c-axis direction.

In FIG. 28A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 28A, one tetracoordinate O atom existing in each of an upper half and a lower half with respect to an In atom is denoted by circled 1. FIG. 28A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 28A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 27E can be given. For example, with one small group including two Zn atoms, electric charge of one small group including a Sn atom can be cancelled, so that the total electric charge of the layered structure can be 0.

When the large group illustrated in FIG. 28B is repeated, a crystal of the In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 29A illustrates a model of a medium group included in a layered structure of an In—Ga—Zn-based oxide.

In the medium group included in the layered structure of the In—Ga—Zn-based oxide in FIG. 29A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 29B illustrates a large group including three medium groups. Note that FIG. 29C illustrates an atomic arrangement in the case where the layered structure in FIG. 29B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 29A but also a medium group in which the arrangement of the In atom, the Ga atom, and the Zn atom is different from that in FIG. 29A.

This embodiment can be implemented in combination with any of the other embodiments.

Embodiment 7

In this embodiment, ideal mobility of the transistor described in the above embodiment will be described.

The actually measured mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the mobility on the assumption that no defect exists inside the semiconductor can be calculated theoretically.

Assuming that the original mobility and the measured mobility of a semiconductor are $\mu_0$ and $\mu$, respectively, and a potential barrier (such as a grain boundary) exists in the semiconductor, the mobility $\mu$ can be expressed by Equation 8.

[EQUATION 8]

$$\mu = \mu_0 \exp\left(-\frac{E}{kT}\right) \quad \text{(Equation 8)}$$

Here, E represents the height of the potential barrier, k represents the Boltzmann constant, and T represents the absolute temperature. When the potential barrier is assumed to be attributed to a defect, the height of the potential barrier can be expressed by Equation 9 according to the Levinson model.

[EQUATION 9]

$$E = \frac{e^2 N^2}{8\varepsilon n} = \frac{e^3 N^2 t}{8\varepsilon C_{ox} V_g} \quad \text{(Equation 9)}$$

Note that e represents the elementary charge, N represents the average defect density per unit area in a channel, a represents the permittivity of the semiconductor, n represents the number of carriers per unit area in the channel, $C_{ox}$ represents the capacitance per unit area, $V_g$ represents the gate voltage, and t represents the thickness of a channel formation region. In the case where the thickness of the semiconductor film is less than or equal to 30 nm, the thickness of the channel formation region may be regarded as being the same as the thickness of the semiconductor film. The drain current $I_d$ in a linear region can be expressed by the Equation 10.

[EQUATION 10]

$$I_d = \frac{W \mu V_g V_d C_{ox}}{L} \exp\left(-\frac{E}{kT}\right) \quad \text{(Equation 10)}$$

L represents the channel length and W represents the channel width, and L and W are each 10 μm here. In addition, $V_d$ represents the drain voltage. When dividing both sides of the above equation by $V_g$ and then taking logarithms of both sides, Equation 11 can be obtained.

[EQUATION 11]

$$\ln\left(\frac{I_d}{V_g}\right) = \ln\left(\frac{W \mu V_d C_{ox}}{L}\right) - \frac{E}{kT} \quad \text{(Equation 11)}$$
$$= \ln\left(\frac{W \mu V_d C_{ox}}{L}\right) - \frac{e^3 N^2 t}{8kT\varepsilon C_{ox} V_g}$$

The right side of Equation 11 is a function of $V_g$. From Equation 11, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Equation 8 and Equation 9. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel formation region and a gate insulating film affects the transport property of the transistor. In other words, the mobility $\mu_1$ at a position that is distance x away from the interface between the channel formation region and the gate insulating film can be expressed by Equation 12.

[EQUATION 12]

$$\frac{1}{\mu_1} = \frac{1}{\mu_0} + \frac{D}{B} \exp\left(-\frac{x}{G}\right) \quad \text{(Equation 12)}$$

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage $V_g$ is increased), the second term of Equation 12 is increased and accordingly the mobility $\mu_1$ is decreased.

Figure 30:
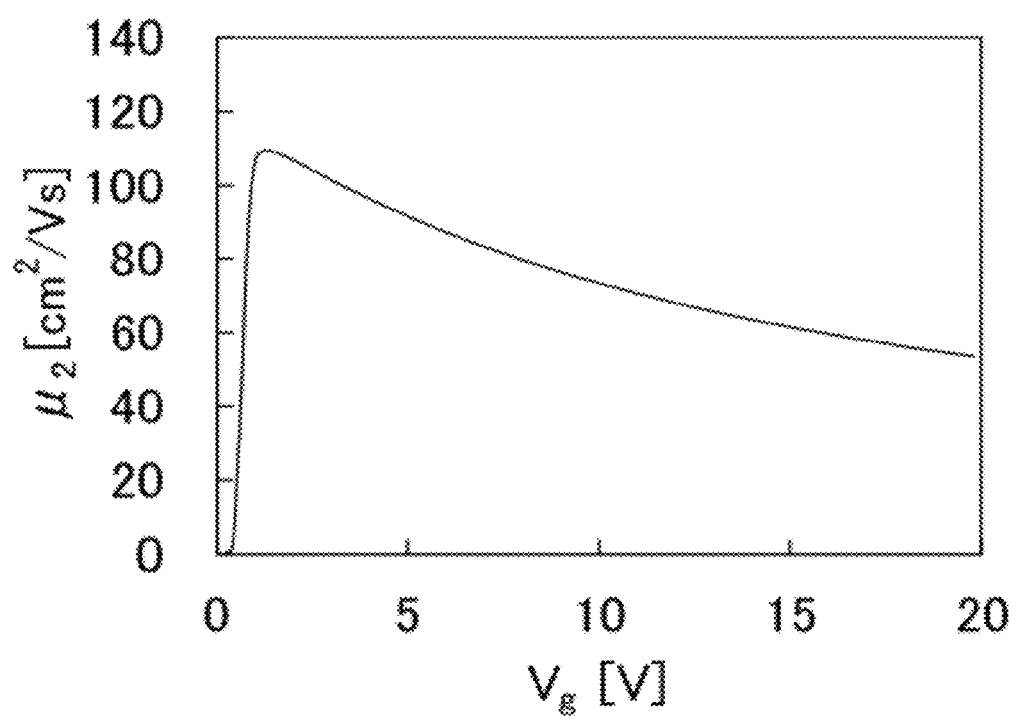
FIG. 30 is a graph showing dependence of mobility on gate voltage, which is obtained by simulation.

Calculation results of the mobility $\mu_2$ of a transistor in which a channel formation region includes an ideal oxide semiconductor without a defect inside the semiconductor are shown in FIG. 30. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length L and the channel width W were each assumed to be 10 μm, and the drain voltage $V_d$ was assumed to be 0.1 V.

As shown in FIG. 30, the mobility $\mu_2$ has a peak of more than 100 cm²/Vs at a gate voltage $V_g$ that is a little over 1 V and is decreased as the gate voltage $V_g$ becomes higher because the influence of interface scattering is increased. Note that in order to reduce interface scattering, it is preferable that a surface of the semiconductor film be flat at the atomic level (atomic layer flatness).

Calculation results of characteristics of minute transistors which are manufactured using an oxide semiconductor having such a mobility are shown in FIGS. 31A to 31C, FIGS. 32A to 32C, and FIGS. 33A to 33C. FIGS. 34A and 34B illustrate cross-sectional structures of the transistors used for the calculation. The transistors illustrated in FIGS. 34A and 34B each include a semiconductor region 1303a and a semiconductor region 1303c which have n⁺-type conductivity in an oxide semiconductor layer. The resistivities of the semiconductor region 1303a and the semiconductor region 1303c are 2×10⁻³ Ωcm.

The transistor illustrated in FIG. 34A is formed over a base insulating film 1301 and an embedded insulator 1302 which is embedded in the base insulating film 1301 and formed of aluminum oxide. The transistor includes the semiconductor region 1303a, the semiconductor region 1303c, an intrinsic semiconductor region 1303b serving as a channel formation region therebetween, and a gate 1305. The width of the gate 1305 is 33 nm.

A gate insulating film 1304 is formed between the gate 1305 and the semiconductor region 1303b. In addition, a sidewall insulator 1306a and a sidewall insulator 1306b are formed on both side surfaces of the gate 1305, and an insulator 1307 is formed over the gate 1305 so as to prevent a short circuit between the gate 1305 and another wiring. The sidewall insulator has a width of 5 nm. A source 1308a and a drain 1308b are provided in contact with the semiconductor region 1303a and the semiconductor region 1303c, respectively. Note that the channel width of this transistor is 40 nm.

The transistor of FIG. 34B is the same as the transistor of FIG. 34A in that it is formed over the base insulating film 1301 and the embedded insulator 1302 formed of aluminum oxide and that it includes the semiconductor region 1303a, the semiconductor region 1303c, the intrinsic semiconductor region 1303b provided therebetween, the gate 1305 having a width of 33 nm, the gate insulating film 1304, the sidewall insulator 1306a, the sidewall insulator 1306b, the insulator 1307, the source 1308a, and the drain 1308b.

The transistor illustrated in FIG. 34A is different from the transistor illustrated in FIG. 34B in the conductivity type of semiconductor regions under the sidewall insulator 1306a and the sidewall insulator 1306b. In the transistor illustrated in FIG. 34A, the semiconductor regions under the sidewall insulator 1306a and the sidewall insulator 1306b are part of the semiconductor region 1303a having n⁺-type conductivity and part of the semiconductor region 1303c having n⁺-type conductivity, whereas in the transistor illustrated in FIG. 34B, the semiconductor regions under the sidewall insulator 1306a and the sidewall insulator 1306b are parts of the intrinsic semiconductor region 1303b. In other words, in the semiconductor layer of FIG. 34B, a region having a width of $L_{off}$ which overlaps with neither the semiconductor region 1303a (the semiconductor region 1303c) nor the gate 1305 is provided. This region is called an offset region, and the width $L_{off}$ is called an offset length. As is seen from the drawing, the offset length is equal to the width of the sidewall insulator 1306a (the sidewall insulator 1306b).

Figure 31A:
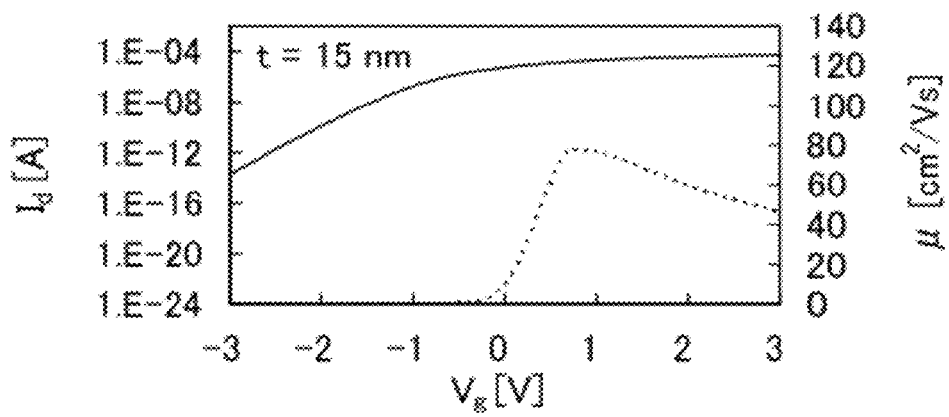
FIGS. 31A to 31C are graphs each showing dependence of drain current and mobility on gate voltage, which is obtained by simulation.
Figure 31B:
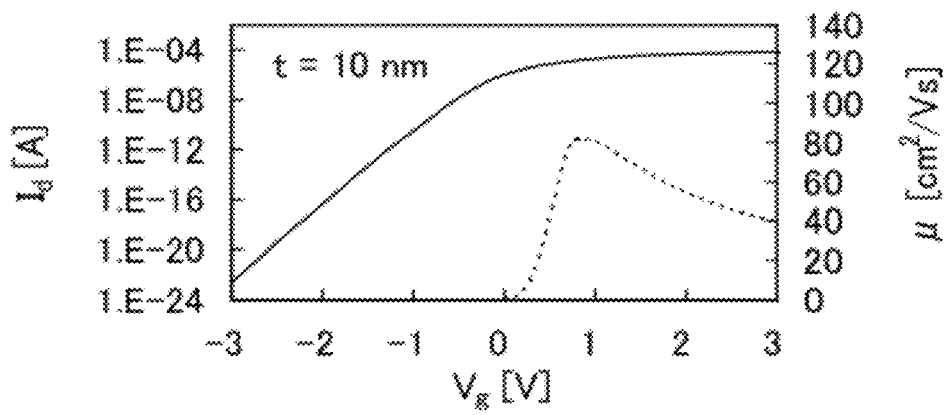
Figure 31C:
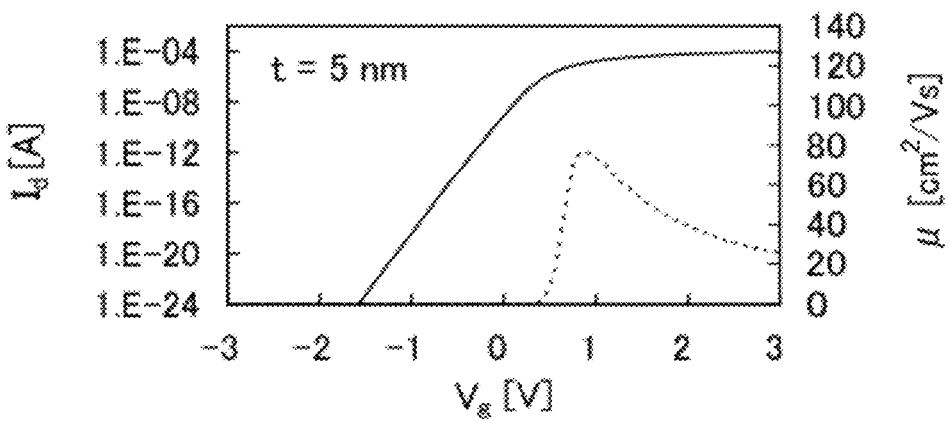

The other parameters used in calculation are as described above. For the calculation, device simulation software Sentaurus Device manufactured by Synopsys, Inc. was used. FIGS. 31A to 31C show the gate voltage ($V_g$: a potential difference between the gate and the source) dependence of the drain current ($I_d$, a solid line) and the mobility (μ, a dotted line) of the transistor having the structure illustrated in FIG. 34A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 31A shows the gate voltage dependence of the transistor in the case where the thickness t of the gate insulating film is 15 nm, FIG. 31B shows that of the transistor in the case where the thickness t of the gate insulating film is 10 nm, and FIG. 31C shows that of the transistor in the case where the thickness t of the gate insulating film is 5 nm. As the thickness t of the gate insulating film is smaller, the drain current $I_d$ (off-state current) particularly in an off state is significantly decreased. In contrast, there is no noticeable change in the peak value of the mobility μ and the drain current $I_d$ in an on state (on-state current).

Figure 32A:
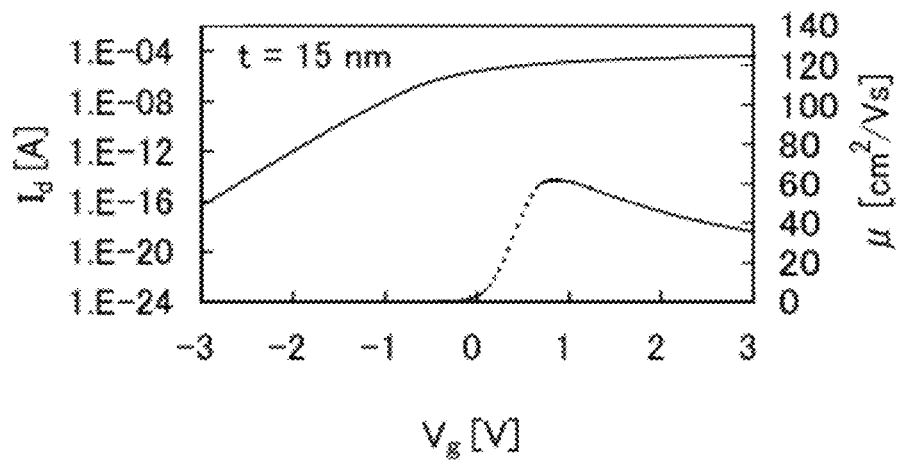
FIGS. 32A to 32C are graphs each showing dependence of drain current and mobility on gate voltage, which is obtained by simulation.
Figure 32B:
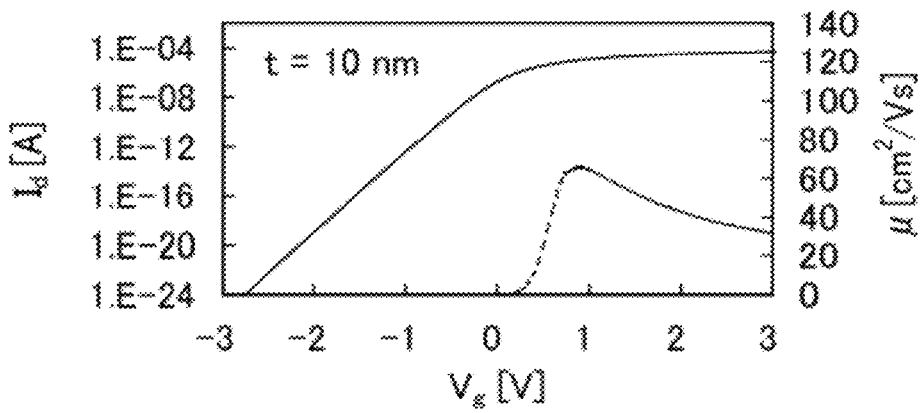
Figure 32C:
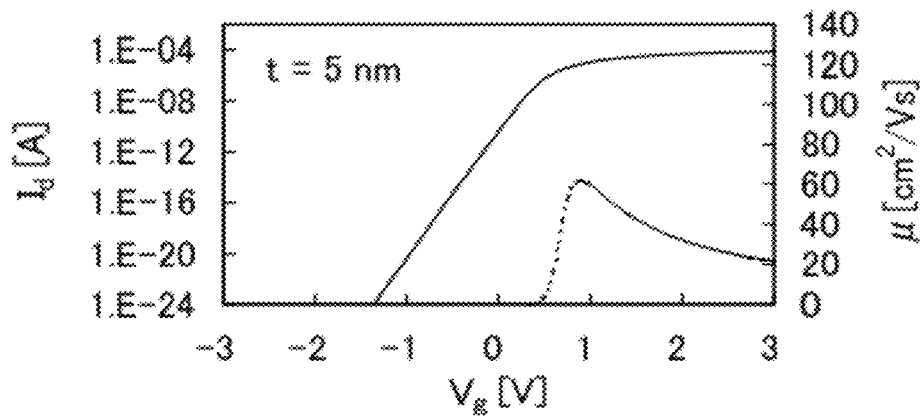

FIGS. 32A to 32C show the gate voltage $V_g$ dependence of the drain current $I_d$ (a solid line) and the mobility μ (a dotted line) of the transistor having the structure illustrated in FIG. 34B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 32A shows the gate voltage dependence of the transistor in the case where the thickness t of the gate insulating film is 15 nm, FIG. 32B shows that of the transistor in the case where the thickness t of the gate insulating film is 10 nm, and FIG. 32C shows that of the transistor in the case where the thickness t of the gate insulating film is 5 nm.

Figure 33A:
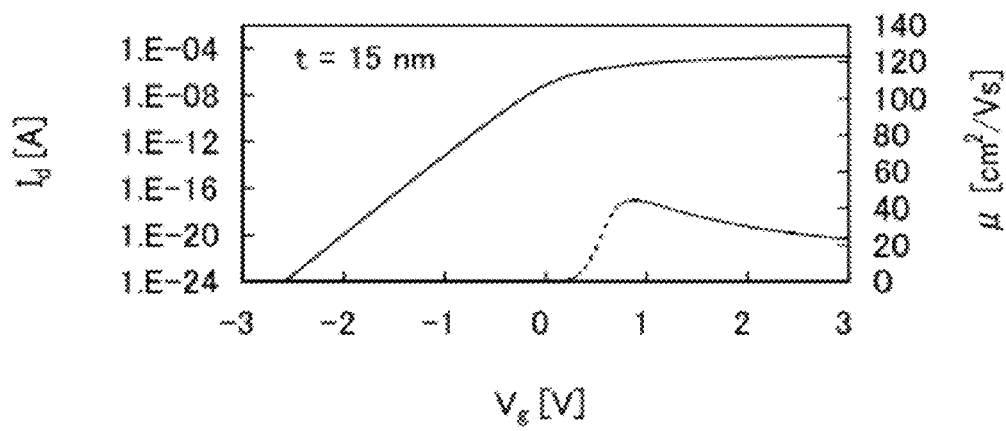
FIGS. 33A to 33C are graphs each showing dependence of drain current and mobility on gate voltage, which is obtained by simulation.
Figure 33B:
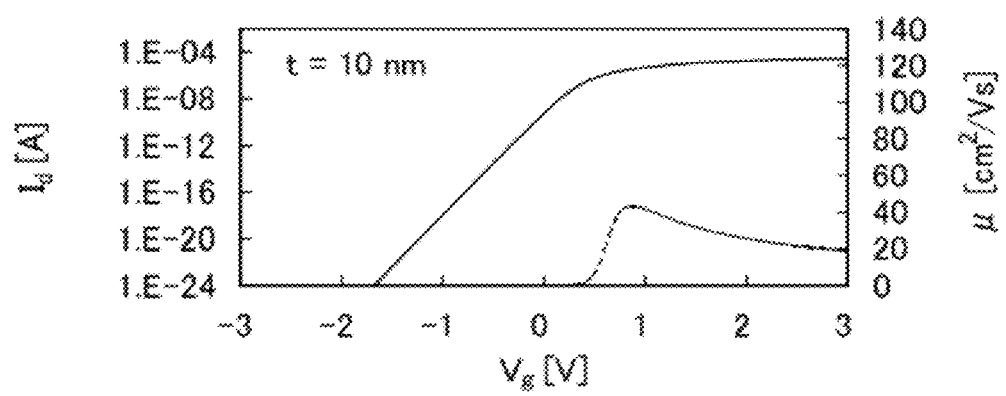
Figure 33C:
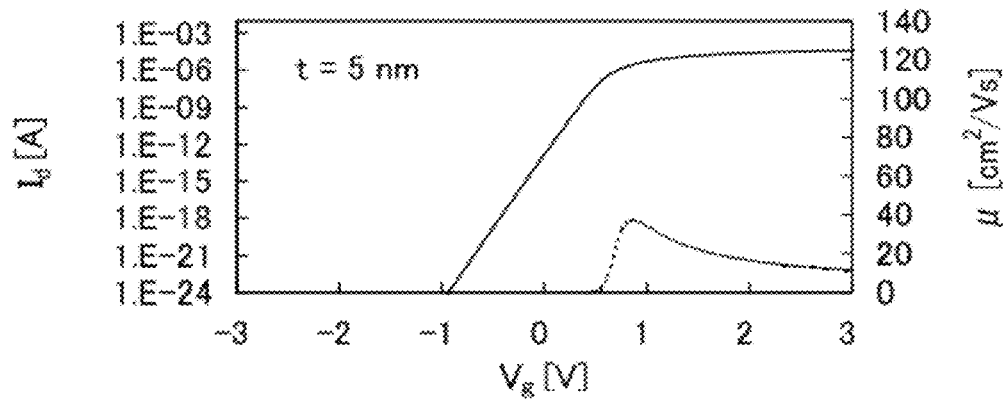
Figure 34A:
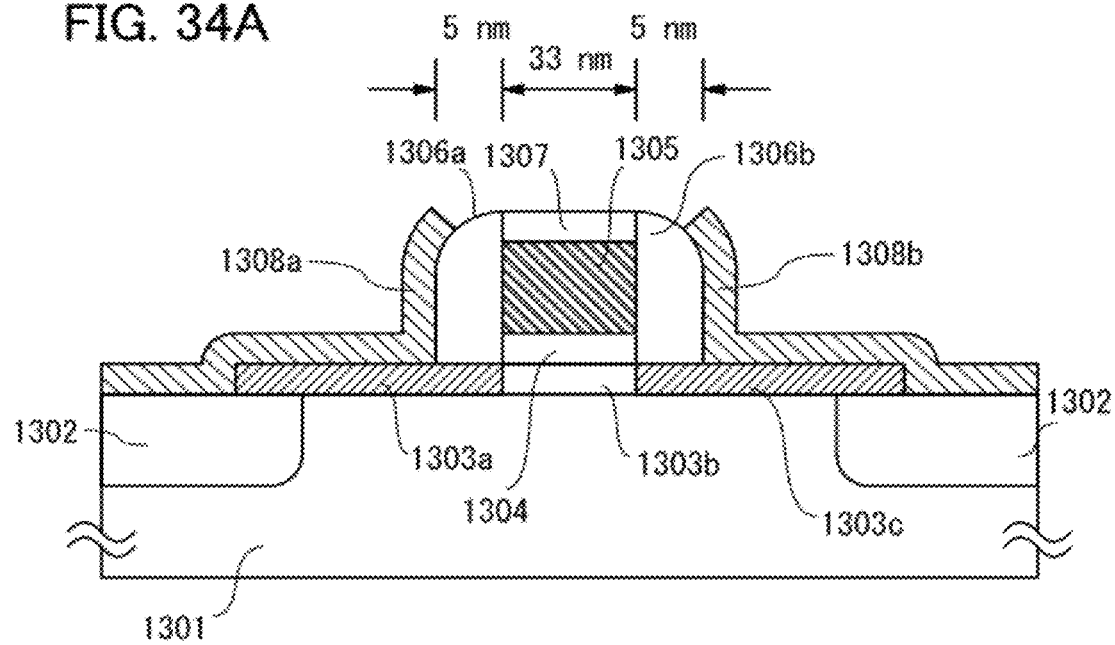
FIGS. 34A and 34B are cross-sectional views of structures of transistors used for simulation.
Figure 34B:
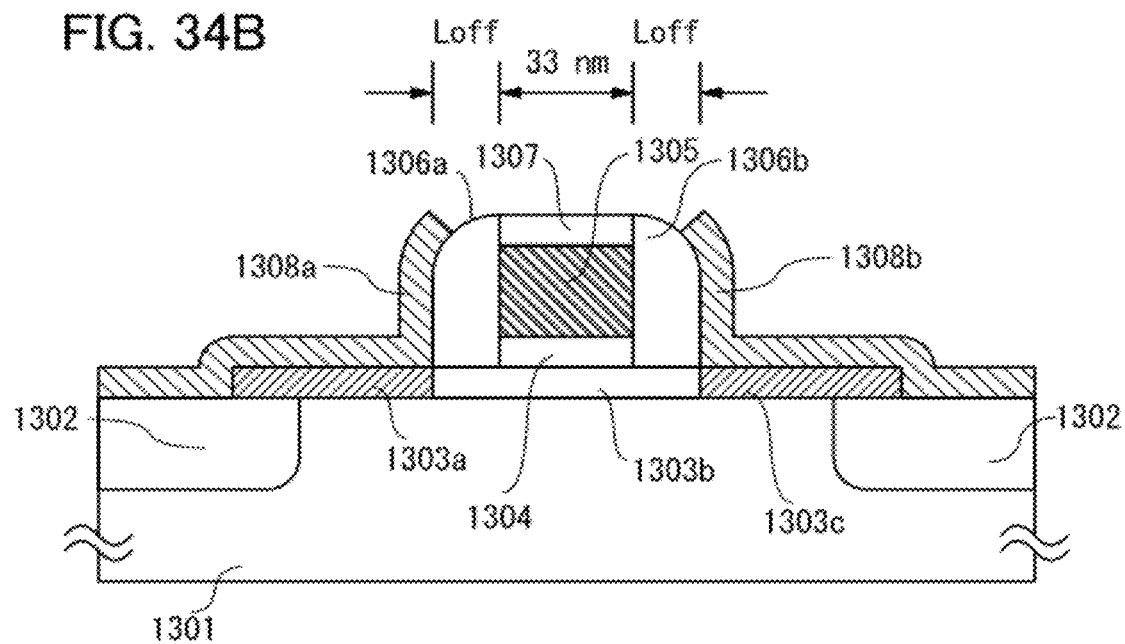

Further, FIGS. 33A to 33C show the gate voltage dependence of the drain current $I_d$ (a solid line) and the mobility μ (a dotted line) of the transistor having the structure illustrated in FIG. 34B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 33A shows the gate voltage dependence of the transistor in the case where the thickness of the gate insulating film is 15 nm, FIG. 33B shows that of the transistor in the case where the thickness of the gate insulating film is 10 nm, and FIG. 33C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 31A to 31C, approximately 60 cm²/Vs in FIGS. 32A to 32C, and approximately 40 cm²/Vs in FIGS. 33A to 33C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

Embodiment 8

In this embodiment, a transistor in which an oxide semiconductor film containing In, Sn, and Zn as main components (an example of an In—Sn—Zn-based oxide semiconductor film) is used for a channel formation region will be described.

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element contained in a composition at 5 atomic % or more.

When the oxide semiconductor film containing In, Sn, and Zn as main components is formed while the substrate is intentionally heated, the mobility of the transistor can be improved. Further, the threshold voltage of the transistor can be positively shifted to make the transistor normally off.

Figure 35A:
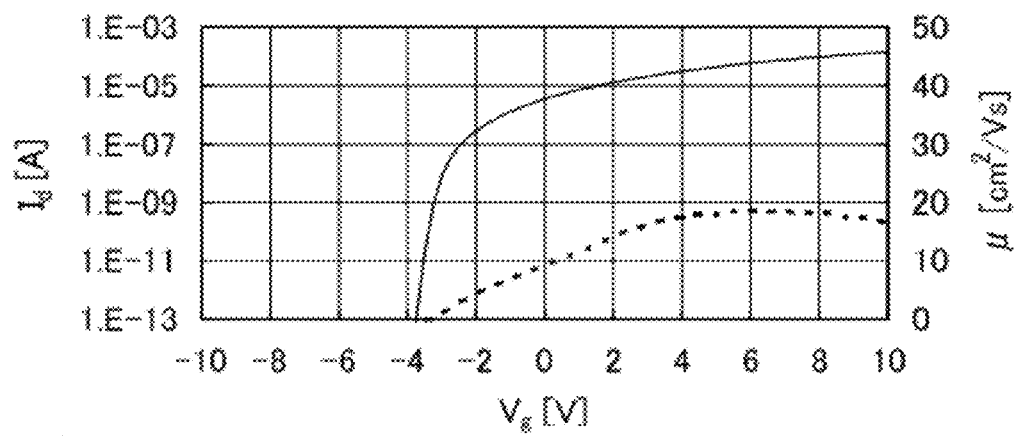
FIGS. 35A to 35C are graphs each showing electric characteristics of a transistor including an oxide semiconductor film.
Figure 35B:
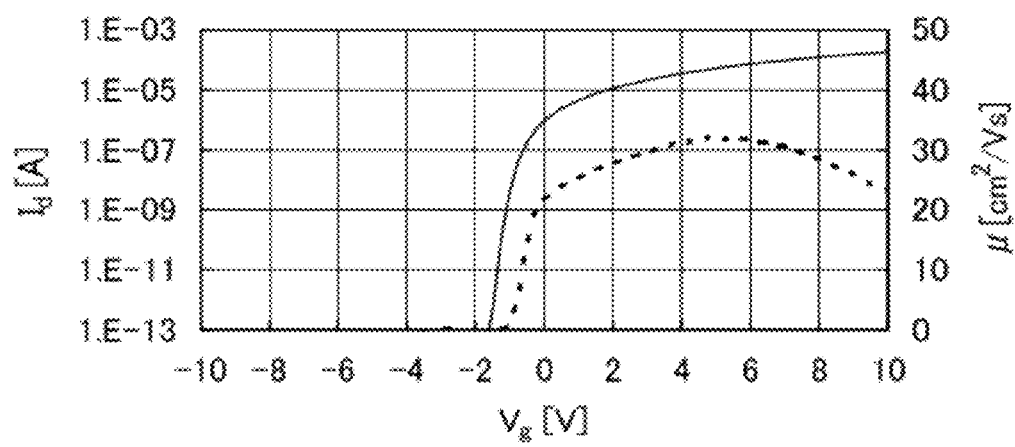
Figure 35C:
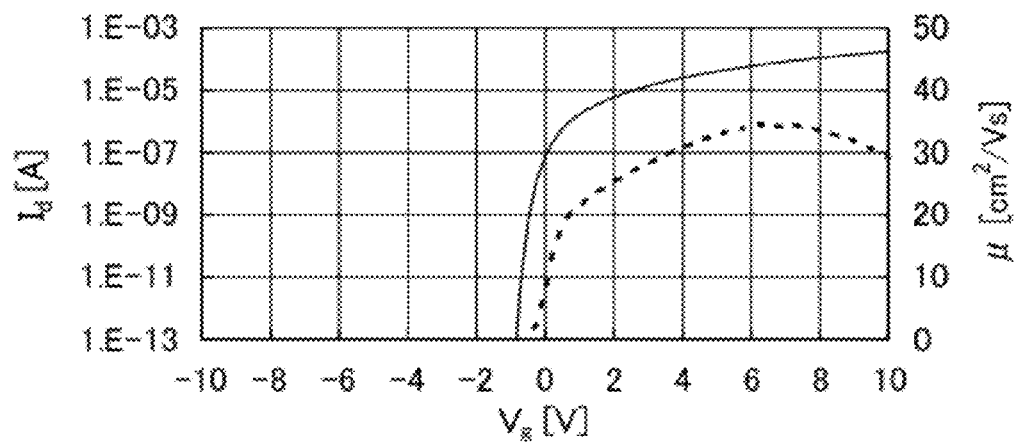

As an example, FIGS. 35A to 35C are graphs each showing electric characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 35A is a graph showing electric characteristics of a transistor whose oxide semiconductor film containing In, Sn, and Zn as main components was formed by a sputtering method without heating a substrate intentionally. The mobility of the transistor is 18.8 cm$^2$/Vs. On the other hand, when the oxide semiconductor film containing In, Sn, and Zn as main components is formed while heating the substrate intentionally, the mobility can be improved. FIG. 35B shows characteristics of a transistor whose oxide semiconductor film containing In, Sn, and Zn as main components was formed while heating a substrate at 200° C. The mobility of the transistor is 32.2 cm$^2$/Vsec.

The mobility can be further improved by performing heat treatment after formation of the oxide semiconductor film containing In, Sn, and Zn as main components. FIG. 35C shows characteristics of a transistor whose oxide semiconductor film containing In, Sn, and Zn as main components was formed by a sputtering method at 200° C. and then subjected to heat treatment at 650° C. The mobility of the transistor is 34.5 cm$^2$/Vs.

The intentional heating of the substrate is expected to have an effect of reducing moisture taken into the oxide semiconductor film during the formation by a sputtering method. Further, the heat treatment after film formation enables hydrogen, a hydroxyl group, or moisture to be released and removed from the oxide semiconductor film. In this manner, the mobility can be improved. Such an improvement in mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture contained in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 35A and 35B.

Note that the threshold voltage can also be controlled by changing the ratio of In, Sn, and Zn; when the composition ratio of In, Sn, and Zn is 2:1:3, a normally-off transistor is expected to be formed. In addition, when an oxide semiconductor film is formed using a target of an In—Sn—Zn-based oxide with an atomic ratio of In:Sn:Zn=1:1:1, 2:1:3, 1:2:2, or 20:45:35, a polycrystal or a CAAC is likely to be formed.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT (bias-temperature) test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ represents the drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating films was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 36A:
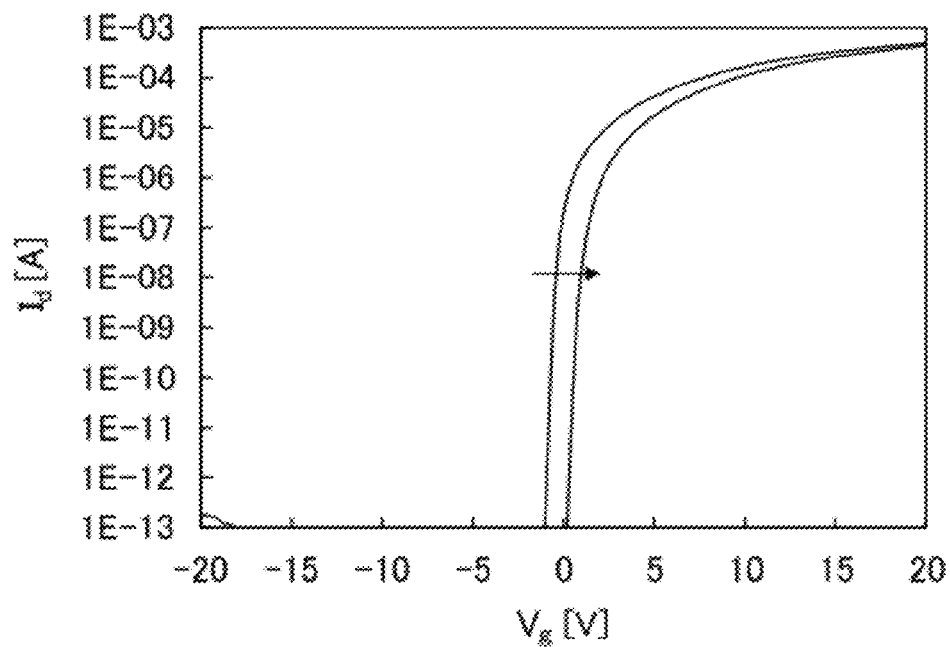
FIGS. 36A and 36B are graphs each showing $V_g$-$I_d$ characteristics of a transistor of Sample 1 which has been subjected to a BT test.
Figure 36B:
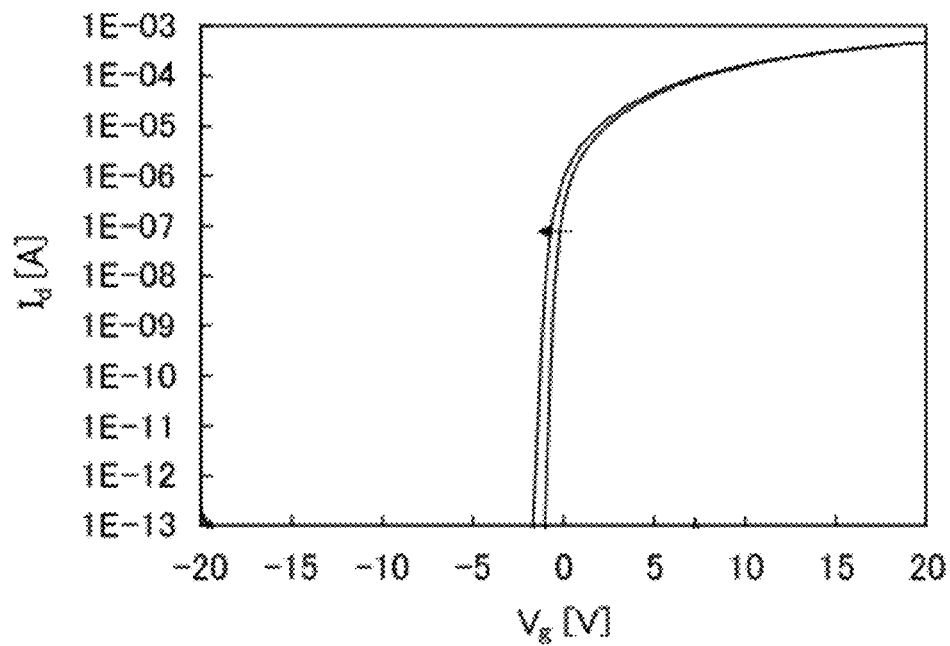
Figure 37A:
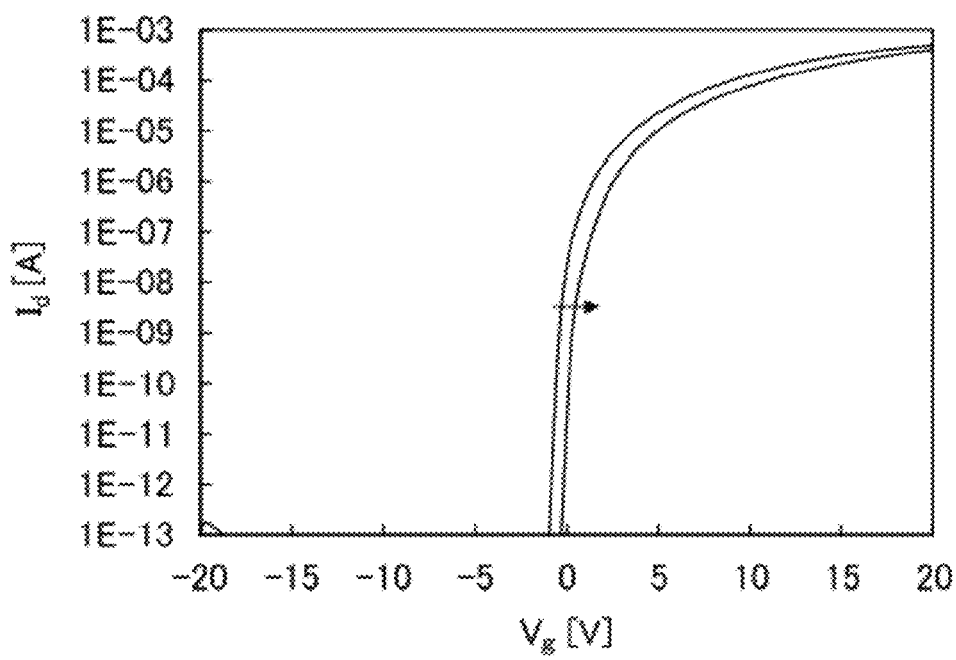
FIGS. 37A and 37B are graphs each showing $V_g$-$I_d$ characteristics of a transistor of Sample 2 which has been subjected to a BT test.
Figure 37B:
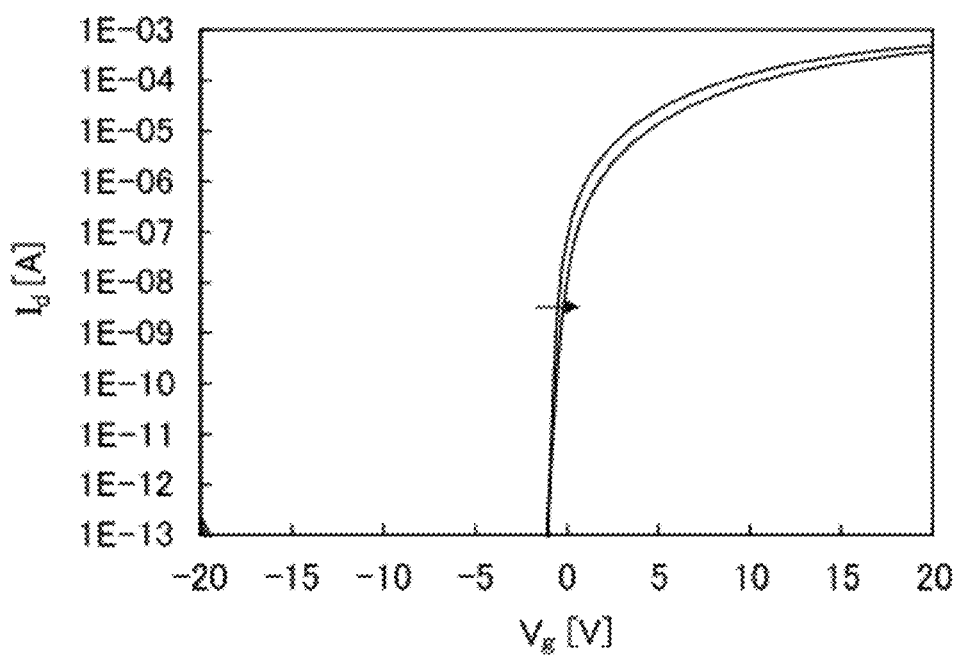

FIGS. 36A and 36B show a result of the positive BT test of Sample 1 and a result of the negative BT test of Sample 1, respectively. FIGS. 37A and 37B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is contained in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by a sputtering method using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide semiconductor film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

First, an In—Sn—Zn-based oxide semiconductor film with a thickness of 100 nm was formed over a quartz substrate that had been subjected to dehydrogenation treatment.

The In—Sn—Zn-based oxide semiconductor film was formed with a sputtering apparatus with a power of 100 W (DC) in an oxygen atmosphere. A target of an In—Sn—Zn-based oxide with an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 38:
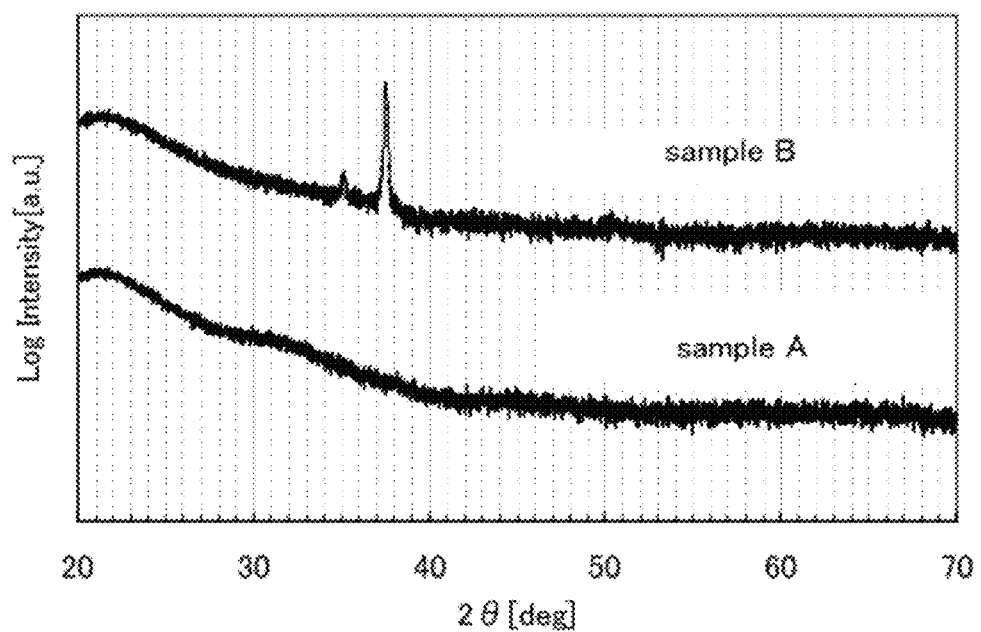
FIG. 38 is a graph showing XRD spectra of Sample A and Sample B.

FIG. 38 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as an impurity which generates a donor from the oxide semiconductor, whereby a normally-off transistor can be obtained. The high purification of an oxide semiconductor enables the off-state current of the transistor to be 1 aA/µm or lower. Here, the unit of the off-state current is used to indicate current per micrometer of a channel width.

Figure 39:
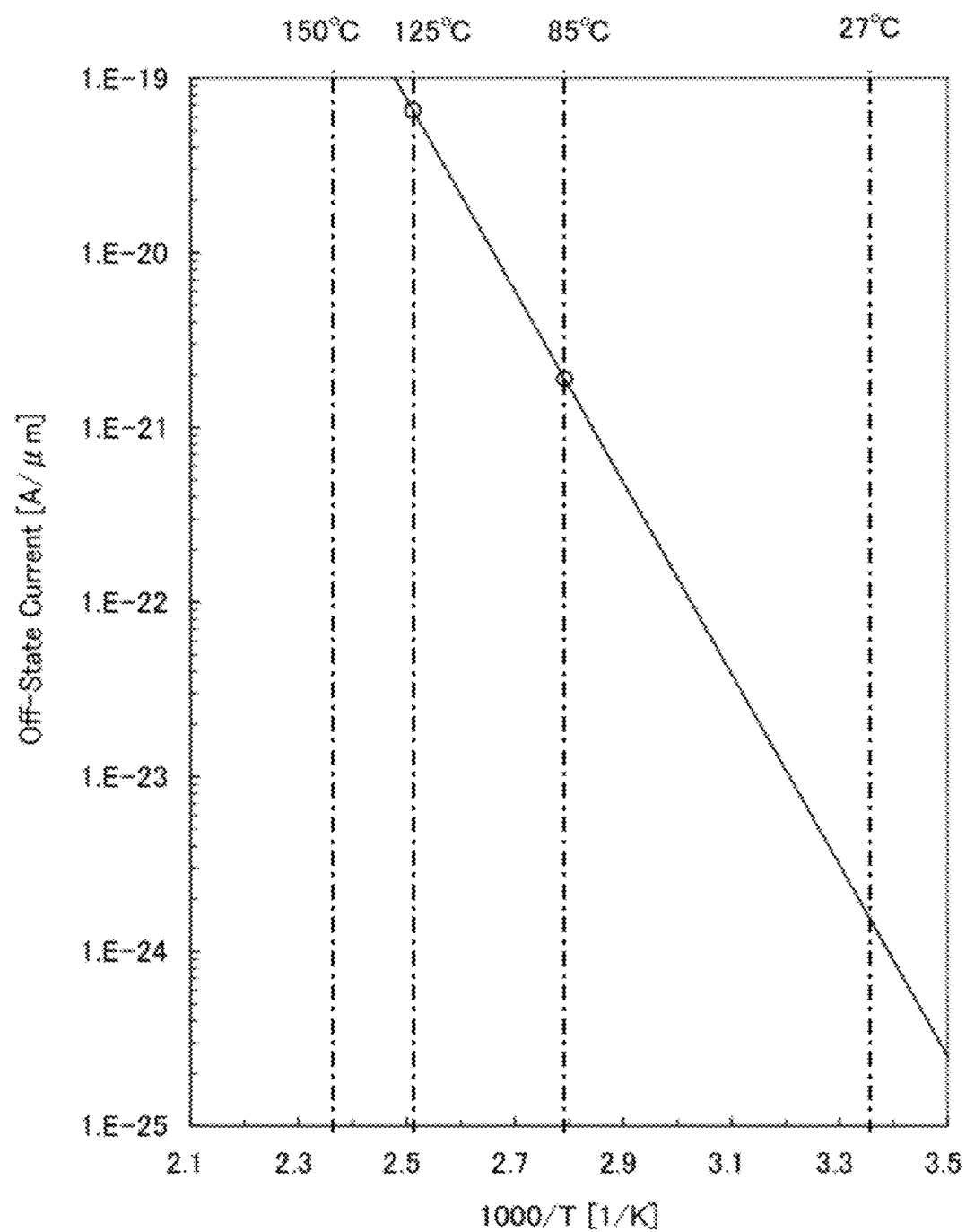
FIG. 39 is a graph showing relation between off-state current and substrate temperature in measurement of a transistor.

FIG. 39 shows a relation between the off-state current of a transistor and the inverse of substrate temperature (absolute temperature) at measurement of the off-state current. In FIG. 39, the horizontal axis represents a value (1000/T) obtained by multiplying an inverse of substrate temperature at measurement by 1000. As shown in FIG. 39, the off-state current can be 1 aA/µm ($1 \times 10^{-18}$ A/µm) or lower, 100 zA/µm ($1 \times 10^{-19}$ A/µm) or lower, and 1 zA/µm ($1 \times 10^{-21}$ A/µm) or lower when the substrate temperature is 125° C., 85° C., and room temperature (27° C.), respectively. Preferably, the off-state current can be 0.1 aA/µm ($1 \times 10^{-19}$ A/µm) or lower, 10 zA/µm ($1 \times 10^{-20}$ A/µm) or lower, and 0.1 zA/µm ($1 \times 10^{-22}$ A/µm) or lower at 125° C., 85° C., and room temperature, respectively.

Note that in order to prevent hydrogen and moisture from being contained in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor formed using Sample B, on which heat treatment at 650° C. was performed after formation of the oxide semiconductor film, was evaluated.

Figure 43A:
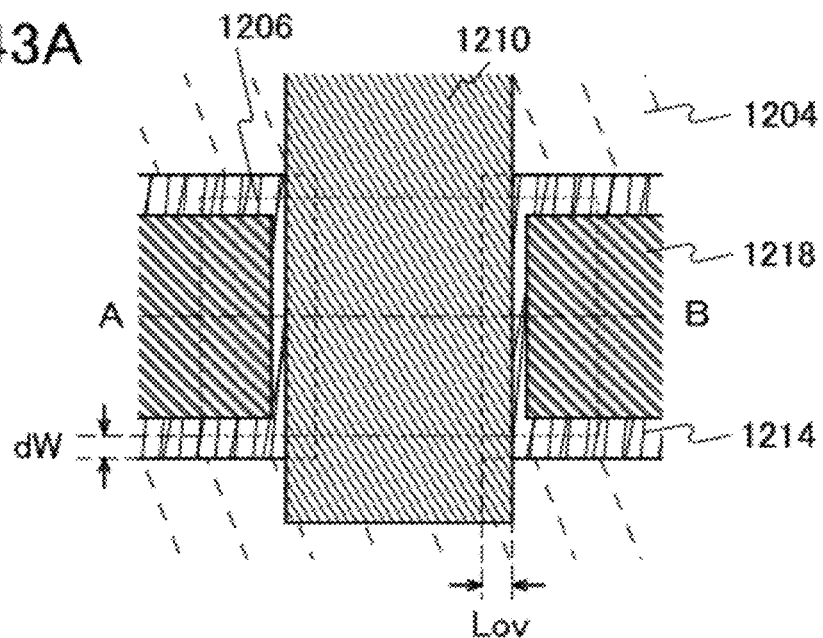
FIGS. 43A and 43B are views illustrating an example of a structure of a transistor.
Figure 43B:
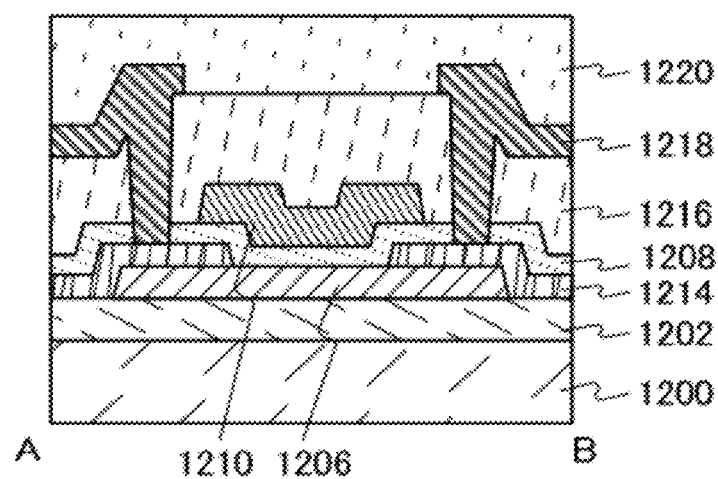

For the transistor used for the measurement, a transistor having a structure in FIGS. 43A and 43B can be referred to. FIG. 43A is a top-plan view of the transistor. FIG. 43B is a cross-sectional view along dashed-dotted line A-B in FIG. 43A. The transistor has a channel length L of 3 µm, a channel width W of 10 µm, Lov of 0 µm, and dW of 0 µm. Note that $V_d$ was set to 10 V. Note that the substrate temperature was −40° C., −25° C., 25° C., 75° C., 125° C., and 150° C. In the transistor, the width of a portion where a gate electrode 1210 overlaps with one of a pair of electrodes 1214 is referred to as Lov, and the width of a portion of the pair of electrodes 1214, which does not overlap with an oxide semiconductor film 1206, is referred to as dW.

Figure 40:
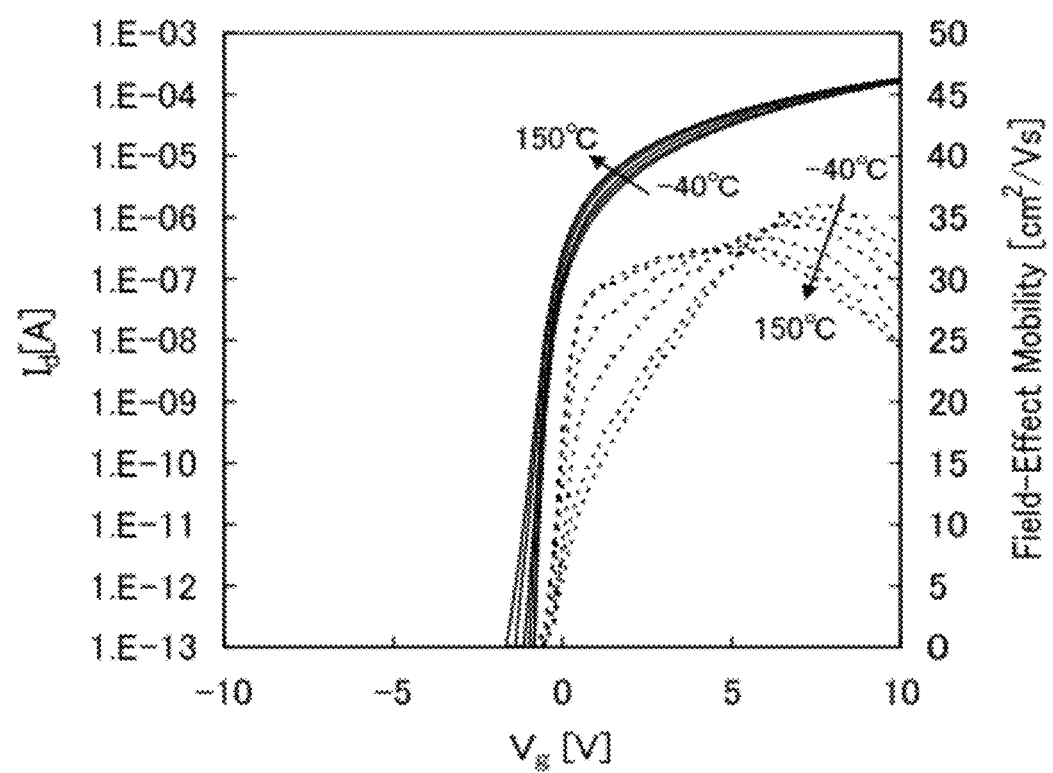
FIG. 40 is a graph showing dependence of $I_d$ and mobility on $V_g$.
Figure 41A:
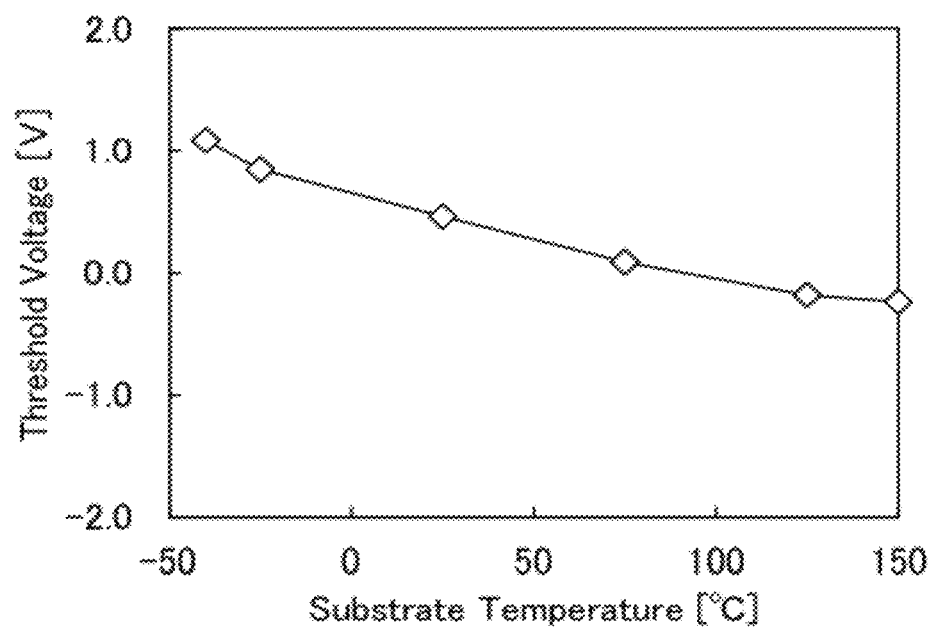
FIG. 41A is a graph showing relation between substrate temperature and threshold voltage.

FIG. 40 shows the $V_g$ dependence of $I_d$ (a solid line) and mobility (a dotted line). FIG. 41A shows a relation between the substrate temperature and the threshold voltage, and FIG. 41B shows a relation between the substrate temperature and the mobility.

From FIG. 41A, it is found that the threshold voltage gets lower as the substrate temperature increases. Note that the threshold voltage is decreased from 1.09 V to −0.23 V in the range from −40° C. to 150° C.

Figure 41B:
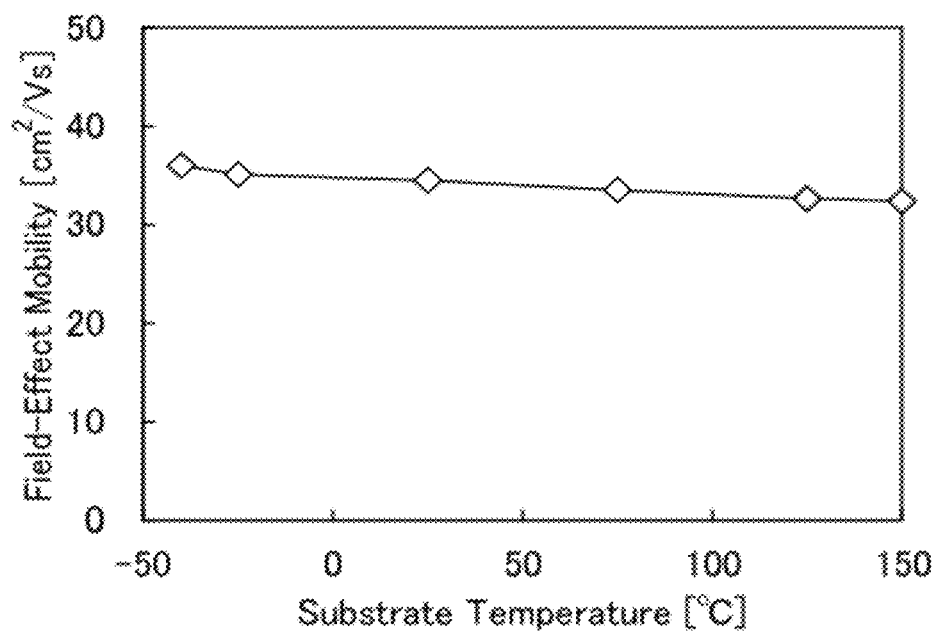
FIG. 41B is a graph showing relation between substrate temperature and mobility.

From FIG. 41B, it is found that the mobility gets lower as the substrate temperature increases. Note that the mobility is decreased from 36 $cm^2$/Vs to 32 $cm^2$/Vs in the range from −40° C. to 150° C. Thus, it is found that variation in electric characteristics is small in the above temperature range.

In a transistor in which such an oxide semiconductor containing In, Sn, and Zn as main components is used as a channel formation region, a mobility of 30 cm$^2$Ns or higher, preferably 40 cm$^2$/Vs or higher, further preferably 60 cm$^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in appropriate combination with any of the other embodiments.

Embodiment 9

In this embodiment, a transistor which includes an oxide semiconductor film and has a structure different from those in Embodiments 4 and 5 will be described. As an oxide semiconductor included in the oxide semiconductor film, either an oxide semiconductor containing In, Sn, and Zn (In—Sn—Zn-based oxide semiconductor) or any of the other oxide semiconductors described in the other embodiments may be used.

Figure 42A:
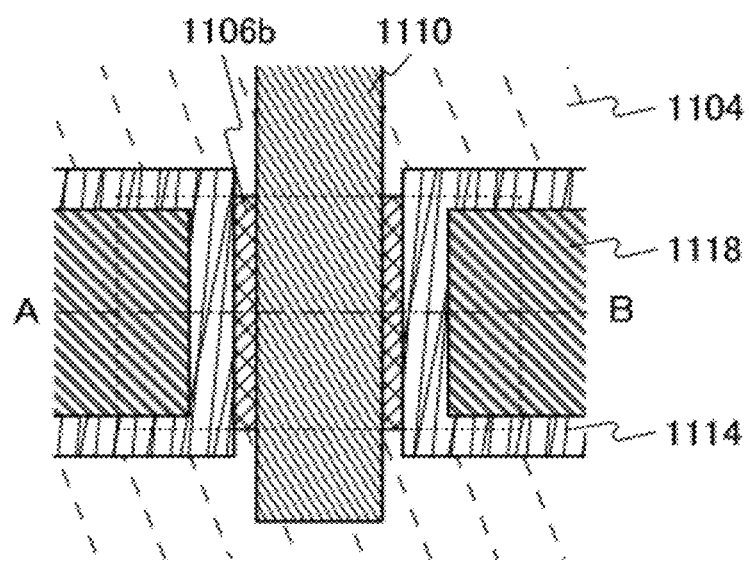
FIGS. 42A and 42B are views illustrating an example of a structure of a transistor.
Figure 42B:
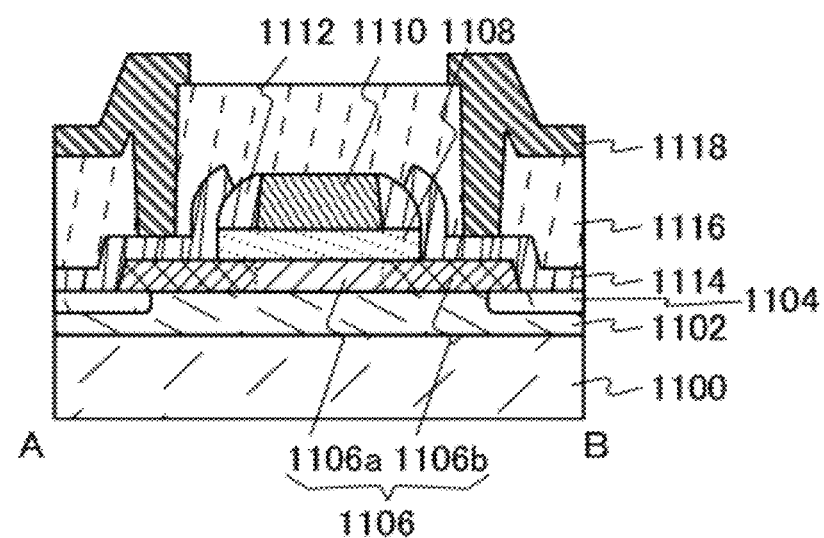

FIGS. 42A and 42B are a top view and a cross-sectional view of a coplanar transistor having a top-gate top-contact structure. FIG. 42A is the top view of the transistor. FIG. 42B is a cross section A-B along dashed-dotted line A-B in FIG. 42A.

The transistor illustrated in FIG. 42B includes a substrate 1100; a base insulating film 1102 provided over the substrate 1100; a protective insulating film 1104 provided in the periphery of the base insulating film 1102; an oxide semiconductor film 1106 provided over the base insulating film 1102 and the protective insulating film 1104 and including a high-resistance region 1106a and low-resistance regions 1106b; a gate insulating film 1108 provided over the oxide semiconductor film 1106; a gate electrode 1110 provided to overlap with the oxide semiconductor film 1106 with the gate insulating film 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

This embodiment can be implemented in appropriate combination with any of the other embodiments.

Embodiment 10

In this embodiment, a transistor which includes an oxide semiconductor film and has a structure different from those in Embodiments 4, 5, and 9 will be described. Note that although in this embodiment, an oxide semiconductor containing In, Sn, and Zn (In—Sn—Zn-based oxide semiconductor) is used as an oxide semiconductor included in the oxide semiconductor film, any of the other oxide semiconductors described in the other embodiments may be used.

FIGS. 43A and 43B are a top view and a cross-sectional view, which illustrate a structure of a transistor manufactured in this example. FIG. 43A is the top view of the transistor. FIG. 43B is a cross-sectional view along dashed-dotted line A-B in FIG. 43A.

The transistor illustrated in FIG. 43B includes a substrate 1200; a base insulating film 1202 provided over the substrate 1200; an oxide semiconductor film 1206 provided over the base insulating film 1202; a pair of electrodes 1214 in contact with the oxide semiconductor film 1206; a gate insulating film 1208 provided over the oxide semiconductor film 1206 and the pair of electrodes 1214; a gate electrode 1210 provided to overlap with the oxide semiconductor film 1206 with the gate insulating film 1208 positioned therebetween; an interlayer insulating film 1216 provided to cover the gate insulating film 1208 and the gate electrode 1210; wirings 1218 connected to the pair of electrodes 1214 through openings formed in the interlayer insulating film 1216; and a protective film 1220 provided to cover the interlayer insulating film 1216 and the wirings 1218.

As the substrate 1200, a glass substrate can be used. As the base insulating film 1202, a silicon oxide film can be used. As the oxide semiconductor film 1206, an In—Sn—Zn-based oxide semiconductor film can be used. As the pair of electrodes 1214, a tungsten film can be used. As the gate insulating film 1208, a silicon oxide film can be used. The gate electrode 1210 can have a stacked structure of a tantalum nitride film and a tungsten film. The interlayer insulating film 1216 can have a stacked structure of a silicon oxynitride film and a polyimide film. The wirings 1218 can each have a stacked structure in which a titanium film, an aluminum film, and a titanium film are formed in this order. As the protective film 1220, a polyimide film can be used.

Note that in the transistor having the structure illustrated in FIG. 43A, the width of a portion where the gate electrode 1210 overlaps with one of the pair of electrodes 1214 is referred to as Lov. Similarly, the width of a portion of the pair of electrodes 1214, which does not overlap with the oxide semiconductor film 1206, is referred to as dW.

This embodiment can be implemented in appropriate combination with any of the other embodiments.

Embodiment 11

In this embodiment, arrangement of a panel and a backlight in a semiconductor display device according to one embodiment of the present invention will be described.

Figure 25:
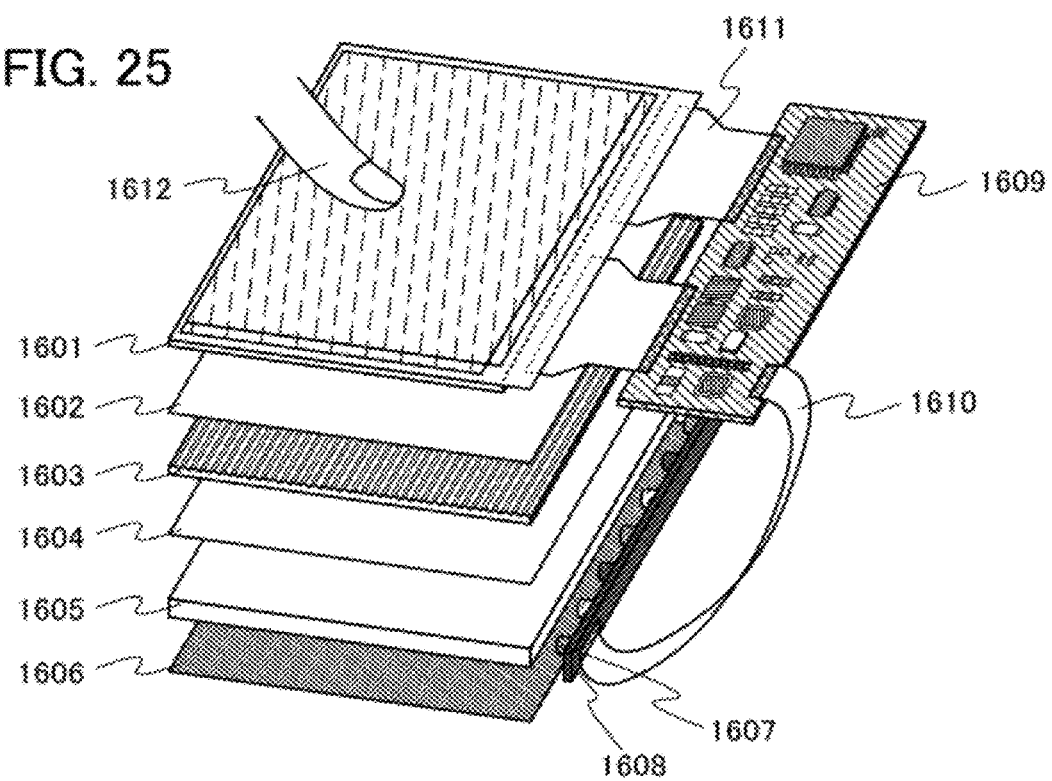
FIG. 25 is a perspective view illustrating a structure of a semiconductor display device.

FIG. 25 is an example of a perspective view illustrating a structure of a semiconductor display device according to one embodiment of the present invention. The semiconductor display device illustrated in FIG. 25 includes a panel 1601 in which a pixel including a display element and a photosensor is formed between a pair of substrates, a first diffuser plate 1602, a prism sheet 1603, a second diffuser plate 1604, a light guide plate 1605, a reflective plate 1606, a backlight 1608 including a plurality of light sources 1607, and a circuit board 1609.

The panel 1601, the first diffuser plate 1602, the prism sheet 1603, the second diffuser plate 1604, the light guide plate 1605, and the reflective plate 1606 are sequentially stacked. The light sources 1607 are provided at an end portion of the light guide plate 1605. Light from the light sources 1607 diffused into the light guide plate 1605 is uniformly delivered to the panel 1601 from the counter substrate side with the help of the first diffuser plate 1602, the prism sheet 1603, and the second diffuser plate 1604.

Although the first diffusing plate 1602 and the second diffusing plate 1604 are used in this embodiment, the number of diffusing plates is not limited to two. The number of diffusing plates may be one, or may be three or more. It is necessary that the diffuser plate be provided between the light guide plate 1605 and the panel 1601. Therefore, the diffuser plate may be provided only on the panel 1601 side with respect to the prism sheet 1603, or may be provided only on the light guide plate 1605 side with respect to the prism sheet 1603.

Further, the shape of the cross section of the prism sheet 1603 which is illustrated in FIG. 25 is not limited to a serrate shape; the cross section can have any shape with which light from the light guide plate 1605 can be gathered to the panel 1601 side.

The circuit board 1609 is provided with a circuit for generating or processing various signals to be input to the panel 1601, a circuit for processing various signals to be output from the panel 1601, and the like. In addition, in FIG. 25, the circuit board 1609 and the panel 1601 are connected to each other through an FPC (flexible printed circuit) 1611. Note that the above circuits may be connected to the panel 1601 by a chip on glass (COG) method, or part of the above circuits may be connected to the FPC 1611 by a chip on film (COF) method.

FIG. 25 illustrates an example in which a control circuit for controlling driving of the light sources 1607 is provided for the circuit board 1609, and the control circuit and the light sources 1607 are connected to each other through the FPC 1610. However, the above control circuit may be formed over the panel 1601, and in that case, the panel 1601 and the light sources 1607 are made to be connected to each other through an FPC or the like.

As the light source 1607, a light-emitting element such as an LED or an OLED can be used.

Although FIG. 25 illustrates an edge-light type light source in which the light sources 1607 are provided at an end portion of the panel 1601, a semiconductor display device according to one embodiment of the present invention may be a direct-below type in which the light sources 1607 are provided directly below the panel 1601.

For example, when a finger 1612 which is an object is brought closer to the panel 1601, part of light that has been emitted from the backlight 1608 and passed through the panel 1601 reflects off the finger 1612 and enters the panel 1601. Color positional data of the finger 1612 which is the object can be obtained by sequentially turning on the light sources 1607 that correspond to individual colors and obtaining positional data of every color.

This embodiment can be implemented in appropriate combination with any of the other embodiments.

Example 1

A solid-state image sensing device or a semiconductor display device, according to one embodiment of the present invention, has a feature that a detectable area can be widen to reduce unevenness of distribution of the detectable area, so that exact positional data of an object can be easily obtained without contact. Further, a solid-state image sensing device or a semiconductor display device, according to one embodiment of the present invention, has a feature that with the above structure, deterioration in quality of a panel according to the use frequency, such as adhesion of dirt to a surface of the panel or a scratch mark on the surface of the panel, can be suppressed and fatigue of a user can be not so severe. Therefore, an electronic device including a solid-state image sensing device or a semiconductor display device, according to one embodiment of the present invention, is user-friendly, and the quality of the electronic device is not likely to be deteriorated.

A solid-state image sensing device or a semiconductor display device, according to one embodiment of the present invention, can be used for a display device, a notebook personal computer, or an image reproducing device provided with recording media (typically, a device which reproduces the content of recording media such as a digital versatile disc (DVD) and has a display for displaying the reproduced image). Other examples of electronic devices each of which can be provided with a solid-state image sensing device or a semiconductor display device, according to one embodiment of the present invention, include a mobile phones, portable game machines, portable information terminals, electronic books, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like. FIGS. 26A to 26E illustrate specific examples of these electronic devices.

Figure 26A:
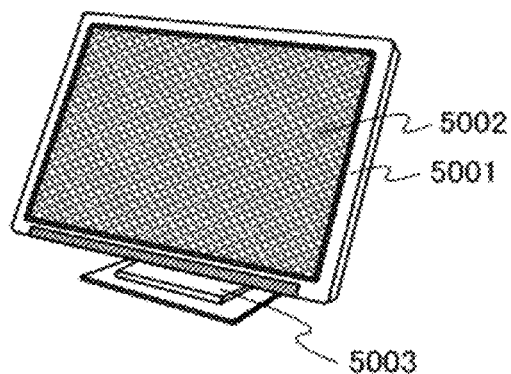
FIGS. 26A to 26E are views each illustrating an electronic device.

FIG. 26A illustrates a display device including a housing 5001, a display portion 5002, a supporting base 5003, and the like. A semiconductor display device according to one embodiment of the present invention can be used for the display portion 5002. When a semiconductor display device according to one embodiment of the present invention is used for the display portion 5002, a display device which is user-friendly and has quality which is not likely to be deteriorated can be provided. Note that a display device includes in its category all display devices for displaying information, such as display devices for personal computers, for receiving television broadcasts, and for displaying advertisements.

Figure 26B:
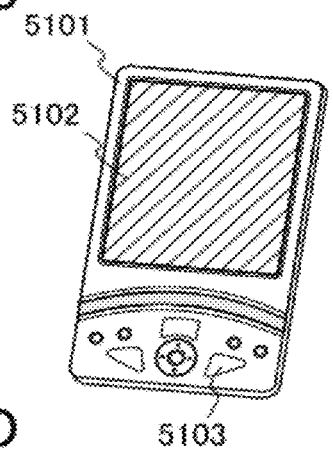

FIG. 26B illustrates a portable information terminal including a housing 5101, a display portion 5102, operation keys 5103, and the like. A semiconductor display device according to one embodiment of the present invention can be used for the display portion 5102. When a semiconductor display device according to one embodiment of the present invention is used for the display portion 5102, a portable information terminal which is user-friendly and has quality which is not likely to be deteriorated can be provided.

Figure 26C:
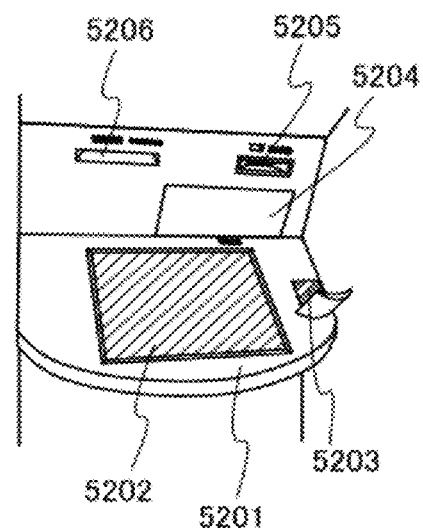

FIG. 26C illustrates an automated teller machine including a housing 5201, a display portion 5202, a coin slot 5203, a paper money slot 5204, a card slot 5205, a passbook slot 5206, and the like. A semiconductor display device according to one embodiment of the present invention can be used for the display portion 5202. When a semiconductor display device according to one embodiment of the present invention is used for the display portion 5202, an automated teller machine which is user-friendly and has quality which is not likely to be deteriorated can be provided. An automated teller machine including a semiconductor display device according to one embodiment of the present invention, can read biometric information such as a finger print, a face, a handprint, a palm print, a pattern of a hand vein, or an iris which is used for biometric authentication with higher accuracy, due to FS operation. Therefore, in biometric authentication, a false non-match rate which is false recognition of a person to be identified as a different person and a false acceptance rate which is false recognition of a different person as a person to be identified can be suppressed.

Figure 26D:
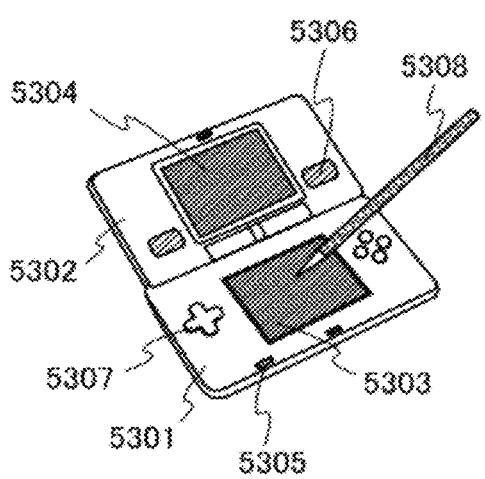

FIG. 26D illustrates a portable game machine including a housing 5301, a housing 5302, a display portion 5303, a display portion 5304, a microphone 5305, speakers 5306, an operation key 5307, a stylus 5308, and the like. A semiconductor display device according to one embodiment of the present invention can be used for the display portion 5303 or the display portion 5304. When a semiconductor display device according to one embodiment of the present invention is used for the display portion 5303 or the display portion 5304, a portable game machine which is user-friendly and has quality which is not likely to be deteriorated can be provided. Note that although the portable game machine illustrated in FIG. 26D includes two display portions, the display portion 5303 and the display portion 5304, the number of display portions included in the portable game machine is not limited to two.

Figure 26E:
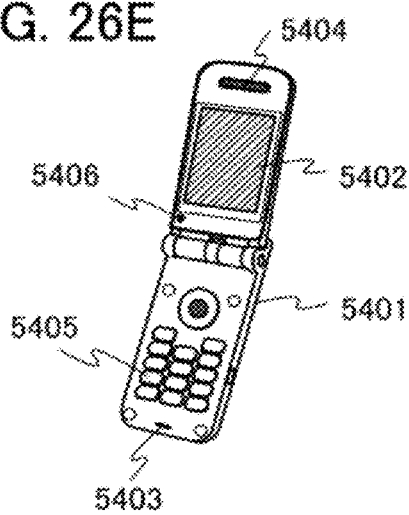

FIG. 26E illustrates a mobile phone including a housing 5401, a display portion 5402, an audio input portion 5403, an audio output portion 5404, operation keys 5405, a light-receiving portion 5406, and the like. Light received in the light-receiving portion 5406 is converted into electrical signals, whereby external images can be loaded. A semiconductor display device according to one embodiment of the present invention can be used for the display portion 5402. When a semiconductor display device according to one embodiment of the present invention is used for the display portion 5402, a mobile phone which is user-friendly and has quality which is not likely to be deteriorated can be provided. A solid-state image sensing device according to one embodiment of the present invention can be used to convert light received by the light-receiving portion 5406 into electrical signals. When a solid-state image sensing device according to one embodiment of the present invention is used, a mobile phone which is user-friendly and has quality which is not likely to be deteriorated can be provided. Alternatively, when a solid-state image sensing device according to one embodiment of the present invention is used, power consumption of the mobile phone can be reduced.

This embodiment can be implemented in appropriate combination with any of the other embodiments.

This application is based on Japanese Patent Application serial no. 2010-177721 filed with the Japan Patent Office on Aug. 6, 2010 and Japanese Patent Application serial no. 2011-108646 filed with the Japan Patent Office on May 13, 2011, the entire contents of which are hereby incorporated by reference.

What is claimed is:

1. A semiconductor device comprising:
    a light-blocking film comprising a first opening, a second opening, and a third opening;
    a first photosensor comprising a first photodiode;
    a second photosensor comprising a second photodiode;
    a third photosensor comprising a third photodiode;
    a fourth photosensor comprising a fourth photodiode;
    a fifth photosensor comprising a fifth photodiode; and
    a sixth photosensor comprising a sixth photodiode,
    wherein the first photodiode corresponds to the first opening,
    wherein the second photodiode corresponds to the second opening,
    wherein the third photodiode corresponds to the third opening,
    wherein the first opening, the second opening, and the third opening are arranged in this order in a first direction,
    wherein an area of the first opening is larger than an area of the second opening,
    wherein the area of the second opening is larger than an area of the third opening,
    wherein the light-blocking film comprises a fourth opening, a fifth opening, and a sixth opening,
    wherein the fourth photodiode corresponds to the fourth opening,
    wherein the fifth photodiode corresponds to the fifth opening,
    wherein the sixth photodiode corresponds to the sixth opening,
    wherein the fourth opening, the fifth opening, and the sixth opening are arranged in this order in a second direction,
    wherein an area of the fourth opening is larger than an area of the fifth opening,
    wherein the area of the fifth opening is larger than an area of the sixth opening, and
    wherein the first direction and the second direction are parallel and opposite to each other.

2. The semiconductor device according to claim 1, further comprising:
    a seventh photosensor comprising a seventh photodiode;
    an eighth photosensor comprising an eighth photodiode; and
    a ninth photosensor comprising a ninth photodiode,
    wherein the light-blocking film comprises a seventh opening, an eighth opening, and a ninth opening,
    wherein the seventh photodiode corresponds to the seventh opening,
    wherein the eighth photodiode corresponds to the eighth opening,
    wherein the ninth photodiode corresponds to the ninth opening,
    wherein the seventh opening, the eighth opening, and the ninth opening are arranged in this order in a third direction,
    wherein an area of the seventh opening is larger than an area of the eighth opening,
    wherein the area of the eighth opening is larger than an area of the ninth opening, and
    wherein the first direction and the third direction are different from each other.

3. The semiconductor device according to claim 2,
    wherein the first direction and the third direction are orthogonal to each other.

4. The semiconductor device according to claim 3,
    wherein at least one of the first photosensor, the second photosensor, the third photosensor, and the fourth photosensor comprises a transistor comprising a channel formation region comprising an oxide semiconductor.

5. The semiconductor device according to claim 1, further comprising:
    a display element comprising a liquid crystal element and a switching element.

6. The semiconductor device according to claim 5, further comprising:
    a seventh photosensor comprising a seventh photodiode;
    an eighth photosensor comprising an eighth photodiode; and
    a ninth photosensor comprising a ninth photodiode,
    wherein the light-blocking film comprises a seventh opening, an eighth opening, and a ninth opening,
    wherein the seventh photodiode corresponds to the seventh opening,
    wherein the eighth photodiode corresponds to the eighth opening, wherein the ninth photodiode corresponds to the ninth opening, wherein the seventh opening, the eighth opening, and the ninth opening are arranged in this order in a third direction, wherein an area of the seventh opening is larger than an area of the eighth opening, wherein the area of the eighth opening is larger than an area of the ninth opening, and wherein the first direction and the third direction are different from each other.

7. The semiconductor device according to claim 6, wherein the first direction and the third direction are orthogonal to each other.

8. The semiconductor device according to claim 7, wherein at least one of the first photosensor, the second photosensor, the third photosensor, the fourth photosensor, and the display element comprises a transistor comprising a channel formation region comprising an oxide semiconductor.

9. A semiconductor device comprising:

a light-blocking film comprising a first opening, a second opening, and a third opening;

a first photosensor comprising a first photodiode;

a second photosensor comprising a second photodiode;

a third photosensor comprising a third photodiode;

a fourth photosensor comprising a fourth photodiode;

a fifth photosensor comprising a fifth photodiode; and a sixth photosensor comprising a sixth photodiode, wherein the first photodiode corresponds to the first opening, wherein the second photodiode corresponds to the second opening, wherein the third photodiode corresponds to the third opening, wherein the first opening, the second opening, and the third opening are arranged in this order in a first direction, wherein an area of the first opening is larger than an area of the second opening, wherein the area of the second opening is larger than an area of the third opening, wherein the first photosensor is configured to detect first light incident from an object to the first photodiode through the first opening, wherein the second photosensor is configured to detect second light incident from the object to the second photodiode through the second opening, wherein the third photosensor is configured to detect third light incident from the object to the third photodiode through the third opening, wherein an intensity of the first light is higher than an intensity of the second light and an intensity of the third light, wherein position data of the object is obtained on the basis of a position of the first photosensor and a position of the first opening, wherein the light-blocking film comprises a fourth opening, a fifth opening, and a sixth opening, wherein the fourth photodiode corresponds to the fourth opening, wherein the fifth photodiode corresponds to the fifth opening, wherein the sixth photodiode corresponds to the sixth opening, wherein the fourth opening, the fifth opening, and the sixth opening are arranged in this order in a second direction, wherein an area of the fourth opening is larger than an area of the fifth opening, wherein the area of the fifth opening is larger than an area of the sixth opening, wherein the first direction and the second direction are parallel and opposite to each other, wherein the fourth photosensor is configured to detect fourth light incident from the object to the fourth photodiode through the fourth opening, wherein the fifth photosensor is configured to detect fifth light incident from the object to the fifth photodiode through the fifth opening, wherein the sixth photosensor is configured to detect sixth light incident from the object to the sixth photodiode through the sixth opening, wherein an intensity of the fourth light is higher than an intensity of the fifth light and an intensity of the sixth light, and wherein the position data of the object is obtained on the basis of the position of the first photosensor, the position of the first opening, a position of the fourth photosensor, and a position of the fourth opening.

10. The semiconductor device according to claim 9, further comprising:

a seventh photosensor comprising a seventh photodiode;

an eighth photosensor comprising an eighth photodiode; and a ninth photosensor comprising a ninth photodiode, wherein the light-blocking film comprises a seventh opening, an eighth opening, and a ninth opening, wherein the seventh photodiode corresponds to the seventh opening, wherein the eighth photodiode corresponds to the eighth opening, wherein the ninth photodiode corresponds to the ninth opening, wherein the seventh opening, the eighth opening, and the ninth opening are arranged in this order in a third direction, wherein an area of the seventh opening is larger than an area of the eighth opening, wherein the area of the eighth opening is larger than an area of the ninth opening, wherein the first direction and the third direction are different from each other, wherein the seventh photosensor is configured to detect seventh light incident from the object to the seventh photodiode through the seventh opening, wherein the eighth photosensor is configured to detect eighth light incident from the object to the eighth photodiode through the eighth opening, wherein the ninth photosensor is configured to detect ninth light incident from the object to the ninth photodiode through the ninth opening, wherein an intensity of the seventh light is higher than an intensity of the eighth light and an intensity of the ninth light, and wherein the position data of the object is obtained on the basis of the position of the first photosensor, the position of the first opening, the position of the fourth photosensor, the position of the fourth opening, a position of the seventh photosensor, and a position of the seventh opening.

11. The semiconductor device according to claim 10, wherein the first direction and the third direction are orthogonal to each other.

12. The semiconductor device according to claim 11,
wherein at least one of the first photosensor, the second photosensor, the third photosensor, and the fourth photosensor comprises a transistor comprising a channel formation region comprising an oxide semiconductor.

13. A semiconductor device comprising:
a substrate;
a first photosensor comprising a first photodiode over the substrate;
a second photosensor comprising a second photodiode over the substrate;
a third photosensor comprising a third photodiode over the substrate;
a light-blocking film over the first photosensor, the second photosensor, and the third photosensor, the light-blocking film comprising a first opening, a second opening, and a third opening;
a fourth photosensor comprising a fourth photodiode over the substrate;
a fifth photosensor comprising a fifth photodiode over the substrate; and
a sixth photosensor comprising a sixth photodiode over the substrate,
wherein the first photodiode corresponds to the first opening,
wherein the second photodiode corresponds to the second opening,
wherein the third photodiode corresponds to the third opening,
wherein the first opening, the second opening, and the third opening are arranged in this order in a first direction,
wherein an area of the first opening is larger than an area of the second opening,
wherein the area of the second opening is larger than an area of the third opening,
wherein the first opening and the first photosensor are not overlapped with each other in a direction normal to a surface of the substrate,
wherein the light-blocking film comprises a fourth opening, a fifth opening, and a sixth opening,
wherein the fourth photodiode corresponds to the fourth opening,
wherein the fifth photodiode corresponds to the fifth opening,
wherein the sixth photodiode corresponds to the sixth opening,
wherein the fourth opening, the fifth opening, and the sixth opening are arranged in this order in a second direction,
wherein an area of the fourth opening is larger than an area of the fifth opening,
wherein the area of the fifth opening is larger than an area of the sixth opening,
wherein the first direction and the second direction are parallel and opposite to each other, and
wherein the fourth opening and the fourth photosensor are not overlapped with each other in the direction normal to the surface of the substrate.

14. The semiconductor device according to claim 13, further comprising:
a seventh photosensor comprising a seventh photodiode;
an eighth photosensor comprising an eighth photodiode; and
a ninth photosensor comprising a ninth photodiode,
wherein the light-blocking film comprises a seventh opening, an eighth opening, and a ninth opening,
wherein the seventh photodiode corresponds to the seventh opening,
wherein the eighth photodiode corresponds to the eighth opening,
wherein the ninth photodiode corresponds to the ninth opening,
wherein the seventh opening, the eighth opening, and the ninth opening are arranged in this order in a third direction,
wherein an area of the seventh opening is larger than an area of the eighth opening,
wherein the area of the eighth opening is larger than an area of the ninth opening,
wherein the first direction and the third direction are different from each other, and
wherein the seventh opening and the seventh photosensor are not overlapped with each other in the direction normal to the surface of the substrate.

15. The semiconductor device according to claim 14,
wherein the first direction and the third direction are orthogonal to each other.

16. The semiconductor device according to claim 15,
wherein at least one of the first photosensor, the second photosensor, the third photosensor, and the fourth photosensor comprises a transistor comprising a channel formation region comprising an oxide semiconductor.

* * * * *